United States Patent
Orihashi et al.

(10) Patent No.: US 9,508,543 B2
(45) Date of Patent: Nov. 29, 2016

(54) METHOD OF MANUFACTURING SEMICONDUCTOR DEVICE, SUBSTRATE PROCESSING APPARATUS, AND NON-TRANSITORY COMPUTER-READABLE RECORDING MEDIUM

(71) Applicant: Hitachi Kokusai Electric Inc., Tokyo (JP)

(72) Inventors: Yugo Orihashi, Toyama (JP); Yoshiro Hirose, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 14/316,897

(22) Filed: Jun. 27, 2014

(65) Prior Publication Data

US 2015/0004804 A1    Jan. 1, 2015

(30) Foreign Application Priority Data

Jun. 28, 2013 (JP) .................................. 2013-137504

(51) Int. Cl.
| | | |
|---|---|---|
| *H01L 21/31* | (2006.01) | |
| *H01L 21/469* | (2006.01) | |
| *H01L 21/02* | (2006.01) | |
| *C23C 16/30* | (2006.01) | |
| *C23C 16/455* | (2006.01) | |

(52) U.S. Cl.
CPC ......... *H01L 21/02126* (2013.01); *C23C 16/30* (2013.01); *C23C 16/45531* (2013.01); *H01L 21/0228* (2013.01); *H01L 21/02211* (2013.01); *H01L 21/02274* (2013.01)

(58) Field of Classification Search
None
See application file for complete search history.

(56) References Cited

U.S. PATENT DOCUMENTS

| | | | |
|---|---|---|---|
| 8,546,272 B2 | 10/2013 | Hirose et al. | |
| 2011/0064879 A1* | 3/2011 | Wang et al. | ............. 427/255.28 |
| 2012/0142172 A1* | 6/2012 | Fox | ......................... C23C 16/24 |
| | | | 438/488 |
| 2013/0017685 A1* | 1/2013 | Akae et al. | ................... 438/703 |

FOREIGN PATENT DOCUMENTS

| | | |
|---|---|---|
| JP | 2011238894 A | 11/2011 |
| JP | 2013-070077 | 4/2013 |

OTHER PUBLICATIONS

Office Action in corresponding Korean Patent Application No. 10-2014-077911, mailed on Oct. 1, 2015, along with English translation.

* cited by examiner

*Primary Examiner* — Calvin Choi
(74) *Attorney, Agent, or Firm* — Edell, Shapiro & Finnan, LLC

(57) ABSTRACT

A thin film having a low dielectric constant and a high resistance to HF at a low temperature range is formed with high productivity. A film containing a predetermined element, oxygen and at least one of carbon and nitrogen is formed on a substrate by performing, a predetermined number of times, a cycle comprising: (a) supplying a source gas containing the predetermined element to the substrate; and (b) supplying a reaction gas containing nitrogen, carbon and oxygen to the substrate.

15 Claims, 27 Drawing Sheets

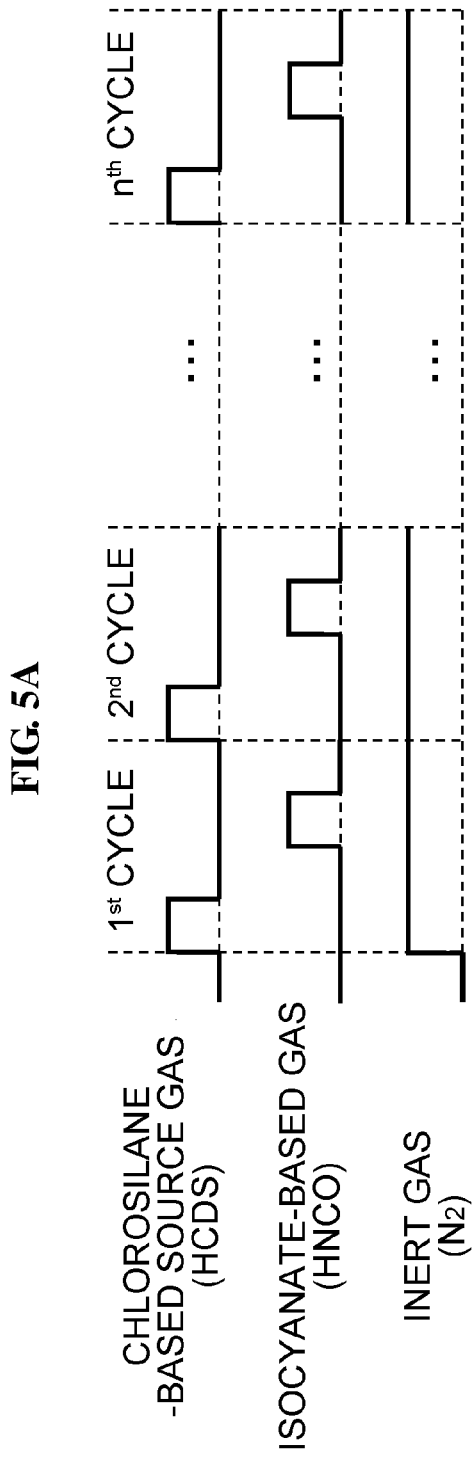

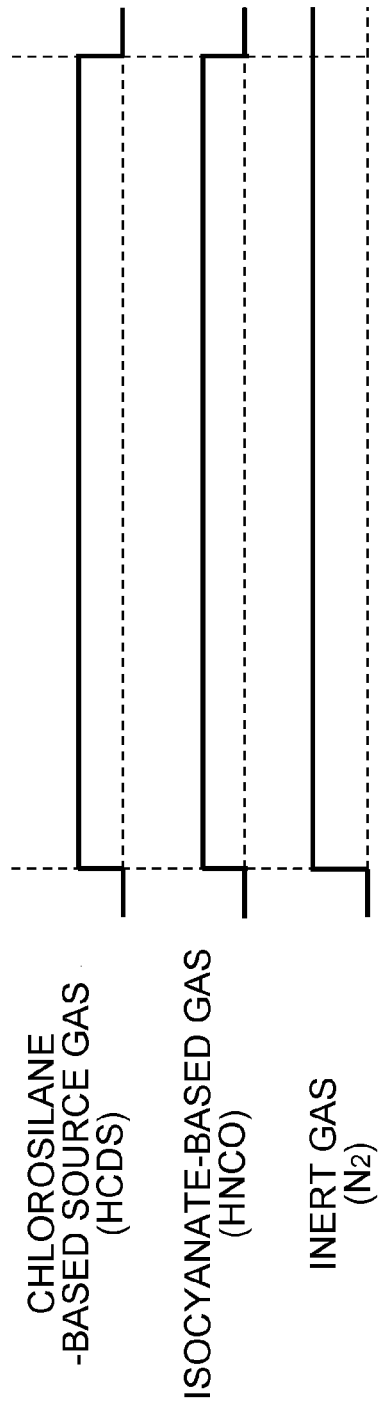

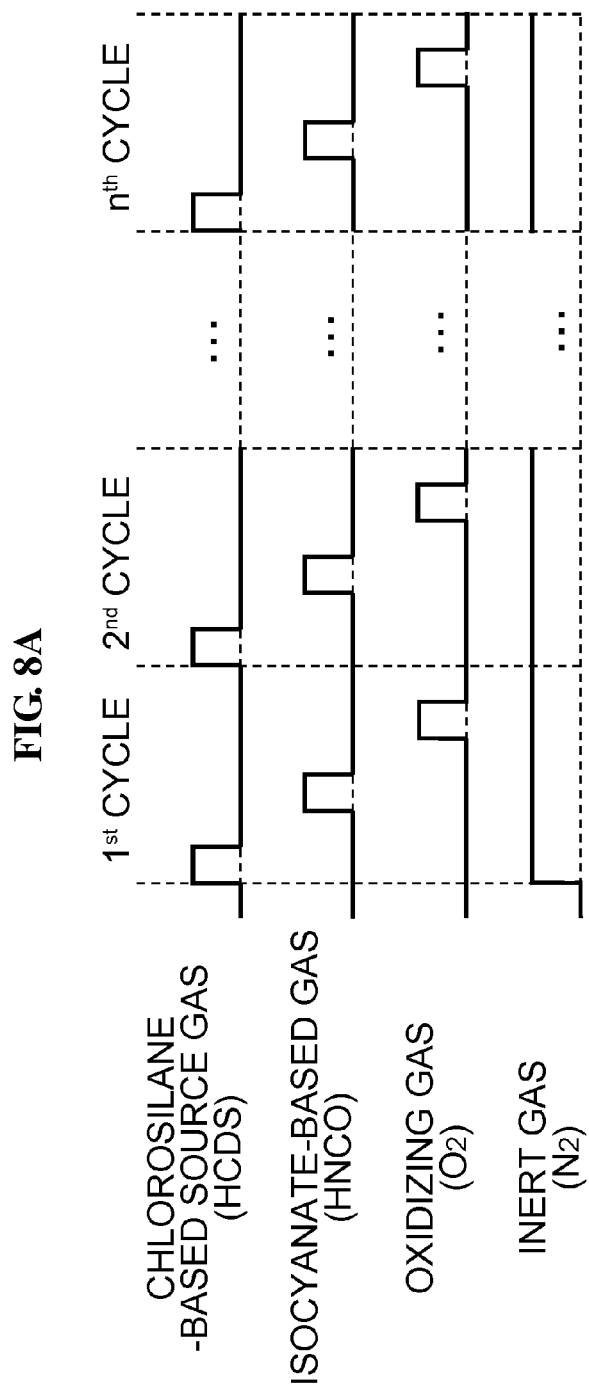

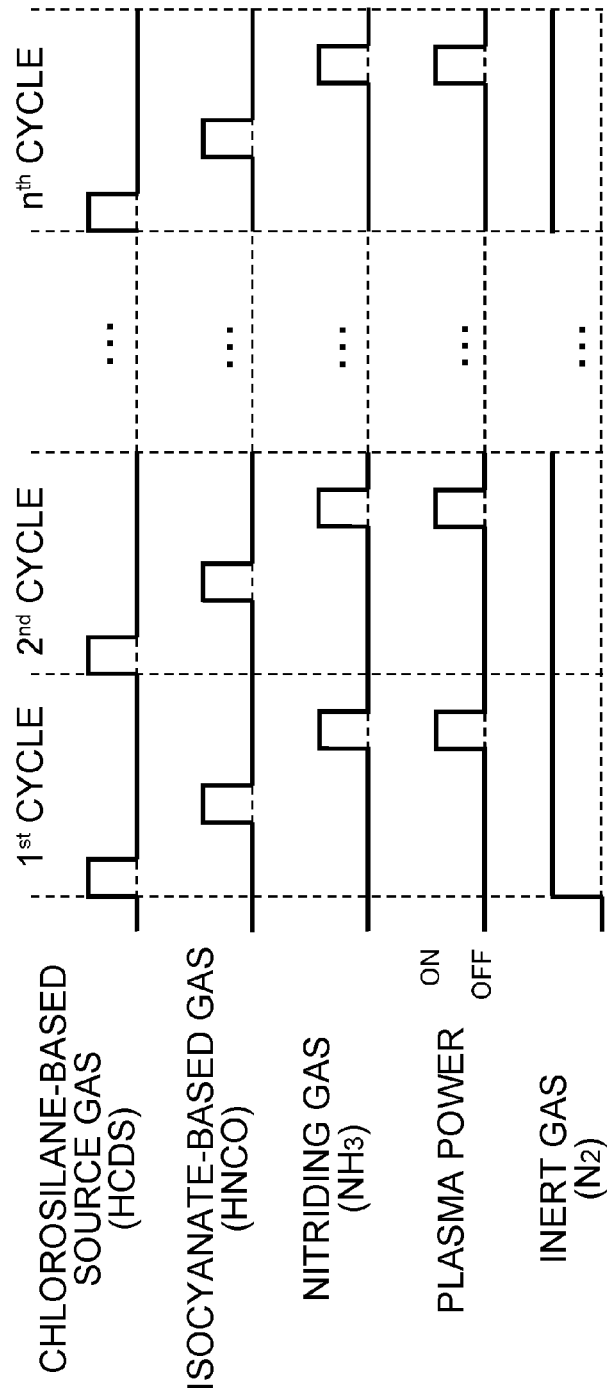

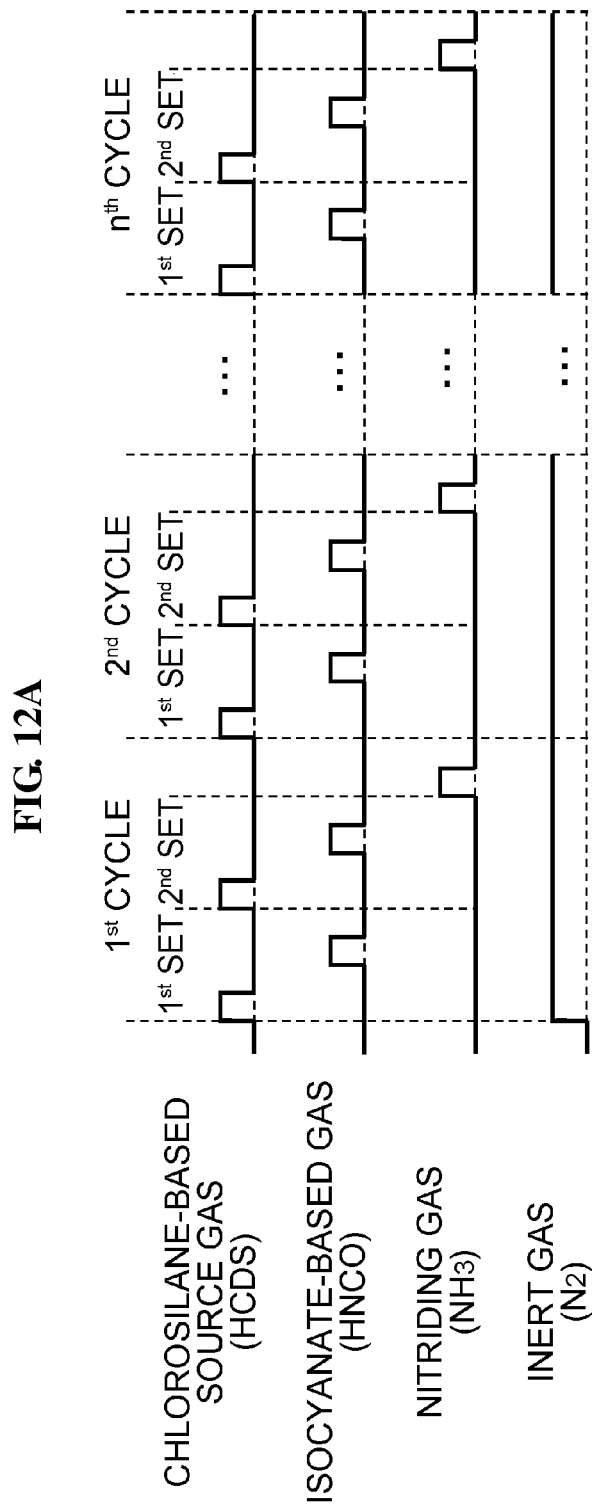

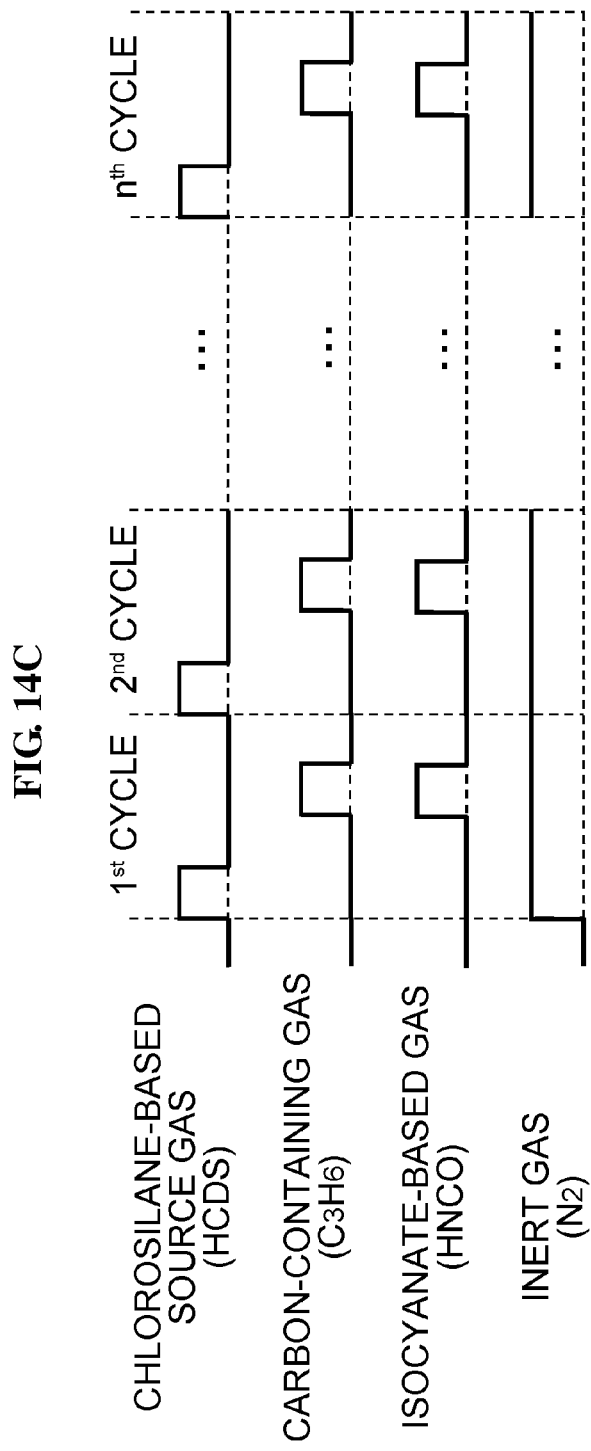

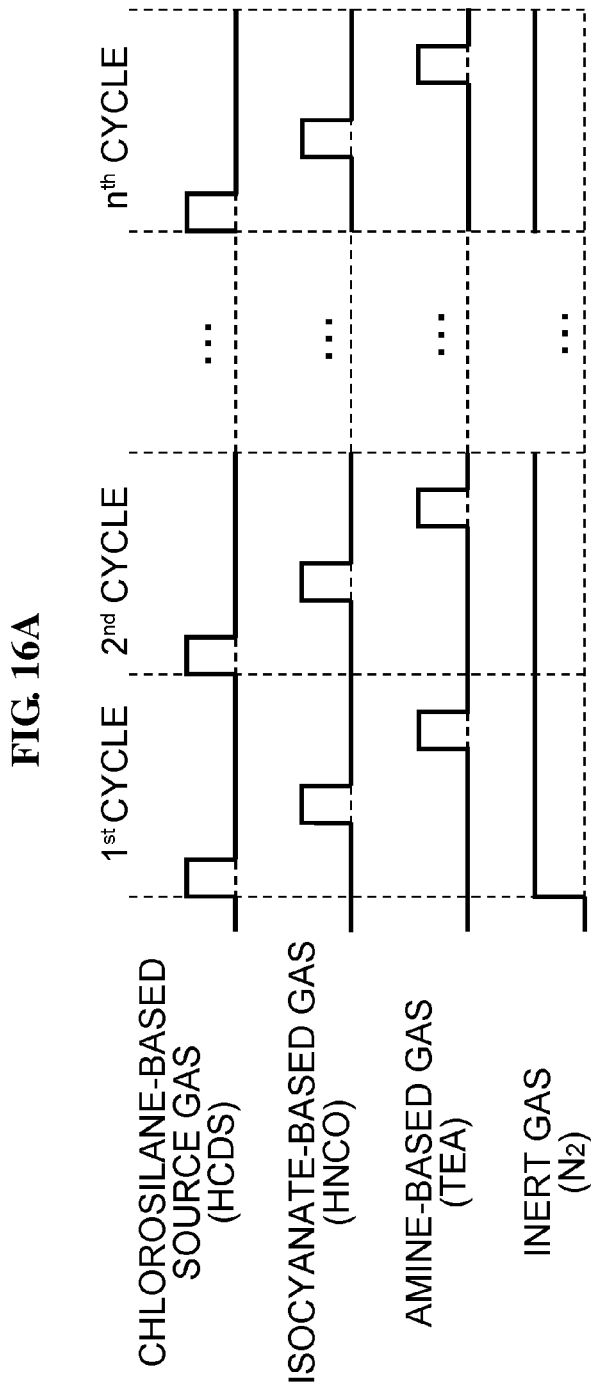

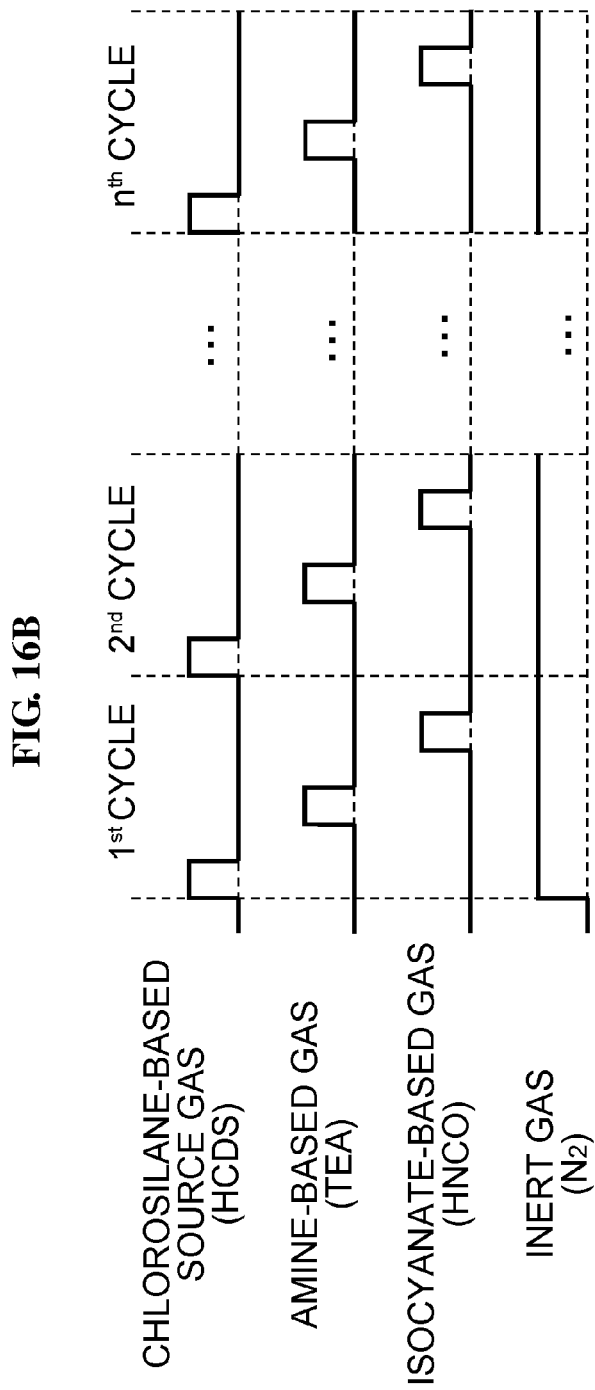

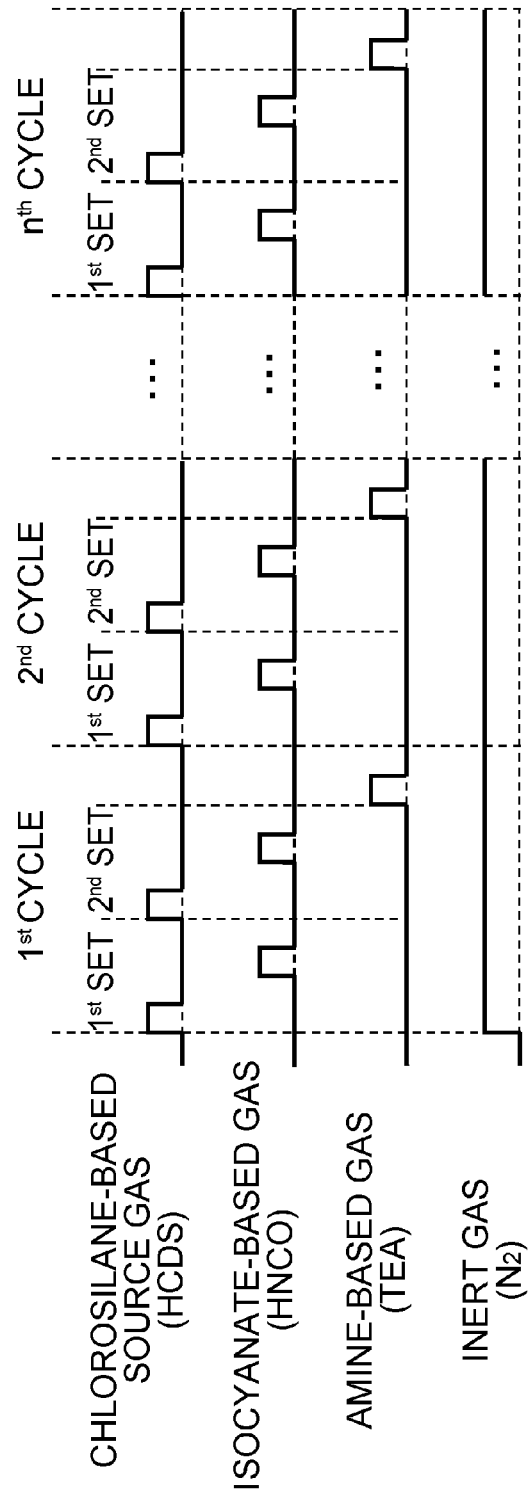

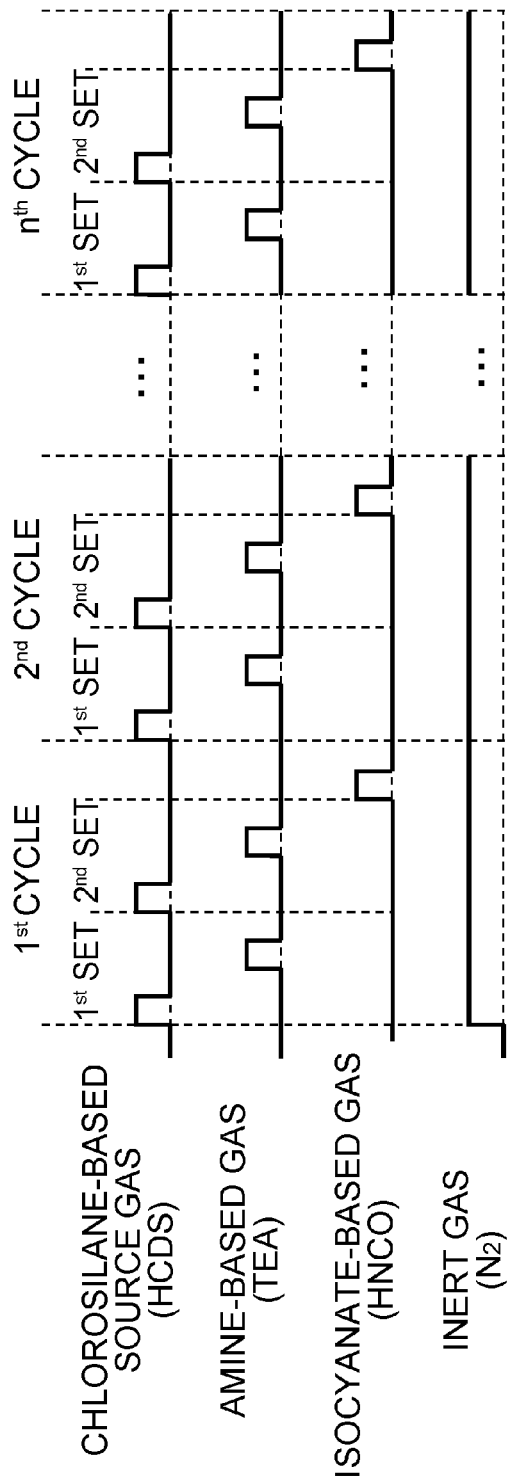

METHOD OF MANUFACTURING SEMICONDUCTOR DEVICE, SUBSTRATE PROCESSING APPARATUS, AND NON-TRANSITORY COMPUTER-READABLE RECORDING MEDIUM

CROSS REFERENCE TO RELATED APPLICATIONS

This application claims foreign priority under 35 U.S.C. §119(a)-(d) to Application No. JP 2013-137504 filed on Jun. 28, 2013, entitled "Method of Manufacturing Semiconductor Device, Substrate Processing Apparatus, and Non-Transitory Computer-Readable Recording Medium," the entire contents of which are hereby incorporated by reference.

FIELD OF THE INVENTION

The present invention relates to a method of manufacturing a semiconductor device including a process of forming a thin film on a substrate, a substrate processing apparatus, and a non-transitory computer-readable recording medium.

BACKGROUND

Along with miniaturization of transistors, in a thin film such as an insulating film forming a sidewall spacer (SWS) or the like of a gate electrode, a decrease in a film forming temperature, a high resistance to hydrogen fluoride (HF), and a decrease in a dielectric constant are necessary. Accordingly, as the insulating film, employing a silicon oxycarbide film (SiOC film) obtained by adding oxygen (O) and carbon (C) to a silicon film (Si film), a silicon oxynitride film (SiON film) obtained by adding O and nitrogen (N) to the Si film, or a silicon oxycarbonitride film (SiOCN film) obtained by adding O, C and N to the Si film has been studied.

SUMMARY

Since a high step coverage characteristic is necessary, the above-described insulating film is frequently formed by an alternate supply method in which a plurality of types of processing gases are alternately supplied. For example, a SiOCN film may be formed on a substrate by performing a cycle a predetermined number of times. The cycle includes sequential supply of four sources, a silicon source (silicon-containing gas), an oxygen source (oxygen-containing gas), a carbon source (carbon-containing gas) and a nitrogen source (nitrogen-containing gas), to a substrate. However, in the above-described method in which the four sources are separately supplied, a time required for one cycle increases, which results in a decrease of productivity in a film-forming process. Further, in the above-described method, it is difficult to increase a C concentration in the film and thereby it is difficult to increase a resistance to HF.

The present invention is provided to form a thin film having a low dielectric constant and a high resistance to HF at a low temperature range with high productivity.

According to an aspect of the present invention, there is provided a method of manufacturing a semiconductor device, including forming a film containing a predetermined element, oxygen and at least one of carbon and nitrogen on a substrate by performing, a predetermined number of times, a cycle including: (a) supplying a source gas containing the predetermined element to the substrate; and (b) supplying a reaction gas containing nitrogen, carbon and oxygen to the substrate.

According to another aspect of the present invention, there is provided substrate processing apparatus, including: a process chamber configured to accommodate a substrate; source gas supply system configured to supply a source gas containing a predetermined element into the process chamber; a reaction gas supply system configured to supply a reaction gas containing nitrogen, carbon and oxygen into the process chamber; and a control unit configured to control the source gas supply system and the reaction gas supply system to form a film containing the predetermined element, oxygen and at least one of carbon and nitrogen on the substrate by performing, a predetermined number of times, a cycle including supplying the source gas to the substrate in the process chamber and supplying the reaction gas to the substrate in the process chamber.

According to still another aspect of the present invention, there is provided a non-transitory computer-readable recording medium storing a program that causes a computer to execute forming a film containing a predetermined element, oxygen and at least one of carbon and nitrogen on a substrate by performing, a predetermined number of times, a cycle including: (a) supplying a source gas containing the predetermined element to the substrate in a process chamber; and (b) supplying a reaction gas containing nitrogen, carbon and oxygen to the substrate in the process chamber.

BRIEF DESCRIPTION OF THE DRAWINGS

FIG. 5A is a diagram illustrating a gas supply timing in the film-forming sequence of the first embodiment, and FIGS. 5B and 5C are diagrams illustrating modifications thereof.

FIG. 8A is a diagram illustrating a gas supply timing in the first sequence of the second embodiment.

FIG. 10B is a diagram illustrating a gas supply and plasma power supply timing in the first sequence of the third embodiment involving an exemplary sequence of forming a film using plasma.

FIG. 12A is a diagram illustrating a gas supply and plasma power supply timing in the second sequence of the third embodiment involving an exemplary sequence of forming a film in a non-plasma state.

FIGS. 14B and 14C are diagrams illustrating modifications thereof.

FIG. 16A is a diagram illustrating a gas supply timing in the first sequence of the fifth embodiment, and FIG. 16B is a diagram illustrating a modification thereof.

FIG. 18A is a diagram illustrating a gas supply timing in the second sequence of the fifth embodiment, and FIG. 18B is a diagram illustrating a modification thereof.

DETAILED DESCRIPTION

First Embodiment of the Present Invention

Hereinafter, the first embodiment of the present invention will be described with reference to FIGS. 1 to 3.

(1) Configuration of Substrate Processing Apparatus

Figure 1:
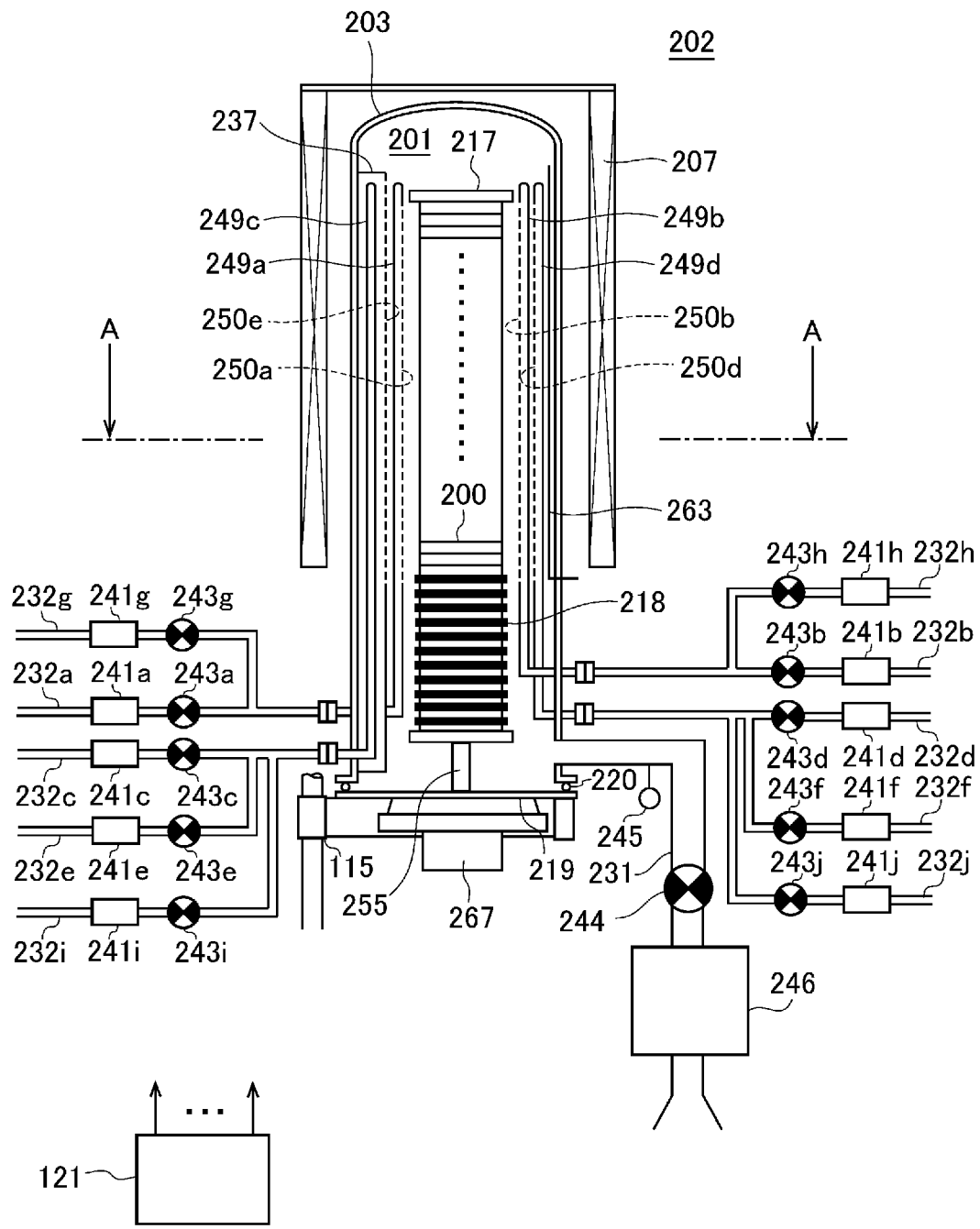
FIG. 1 is a diagram illustrating a schematic configuration of a vertical processing furnace of a substrate processing apparatus that is preferably used in an embodiment of the present invention and is a vertical cross-sectional view illustrating a processing furnace part.

As illustrated in FIG. 1, a processing furnace 202 includes a heater 207 serving as a heating unit (heating mechanism). The heater 207 has a cylindrical shape and is vertically installed by being supported by a heater base (not illustrated) serving as a holding plate. As will be described below, the heater 207 also functions as an activating device (exciting unit) for activating (exciting) a gas by heat.

In the heater 207, a reaction tube 203 forming a reaction container (process container) is concentrically provided with respect to the heater 207. The reaction tube 203 is made of a heat-resistant material such as quartz ($SiO_2$) and silicon carbide (SiC), and is formed in a cylindrical shape whose upper end is closed and lower end is opened. A process chamber 201 is formed in a cylindrical hollow portion of the reaction tube 203, and is configured such that wafers 200 may be accommodated as substrates in a horizontal posture to be arranged on multiple stages in a vertical direction by a boat 217 to be described later.

Nozzles 249a through 249d are provided in the process chamber 201 to penetrate a lower part of the reaction tube 203. Gas supply pipes 232a through 232d are connected to the nozzles 249a through 249d, respectively. A gas supply pipe 232e is connected to the gas supply pipe 232c, and a gas supply pipe 232f is connected to the gas supply pipe 232d. In this manner, the four nozzles 249a through 249d and the six gas supply pipes 232a through 232f are provided in the reaction tube 203 so that a plurality of types of gases (six types of gases in this embodiment) may be supplied into the process chamber 201.

However, the processing furnace 202 according to this embodiment is not limited to the above-described form. For example, a manifold made of a metal may be provided below the reaction tube 203 to support the reaction tube 203, and each nozzle may be provided to penetrate sidewalls of the manifold. In this case, an exhaust pipe 231 (to be described later) may be further provided in the manifold. In this case, the exhaust pipe 231 may also be provided below the reaction tube 203 rather than in the manifold. In this way, a furnace port portion of the processing furnace 202 may be made of a metal, and the nozzle and the like may be provided at the furnace port portion made of a metal.

In the gas supply pipes 232a through 232f, mass flow controllers 241a through 241f (MFCs) serving as flow rate controllers (flow rate control units) and valves 243a through 243f serving as on-off valves are provided in order from an upstream end. Gas supply pipes 232g through 232j configured to supply an inert gas are connected downstream from the valves 243a through 243d of the gas supply pipes 232a through 232d. In the gas supply pipes 232g through 232j, MFCs 241g through 241j serving as flow rate controllers (flow rate control units) and valves 243g through 243j serving as on-off valves are provided in order from an upstream end.

The above-described nozzles 249a, 249b and 249d are connected to leading ends of the gas supply pipes 232a, 232b and 232d. As illustrated in FIG. 2, the nozzles 249a, 249b and 249d are provided in a cylindrically-shaped space between inner walls of the reaction tube 203 and the wafer 200, from a lower inner wall to an upper inner wall of the reaction tube 203, so as to rise in a direction in which the wafers 200 are stacked. In other words, the nozzles 249a, 249b and 249d are provided along a wafer arrangement region in which the wafers 200 are arranged, in a region that horizontally surrounds the wafer arrangement region at sides of the wafer arrangement region. The nozzles 249a, 249b and 249d are configured as L-shaped long nozzles, and include a horizontal portion provided to penetrate lower sidewalls of the reaction tube 203 and a vertical portion provided to rise at least from one end to the other end of the wafer arrangement region. Gas supply holes 250a, 250b and 250d configured to supply a reaction gas are provided at side surfaces of the nozzles 249a, 249b and 249d. The gas supply holes 250a, 250b and 250d may be opened to a center of the reaction tube 203 to supply a gas to the wafer 200. The plurality of gas supply holes 250a, 250b and 250d are provided from a lower part to an upper part of the reaction tube 203, and are provided to each have the same opening area at the same opening pitch.

The above-described nozzle 249c is connected to a leading end of the gas supply pipe 232c. The nozzle 249c is provided in a buffer chamber 237 that is a gas dispersion space. As illustrated in FIG. 2, the buffer chamber 237 is provided in the cylindrically-shaped space between the inner walls of the reaction tube 203 and the wafer 200, and in a part from the lower inner wall to the upper inner wall of the reaction tube 203, in a direction in which the wafers 200 are stacked. In other words, the buffer chamber 237 is provided along the wafer arrangement region, in a region that horizontally surrounds the wafer arrangement region at sides of the wafer arrangement region. In the buffer chamber 237, a gas supply hole 250e configured to supply a gas is provided at an end of a wall adjacent to the wafer 200. The gas supply hole 250e may be opened to the center of the reaction tube 203 to supply a gas to the wafer 200. The plurality of gas supply holes 250e are provided from the lower part to the upper part of the reaction tube 203, and are provided to each have the same opening area at the same opening pitch.

The nozzle 249c is provided at an end opposite to an end at which the gas supply hole 250e of the buffer chamber 237 is provided, from the lower inner wall to the upper inner wall of the reaction tube 203, so as to rise in the direction in which the wafers 200 are stacked. In other words, the nozzle 249c is provided along the wafer arrangement region in which the wafers 200 are arranged, in a region that horizontally surrounds the wafer arrangement region at sides of the wafer arrangement region. The nozzle 249c is configured as the L-shaped long nozzle, and includes a horizontal portion provided to penetrate lower sidewalls of the reaction tube 203 and a vertical portion provided to rise at least from one end to the other end of the wafer arrangement region. The gas supply hole 250c configured to supply a gas is provided at a side surface of the nozzle 249c. The gas supply hole 250c is opened to a center of the buffer chamber 237. Similar to the gas supply hole 250e, the plurality of gas supply holes 250c are provided from the lower part to the upper part of the reaction tube 203. When a difference between pressures in the buffer chamber 237 and the process chamber 201 is small, the plurality of gas supply holes 250c may be formed to each have the same opening area at the same opening pitch from an upstream end (upper part) to a downstream end (lower part). On the other hand, when the difference between the pressures in the buffer chamber 237 and the process chamber 201 is large, the opening areas of the gas supply holes 250c may gradually increase from the upstream end to the downstream end or the opening pitch between the gas supply holes 250c may gradually decrease from the upstream end to the downstream end.

By adjusting the opening area or the opening pitch of the gas supply hole 250c from the upstream end to the downstream end as described above, it is possible to spray gases, flow velocities of which are different but flow rates of which are substantially the same, from each of the gas supply holes 250c. Then, when the gases sprayed from each of the plurality of gas supply holes 250c are introduced into the buffer chamber 237, different flow velocities of the gases may be uniformized in the buffer chamber 237. When the gases are sprayed into the buffer chamber 237 from each of the plurality of gas supply holes 250c, speeds of particles of each gas are reduced in the buffer chamber 237, and then the gases are sprayed into the process chamber 201 from the plurality of gas supply holes 250e. When the gases sprayed into the buffer chamber 237 from each of the plurality of gas supply holes 250c are sprayed into the process chamber 201 from each of the gas supply holes 250e, the gases each have a uniform flow rate and flow velocity.

In this way, in this embodiment, the gas is transferred through a longitudinally extending space having a cylindrical shape defined by the inner wall of the reaction tube 203 and ends (outer circumferences) of the plurality of stacked wafers 200, that is, through the buffer chamber 237 and the nozzles 249a through 249d disposed in the cylindrically-shaped space. Then, from the gas supply holes 250a through 250e that open to the nozzles 249a through 249d and the buffer chamber 237, respectively, the gas is initially sprayed into the reaction tube 203 in the vicinity of the wafer 200. A main flow of the gas in the reaction tube 203 is set to be parallel to a surface of the wafer 200, that is, in a horizontal direction. In such a configuration, it is possible to uniformly supply the gas to each of the wafers 200, thereby uniformizing a film thickness of a thin film to be formed on each of the wafers 200. The gas flowing along a surface of the wafer 200, that is, a residual gas after a reaction, flows toward an exhaust port, that is, toward the exhaust pipe 231 to be described later. However, a flow direction of the residual gas may be appropriately defined by a location of the exhaust port and is not limited to the vertical direction.

From the gas supply pipe 232a, as a source gas containing a predetermined element, for example, a chlorosilane-based source gas which contains silicon (Si) as the predetermined element and chlorine (Cl) as a halogen element, is supplied into the process chamber 201 through the MFC 241a, the valve 243a and the nozzle 233a.

The chlorosilane-based source gas refers to a chlorosilane-based source in a gas state, for example, a gas that is obtained by vaporizing a chlorosilane-based source that is in a liquid state under normal temperature and normal pressure, a chlorosilane-based source in a gas state under normal temperature and normal pressure, and the like. The chlorosilane-based source is a silane-based source including a chloro group as a halogen group, and is a source including at least Si and Cl. The chlorosilane-based source may be a type of halide. When the term "source" is used in this specification, it may refer to either or both of "a liquid source in a liquid state" and "a source gas in a gas state." Therefore, when the term "chlorosilane-based source" is used in this specification, it may refer to either or both of "a chlorosilane-based source in a liquid state" and a "chlorosilane-based source gas in a gas state." As the chlorosilane-based source, for example, hexachlorodisilane ($Si_2Cl_6$, abbreviated as HCDS) may be used. When a liquid source that is in a liquid state under normal temperature and normal pressure such as HCDS is used, the liquid source is vaporized by a vaporization system such as a vaporizer and a bubbler and then is supplied as the source gas (HCDS gas).

From the gas supply pipe 232b, as a reaction gas containing nitrogen (N), carbon (C) and oxygen (O), for example, an isocyanate-based gas, is supplied into the process chamber 201 through the MFC 241b, the valve 243b and the nozzle 249b.

The isocyanate-based gas refers to isocyanate in a gas state, for example, a gas that is obtained by vaporizing isocyanate in a liquid state under normal temperature and normal pressure, isocyanate in a gas state under normal temperature and normal pressure, and the like. The isocyanate refers to a compound having an isocyanate group in its composition formula (In a molecule), that is, a compound having a partial structure of —N=C=O in its chemical structural formula, and is a compound represented by a chemical formula of R—N=C=O. Here, R represents a ligand. Since the isocyanate-based gas includes three elements of N, C and O, without Si, it may be called a Si-free gas. Since the isocyanate-based gas does not include Si and metal, it may also be called a Si-free and metal-free gas. The isocyanate-based gas is a nitrogen-containing gas (nitrogen source), a carbon-containing gas (carbon source), an oxygen-containing gas (oxygen source) and a hydrogen-containing gas. When the term "isocyanate" is used in this specification, it may refer to either or both of "isocyanate in a liquid state" and "an isocyanate-based gas in a gas state." As the isocyanate-based gas, for example, an isocyanic acid (HNCO) gas containing only four elements of hydrogen (H), N, C and O and represented by a chemical formula of H—N=C=O may be used. When the HNCO is in a gas state, the HNCO may be supplied as the isocyanate-based gas (HNCO gas), without vaporizing it using a vaporization system such as a vaporizer and a bubbler. On the other hand, when isocyanate in a liquid state under normal temperature and normal pressure is used, the isocyanate in a liquid state is vaporized using a vaporization system such as a vaporizer and a bubbler and is supplied as the isocyanate-based gas.

From the gas supply pipe 232c, an oxidizing gas (oxygen-containing gas) is supplied into the process chamber 201 through the MFC 241c, the valve 243c, the nozzle 249c and the buffer chamber 237. As the oxidizing gas, for example, oxygen ($O_2$) gas may be used.

From the gas supply pipe 232e, a nitriding gas (nitrogen-containing gas) is supplied into the process chamber 201 through the MFC 241e, the valve 243e, the gas supply pipe 232c, the nozzle 249c and the buffer chamber 237. As the nitriding gas, for example, ammonia (NH3) gas may be used.

From the gas supply pipe 232d, as a gas (carbon-containing gas) containing carbon (C), for example, a hydrocarbon-based gas is supplied into the process chamber 201 through the MFC 241d, the valve 243d and the nozzle 249d. As the carbon-containing gas, for example, propylene (C3H6) gas may be used.

From the gas supply pipe 232f, as a gas containing nitrogen (N) and carbon (C), for example, an amine-based gas is supplied into the process chamber 201 through the MFC 241f, the valve 243f, the gas supply pipe 232d and the nozzle 249d.

The amine-based gas refers to amine in a gas state, for example, a gas that is obtained by vaporizing amine in a liquid state under normal temperature and normal pressure or a gas having an amine group such as amine in a gas state under normal temperature and normal pressure. The amine-based gas includes an amine such as ethylamine, methylamine, propylamine, isopropylamine, butylamine and isobutylamine. The amine is a general term for compounds, wherein a H atom of NH3 has been replaced by a hydrocarbon group such as an alkyl group. The amine includes a hydrocarbon group such as an alkyl group, as a ligand including a C atom. Since the amine-based gas includes three elements of C, N and H without Si, it may be called a Si-free gas. Since the amine-based gas does not include Si and metal, it may also be called a Si-free and metal-free gas. The amine-based gas is a nitrogen-containing gas (nitrogen source), a carbon-containing gas (carbon source) and a hydrogen-containing gas. The amine-based gas may be a substance formed of only three elements of C, N and H constituting an amine group. When the term "amine" is used in this specification, it may refer to either or both of "amine in a liquid state" and "an amine-based gas in a gas state." As the amine-based gas, for example, a triethylamine [(C2H5)3N, abbreviated as TEA] gas that contains three ligands (ethyl groups) containing C atoms in its composition formula (In a molecule), that is, in its chemical structural formula, and includes a greater number of C atoms than the number of N atoms in its composition formula may be used. When amine in a liquid state under normal temperature and normal pressure such as TEA is used, the amine in a liquid state is vaporized using a vaporization system such as a vaporizer and a bubbler and is supplied as the amine-based gas (TEA gas).

From the gas supply pipes 232g through 232j, as the inert gas, for example, a nitrogen (N2) gas is supplied into the process chamber 201 through the MFCs 241g through 241j, the valves 243g through 243j, the gas supply pipes 232a through 232d, the nozzles 249a through 249d and the buffer chamber 237.

When the above-described gas flows into each of the gas supply pipes, the gas supply pipe 232a, the MFC 241a and the valve 243a mainly constitute a source gas supply system configured to supply a source gas containing a predetermined element, that is, a chlorosilane-based source gas supply system. The nozzle 249a may be included in the chlorosilane-based source gas supply system. The source gas supply system may be called a source supply system, and the chlorosilane-based source gas supply system may be called a chlorosilane-based source supply system.

Also, the gas supply pipe 232b, the MFC 241b and the valve 243b mainly constitute a reaction gas supply system configured to supply a reaction gas containing nitrogen, carbon and oxygen, that is, an isocyanate-based gas supply system. The nozzle 249b may be included in the isocyanate-based gas supply system. The reaction gas supply system may be called an isocyanate supply system.

Also, the gas supply pipe 232c, the MFC 241c and the valve 243c mainly constitute an oxidizing gas (oxygen-containing gas) supply system. The nozzle 249c and the buffer chamber 237 may be included in the oxidizing gas supply system.

Also, the gas supply pipe 232e, the MFC 241e and the valve 243e mainly constitute a nitriding gas (nitrogen-containing gas) supply system. The nozzle 249c and the buffer chamber 237 downstream from a unit connecting the gas supply pipe 232e in the gas supply pipe 232c may be included in the nitriding gas supply system.

Also, the gas supply pipe 232d, the MFC 241d and the valve 243d mainly constitute a hydrocarbon-based gas supply system as a carbon-containing gas supply system. The nozzle 249d may be included in the hydrocarbon-based gas supply system.

Also, the gas supply pipe 232f, the MFC 241f and the valve 243f mainly constitute an amine-based gas supply system as a nitrogen and carbon containing gas supply system. The nozzle 249d downstream from a unit connecting the gas supply pipe 232f in the gas supply pipe 232d may be included in the amine-based gas supply system.

Also, the gas supply pipes 232g through 232j, the MFCs 241g through 241j and the valves 243g through 243j mainly constitute an inert gas supply system. The nozzles 249a through 249d and the buffer chamber 237 downstream from a unit connecting the gas supply pipes 232g through 232j to the gas supply pipes 232a through 232d may be included in the inert gas supply system. The inert gas supply system also functions as a purge gas supply system.

Figure 2:
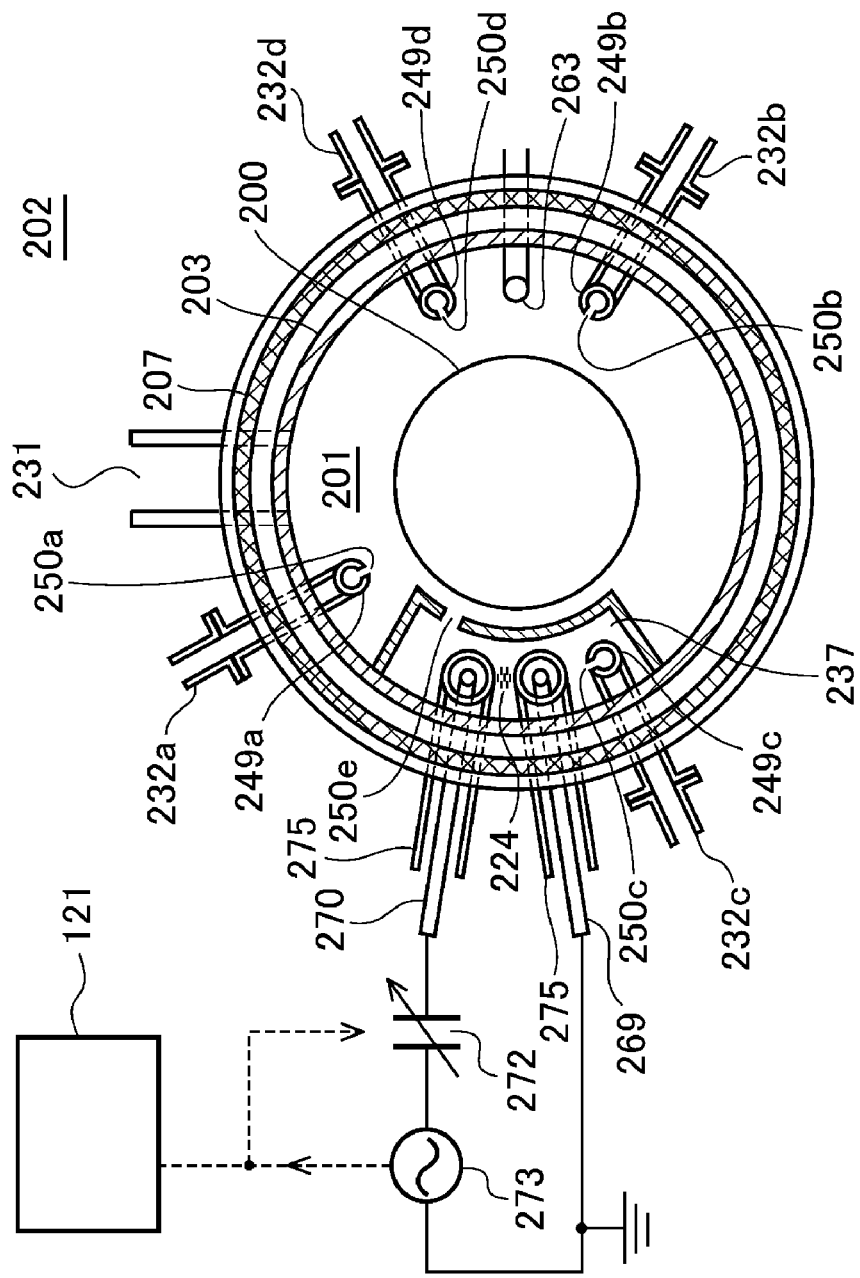
FIG. 2 is a diagram illustrating a schematic configuration of the vertical processing furnace of the substrate processing apparatus that is preferably used in the embodiment of the present invention and is a cross-sectional view illustrating the processing furnace part taken along line A-A in FIG. 1.

As illustrated in FIG. 2, in the buffer chamber 237, two rod-shaped electrodes 269 and 270 made of a conductor and having an elongated structure are provided from the lower part to the upper part of the reaction tube 203 in the direction in which the wafers 200 are stacked. Each of the rod-shaped electrodes 269 and 270 is provided to be parallel to the nozzle 249c. Each of the rod-shaped electrodes 269 and 270 is protected by being covered with an electrode protecting pipe 275 from an upper part to a lower part. One of the rod-shaped electrodes 269 and 270 is connected to a high frequency power source 273 through a matching unit 272, and the other thereof is connected to a ground serving as a reference potential. When high frequency power is applied between the rod-shaped electrodes 269 and 270 from the high frequency power source 273 through the matching unit 272, plasma is generated in a plasma generation region 224 between the rod-shaped electrodes 269 and 270. The rod-shaped electrodes 269 and 270 and the electrode protecting pipe 275 mainly constitute a plasma source serving as a plasma generator (plasma generating unit). The matching unit 272 and the high frequency power source 273 may be included in the plasma source. As will be described later, the plasma source functions as an activating mechanism (exciting unit) for activating (exciting) a gas to plasma.

The electrode protecting pipe 275 is made of a structure in which each of the rod-shaped electrodes 269 and 270 may be inserted into the buffer chamber 237 while the electrodes are isolated from an atmosphere in the buffer chamber 237. When a concentration of oxygen in the electrode protecting pipe 275 is substantially the same as a concentration of oxygen in the external air (atmosphere), the rod-shaped electrodes 269 and 270 inserted into the electrode protecting pipe 275 are oxidized by heat generated from the heater 207.

When the inert gas such as the nitrogen gas is filled in the electrode protecting pipe 275 in advance, or when an inside of the electrode protecting pipe 275 is purged with the inert gas such as the nitrogen gas using an inert gas purge mechanism, the concentration of the oxygen in the electrode protecting pipe 275 decreases, thereby preventing the rod-shaped electrodes 269 and 270 from being oxidized.

The exhaust pipe 231 configured to exhaust an atmosphere in the process chamber 201 is provided in the reaction tube 203. In the exhaust pipe 231, a vacuum pump 246 serving as a vacuum exhaust device is connected through a pressure sensor 245 serving as a pressure detector (pressure detecting unit) configured to detect a pressure in the process chamber 201 and an auto pressure controller (APC) valve 244 serving as a pressure regulator (pressure regulating unit). The APC valve 244 is a valve that may perform vacuum-exhaust and vacuum-exhaust stop processes in the process chamber 201 by opening or closing the valve while the vacuum pump 246 is operated, and regulate a pressure in the process chamber 201 by adjusting a degree of valve opening based on information on pressure detected by the pressure sensor 245 while the vacuum pump 246 is operated. The exhaust pipe 231, the APC valve 244 and the pressure sensor 245 mainly constitute an exhaust system. The vacuum pump 246 may be included in the exhaust system.

Below the reaction tube 203, a seal cap 219 capable of hermetically sealing a lower opening of the reaction tube 203 is provided as a furnace port cover. The seal cap 219 is configured to abut a lower end of the reaction tube 203 in a vertical direction from a lower part thereof. The seal cap 219 is made of a metal such as stainless steel and has a disk shape. An O ring 220 is provided as a seal member that abuts the lower end of the reaction tube 203 on an upper surface of the seal cap 219. A rotating mechanism 267 configured to rotate the boat 217, to be described later, is provided at a side of the seal cap 219 opposite to the process chamber 201. A rotary shaft 255 of the rotating mechanism 267 penetrates the seal cap 219 and is connected to the boat 217. The rotating mechanism 267 is configured to rotate the wafer 200 by rotating the boat 217. The seal cap 219 is configured to be vertically moved upward and downward by a boat elevator 115 serving as a lifting mechanism that is vertically provided at the outside of the reaction tube 203. The boat elevator 115 is configured to load or unload the boat 217 into or from the process chamber 201 by moving the seal cap 219 upward and downward. The boat elevator 115 is configured as a transfer device (transfer mechanism) that transfers the boat 217, that is, the wafer 200, into or out of the process chamber 201.

The boat 217 serving as a substrate support is configured to support the plurality of wafers 200 on multiple stages, for example, 100 to 150 wafers, that are vertically arranged in a horizontal posture while centers thereof are aligned, that is, to support the wafers arranged at intervals. The boat 217 is made of a heat-resistant material such as quartz and SiC. Below the boat 217, an insulation plate 218 made of a heat-resistant material such as quartz and SiC is supported in a horizontal posture on multiple stages and prevents heat generated from the heater 207 from being transferred to the seal cap 219 side. However, this embodiment is not limited thereto. For example, the insulation plate 218 may not be provided below the boat 217, but an insulation tube configured as a tubular member made of a heat-resistant material such as quartz and SiC may be provided.

A temperature sensor 263 serving as a temperature detector is provided in the reaction tube 203. By regulating power supply to the heater 207 based on information on the temperature detected by the temperature sensor 263, the temperature in the process chamber 201 is set to have a desired temperature distribution. Similar to the nozzles 249a through 249d, the temperature sensor 263 is configured in an L shape, and is provided along the inner wall of the reaction tube 203.

Figure 3:
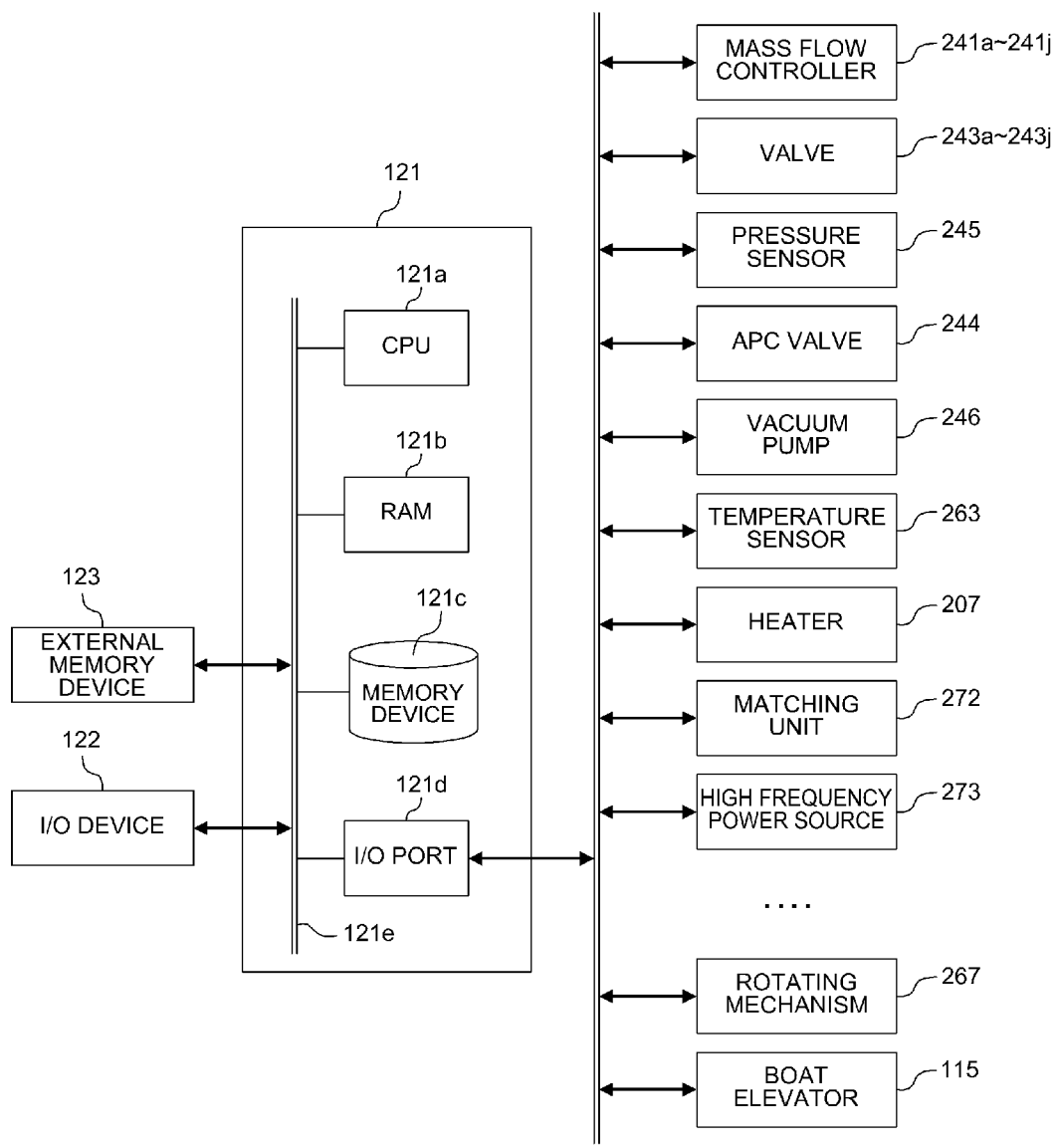
FIG. 3 is a diagram illustrating a schematic configuration of a controller of the substrate processing apparatus that is preferably used in the embodiment of the present invention and is a block diagram illustrating a control system of the controller.

As illustrated in FIG. 3, a controller 121 serving as a control unit (control device) is configured as a computer that includes a central processing unit (CPU) 121a, a random access memory (RAM) 121b, a memory device 121c and an input/output (I/O) port 121d. The RAM 121b, the memory device 121c and the I/O port 121d are configured to exchange data with the CPU 121a through an internal bus 121e. An I/O device 122 configured as, for example, a touch panel, is connected to the controller 121.

The memory device 121c is configured as, for example, a flash memory and a hard disk drive (HDD). A control program controlling operations of the substrate processing apparatus, a process recipe describing sequences or conditions of substrate processing (to be described later), and the like are readably stored in the memory device 121c. The process recipe, which is a combination of sequences, causes the controller 121 to execute each sequence in a substrate processing process to be described later in order to obtain a predetermined result, and functions as a program. Hereinafter, such a process recipe, a control program, and the like are collectively simply called a "program." When the term "program" is used in this specification, it may refer to either or both of the process recipe and the control program. The RAM 121b is configured as a memory area (work area) in which a program, data, and the like read by the CPU 121a are temporarily stored.

The I/O port 121d is connected to the MFCs 241a through 241j, the valves 243a through 243j, the pressure sensor 245, the APC valve 244, the vacuum pump 246, the heater 207, the temperature sensor 263, the high frequency power source 273, the matching unit 272, the rotating mechanism 267, the boat elevator 115, and the like.

The CPU 121a reads and executes the control program from the memory device 121c and reads the process recipe from the memory device 121c according to an input of a manipulating command from the I/O device 122 and the like. To comply with content of the read process recipe, the CPU 121a is configured to control a flow rate regulating operation of various gases by the MFCs 241a through 241j, an opening and closing operation of the valves 243a through 243j, an opening and closing operation of the APC valve 244, a pressure regulation operation by the APC valve 244 based on the pressure sensor 245, starting and stopping of the vacuum pump 246, a temperature regulating operation of the heater 207 based on the temperature sensor 263, power supply of the high frequency power source 273, an impedance regulating operation by the matching unit 272, a rotation and rotational speed regulating operation of the boat 217 by the rotating mechanism 267, a raising and lowering of the boat 217 by the boat elevator 115, and the like.

The controller 121 is not limited to being configured as a dedicated computer but may be configured as a general-purpose computer. For example, the controller 121 according to this embodiment may be configured by preparing an external memory device 123 [for example, a magnetic tape, a magnetic disk such as a flexible disk and a hard disk, an optical disc such as a compact disc (CD) and a digital video disc (DVD), a magneto-optical disc such as an MO and a semiconductor memory such as a Universal Serial Bus (USB) memory and a memory card] recording the above program, and then installing the program in the general-purpose computer using the external memory device 123. However, a method of supplying the program to the computer is not limited to using the external memory device 123. For example, a communication line such as the Internet or an exclusive line may be used to supply the program without using the external memory device. The memory device 121c or the external memory device 123 is configured as a non-transitory computer-readable recording medium. Hereinafter, these are also collectively simply called a recording medium. When the term "recording medium" is used in this specification, it refers to either or both of the memory device 121c and the external memory device 123.

(2) Substrate Processing Process

Next, as a process among manufacturing processes of a semiconductor apparatus (semiconductor device) using the processing furnace of the above-described substrate processing apparatus, an exemplary sequence of forming a thin film on a substrate will be described. In the following description, operations of respective units constituting the substrate processing apparatus are controlled by the controller 121.

In a film-forming sequence of this embodiment, an oxycarbonitride film containing a predetermined element is formed on the substrate by performing a cycle a predetermined number of times, the cycle including a process of supplying a source gas containing the predetermined element to the substrate and a process of supplying a reaction gas containing N, C and O to the substrate.

In the process of supplying the source gas, a first layer containing the predetermined element is formed. In the process of supplying the reaction gas, the first layer is modified by reacting the first layer containing the predetermined element with the reaction gas, and an oxycarbonitride layer containing the predetermined element is formed as a second layer.

The phrase "a cycle including a process of supplying a source gas and a process of supplying a reaction gas is performed a predetermined number of times" means that, when alternately or simultaneously performing a process of supplying a source gas and a process of supplying a reaction gas is set as a cycle, the cycle is performed once or a plurality of times. That is, the cycle is performed at least once. In other words, a cycle in which a process of supplying a source gas and a process of supplying a reaction gas are alternately or simultaneously performed is performed once or a plurality of times. However, it is preferable that this cycle be performed a plurality of times.

Hereinafter, a film-forming sequence of this embodiment will be described with reference to FIGS. 4 and 5A.

Figure 4:
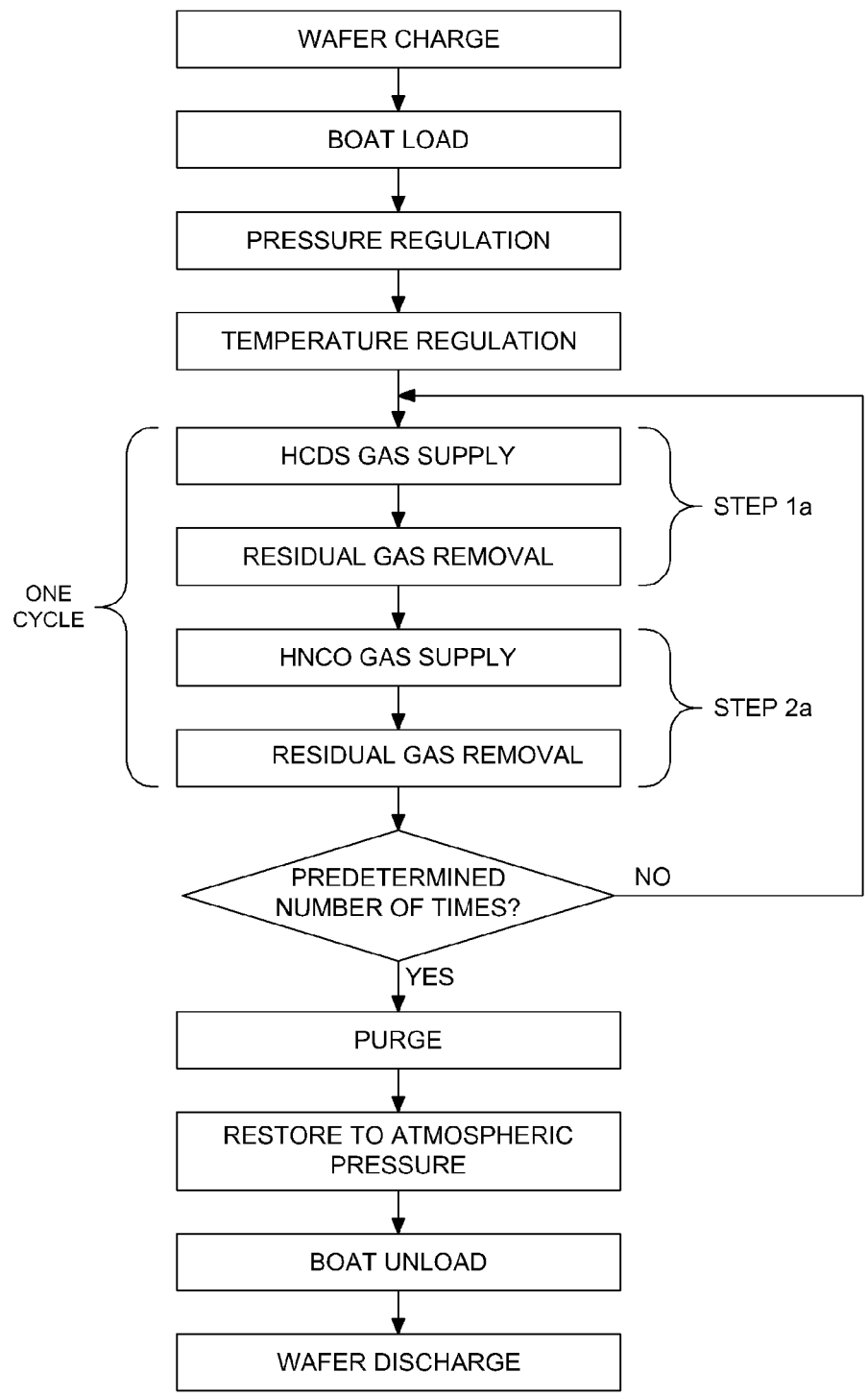
FIG. 4 is a diagram illustrating a film-forming flow in a film-forming sequence of a first embodiment.

In the film-forming sequence illustrated in FIGS. 4 and 5A, a silicon oxycarbonitride film (SiOCN film) is formed on the wafer 200 as an oxycarbonitride film containing Si by performing a cycle a predetermined number of times, the cycle including a process of supplying the chlorosilane-based source gas (HCDS gas) to the wafer 200 as a source gas containing Si, and a process of supplying the isocyanate-based gas (HNCO gas) to the wafer 200 as a reaction gas containing N, C and O.

FIGS. 4 and 5A illustrate an example in which the process of supplying a source gas and the process of supplying a reaction gas are alternately performed a predetermined number of times.

When the term "wafer" is used in this specification, it refers to "the wafer itself," or a "laminate (aggregate) of a wafer, a predetermined layer, film, and the like formed on a surface thereof," that is, the wafer refers to a wafer including a predetermined layer, film, and the like formed on a surface thereof. In addition, when the term "surface of the wafer" is used in this specification, it refers to "a surface (exposed surface) of the wafer itself" or "a surface of a predetermined layer, film, and the like formed on the wafer, that is, the outermost surface of the wafer as the laminate."

Therefore, when it is described in this specification that "a predetermined gas is supplied to the wafer," it means that "a predetermined gas is directly supplied to a surface (exposed surface) of the wafer itself" or "a predetermined gas is supplied to a layer, film, and the like formed on the wafer, that is, to the outermost surface of the wafer as the laminate." In addition, when it is described in this specification that "a predetermined layer (or film) is formed on the wafer," it means that "a predetermined layer (or film) is directly formed on a surface (exposed surface) of the wafer itself" or "a predetermined layer (or film) is formed on a layer, film, and the like formed on the wafer, that is, a predetermined layer (or film) is formed on the outermost surface of the wafer as the laminate."

The terms "substrate" and "wafer" as used in this specification have the same meanings. Thus, the term "wafer" in the above description may be replaced with the term "substrate."

Wafer Charging and Boat Loading

When the plurality of wafers 200 are loaded (wafer charging) on the boat 217, the boat 217 supporting the plurality of wafers 200 is lifted by the boat elevator 115 and is loaded (boat loading) into the process chamber 201, as illustrated in FIG. 1. In this state, the lower end of the reaction tube 203 is sealed by the seal cap 219 through the O ring 220.

Pressure Regulation and Temperature Regulation

Vacuum exhaust is performed by the vacuum pump 246 such that a pressure in the process chamber 201, that is, a pressure in a space in which the wafer 200 is present, has a desired pressure (degree of vacuum). In this case, the pressure in the process chamber 201 is measured by the pressure sensor 245, and the APC valve 244 is feedback-controlled (pressure regulation) based on information on the measured pressure. The vacuum pump 246 is continuously operated at least until processing on the wafer 200 is completed. In addition, the wafer 200 in the process chamber 201 is heated to a desired temperature by the heater 207. In this case, based on information on the temperature detected by the temperature sensor 263, power supply to the heater 207 is feedback-controlled (temperature regulation) such that an inside of the process chamber 201 has a desired temperature distribution. The heating of the inside of the process chamber 201 by the heater 207 is continuously performed at least until processing on the wafer 200 is completed. Subsequently, the rotating mechanism 267 begins to rotate the boat 217 and the wafer 200. The rotation of the boat 217 and the wafer 200 by the rotating mechanism 267 is continuously performed at least until processing on the wafer 200 is completed.

SiOCN Film Forming Process

Then, the following two steps, steps 1a and 2a, are sequentially performed.

Step 1a: HCDS as Supply

The valve 243a is opened to flow the HCDS gas into the gas supply pipe 232a. A flow rate of the HCDS gas is regulated by the MFC 241a. The HCDS gas is supplied into the process chamber 201 from the gas supply hole 250a and is exhausted through the exhaust pipe 231. At this time, the HCDS gas is supplied to the wafer 200. At the same time, the valve 243g is opened to flow the inert gas such as N2 gas into the gas supply pipe 232g. A flow rate of the N2 gas is regulated by the MFC 241g. The N2 gas is supplied into the process chamber 201 together with the HCDS gas and is exhausted through the exhaust pipe 231.

In this case, in order to prevent the HCDS gas from being introduced into the nozzles 249b through 249d and the buffer chamber 237, the valves 243h through 243j are opened to flow the N2 gas into the gas supply pipes 232h through 232j. The N2 gas is supplied into the process chamber 201 through the gas supply pipes 232b through 232d, the nozzles 249b through 249d and the buffer chamber 237 and is exhausted through the exhaust pipe 231.

At this time, by appropriately adjusting the APC valve 244, the pressure in the process chamber 201 is set to, for example, a range of 1 Pa to 13,300 Pa, and preferably, 20 Pa to 1,330 Pa. A supply flow rate of the HCDS gas controlled by the MFC 241a is set to a flow rate within, for example, a range of 1 sccm to 1,000 sccm. A supply flow rate of the N2 gas controlled by the MFCs 241g through 241j is set to a flow rate within, for example, a range of 100 sccm to 10,000 sccm. A time for which the HCDS gas is supplied to the wafer 200, that is, a gas supply time [radiation time], is set to a time, for example, in a range of 1 to 120 seconds, and preferably, 1 to 60 seconds. The temperature of the heater 207 at this time is set such that the temperature of the wafer 200 falls within, for example, a range of 250° C. to 700° C., preferably 300° C. to 650° C., and more preferably, 350° C. to 600° C.

When the temperature of the wafer 200 is less than 250° C., since it is difficult for the HCDS to be chemically adsorbed onto the wafer 200, a practical film-forming speed may not be obtained. When the temperature of the wafer 200 is set to 250° C. or more, it is possible to address this problem. When the temperature of the wafer 200 is set to 300° C. or more, or 350° C. or more, it is possible for the HCDS to be sufficiently adsorbed onto the wafer 200, thereby obtaining a more sufficient film-forming speed.

When the temperature of the wafer 200 is greater than 700° C., a chemical vapor deposition (CVD) reaction becomes strong [a gas-phase reaction is dominant] and thus film thickness uniformity is likely to be degraded and control thereof may be difficult. When the temperature of the wafer 200 is set to 700° C. or less, it is possible to prevent degradation of the film thickness uniformity and thus control thereof is possible. In particular, when the temperature of the wafer 200 is set to 650° C. or less, or 600° C. or less, a surface reaction becomes dominant, the film thickness uniformity is easily secured and control thereof becomes easy.

Therefore, the temperature of the wafer 200 may be set to a range of 250° C. to 700° C., preferably 300° C. to 650° C., and more preferably, 350° C. to 600° C.

Under the above-described conditions, when the HCDS gas is supplied to the wafer 200, a silicon-containing layer that contains Cl and has a thickness of, for example, about less than one atomic layer to several atomic layers, is formed on the wafer 200 [a base film of the surface] as a first layer. The first layer may include either or both of an adsorption layer of the HCDS gas and a Si layer containing Cl.

The Si layer containing Cl generally refers to a continuous layer that is formed of Si and contains Cl, a discontinuous layer thereof, or a Si thin film that is formed by overlapping these layers and contains Cl. The continuous layer formed of Si and containing Cl may also be called a Si thin film containing Cl. Si forming the Si layer containing Cl includes Si in which a bond with Cl is not completely broken and Si in which a bond with Cl is completely broken.

The adsorption layer of the HCDS gas includes a chemical adsorption layer in which gas molecules of the HCDS gas are continuous and a chemical adsorption layer in which gas molecules of the HCDS gas are discontinuous. That is, the adsorption layer of the HCDS gas includes a chemical adsorption layer that is formed of the HCDS molecules and has a thickness of one molecular layer or less than one molecular layer. The HCDS molecules forming the adsorption layer of the HCDS gas also include molecules in which a bond between Si and Cl is partially broken.

Here, "layer having a thickness of less than one atomic layer" refers to a discontinuously formed atomic layer. "Layer having a thickness of one atomic layer" refers to a continuously formed atomic layer. "Layer having a thickness of less than one molecular layer" refers to a discontinuously formed molecular layer. "Layer having a thickness of one molecular layer" refers to a continuously formed molecular layer.

Under conditions in which the HCDS gas is self-decomposed (pyrolyzed), that is, conditions causing a pyrolysis reaction of the HCDS, when Si is deposited on the wafer 200, the Si layer containing Cl is formed. Under conditions in which the HCDS gas is not self-decomposed (pyrolyzed), that is, conditions that do not cause a pyrolysis reaction of the HCDS, when the HCDS gas is adsorbed onto the wafer 200, the adsorption layer of the HCDS gas is formed. Forming the Si layer containing Cl on the wafer 200 is preferable since a film-forming rate is higher when the Si layer containing Cl is formed on the wafer 200 than when the adsorption layer of the HCDS gas is formed on the wafer 200.

When the thickness of the first layer formed on the wafer 200 is more than several atomic layers, a modification action in the following step 2a does not influence the entire first layer. Also, a minimum thickness of the first layer that may be formed on the wafer 200 is less than one atomic layer. Therefore, the thickness of the first layer is preferably set to a thickness of less than one atomic layer to several atomic layers. In addition, when the thickness of the first layer is set to one atomic layer or less, that is, one atomic layer or less than one atomic layer, since an effect of a modification reaction in the following step 2a relatively increases, it is possible to reduce a time required for the modification reaction in step 2a. Also, a time required for forming the first layer in step 1a may decrease. As a result, it is possible to reduce a processing time for performing one cycle, and a processing time in total may thus be reduced. That is, it is possible to increase the film-forming rate. In addition, when the thickness of the first layer is set to one atomic layer or less, it is possible to increase controllability of the film thickness uniformity.

Residual Gas Removal

After the first layer is formed, the valve 243a is closed to suspend supply of the HCDS gas. At this time, while the APC valve 244 is opened, the inside of the process chamber 201 is vacuum-exhausted by the vacuum pump 246, and any unreacted gas remaining in the process chamber 201 or the HCDS gas that has contributed to formation of the first layer is removed from the inside of the process chamber 201. At this time, while the valves 243g through 243j are opened, supply of the N2 gas serving as the inert gas into the process chamber 201 continues. The N2 gas serves as a purge gas. Accordingly, it is possible to effectively remove the unreacted gas remaining in the process chamber 201 or the HCDS gas that has contributed to formation of the first layer from the inside of the process chamber 201.

At this time, the gas remaining in the process chamber 201 may not be completely removed, and the inside of the process chamber 201 may not be completely purged. When an amount of the gas remaining in the process chamber 201 is small, there is no negative influence on step 2a performed thereafter. In this case, there is no need to set a flow rate of the N2 gas supplied into the process chamber 201 to be high. For example, when the same amount of the N2 gas as a volume of the reaction tube 203 [the process chamber 201] is supplied, it is possible to purge to the extent that there is no negative influence on step 2a. When the inside of the process chamber 201 is not completely purged, a purge time decreases, thereby improving throughput. Also, it is possible to suppress unnecessary consumption of the N2 gas to a minimum.

As the source gas, instead of the HCDS gas, tetrachlorosilane, that is, a chlorosilane-based source gas such as silicon tetrachloride (SiCl4, abbreviated as STC) gas, trichlorosilane (SiHCl3, abbreviated as TCS) gas, dichlorosilane (SiH2Cl2, abbreviated as DCS) gas, or monochlorosilane (SiH3Cl, abbreviated as MCS) gas may be used. As the source gas, an aminosilane-based source gas such as (ethylmethylamino)silane (SiH3[N(CH3)(C2H5)]) gas, (dimethylamino)silane (SiH3 [N(CH3)2]) gas, (diethyl-piperidino)silane (SiH3[NC5H8(C2H5)2]) gas, bis(diethylamino) silane (SiH2[N(C2H5)2]2, abbreviated as BDEAS) gas, bistertiarybutylaminosilane (SiH2[NH(C4H9)]2, abbreviated as BTBAS) gas, bis(diethyl-piperidino)silane (SiH2 [NC5H8(C2H5)2]2, abbreviated as BDEPS) gas, tris(diethylamino)silane (SiH[N(C2H5)2]3, abbreviated as 3DEAS) gas, tris(dimethylamino)silane (Si[N(CH3)2]3, abbreviated as 3DMAS) gas, tetrakis(diethylamino)silane (Si[N(C2H5) 2]4, abbreviated as 4DEAS) gas, or tetrakis(dimethylamino) silane (Si[N(CH3)2]4, abbreviated as 4DMAS) gas may also be used.

As the inert gas, instead of the N2 gas, a rare gas such as Ar gas, He gas, Ne gas, or Xe gas may be used.

Step 2a: HNCO as Supply

After step 1a is completed and the residual gas in the process chamber 201 is removed, the valve 243b is opened to flow the HNCO gas into the gas supply pipe 232b. A flow rate of the HNCO gas is regulated by the MFC 241b. The HNCO gas is supplied into the process chamber 201 from the gas supply hole 250b and is exhausted through the exhaust pipe 231. At this time, the HNCO gas activated by heat is supplied to the wafer 200. At the same time, the valve 243h is opened to flow the N2 gas into the gas supply pipe 232h as the inert gas. A flow rate of the N2 gas is regulated by the MFC 241h. The N2 gas is supplied into the process chamber 201 together with the HNCO gas and is exhausted through the exhaust pipe 231.

At this time, in order to prevent the HNCO gas from being introduced into the nozzles 249a, 249c and 249d, and the buffer chamber 237, the valves 243g, 243i and 243j are opened to flow the N2 gas into the gas supply pipes 232g, 232i and 232j. The N2 gas is supplied into the process chamber 201 through the gas supply pipes 232a, 232c and 232d, the nozzles 249a, 249c and 249d, and the buffer chamber 237 and is exhausted through the exhaust pipe 231.

At this time, by appropriately adjusting the APC valve 244, the pressure in the process chamber 201 is set to, for example, a range of 1 Pa to 13,300 Pa, and preferably, 500 Pa to 5,000 Pa. When the pressure in the process chamber 201 is set to a relatively high pressure range in this way, it is possible to thermally activate the HNCO gas to a non-plasma state. When the HNCO gas is activated by heat and then supplied, since a soft reaction may be caused, a modification to be described later may be softly performed. A supply flow rate of the HNCO gas controlled by the MFC 241b is set to a flow rate within, for example, a range of 1 sccm to 2,000 sccm. A supply flow rate of the N2 gas controlled by the MFCs 241g through 241j is set to a flow rate within, for example, a range of 100 sccm to 10,000 sccm. At this time, a partial pressure of the HNCO gas in the process chamber 201 is set to a pressure in a range of 0.01 Pa to 12,667 Pa. A time for which the HNCO gas activated by heat is supplied to the wafer 200, that is, a gas supply time (radiation time), is set to a time, for example, in a range of 1 to 120 seconds, and preferably, 1 to 60 seconds. Similar to step 1a, the temperature of the heater 207 at this time is set such that the temperature of the wafer 200 falls within, for example, a range of 250° C. to 700° C., preferably 300° C. to 650° C., and more preferably, 350° C. to 600° C.

Under the above-described conditions, when the HNCO gas is supplied to the wafer 200, the first layer formed on the wafer 200 in step 1a and the HNCO gas react That is, Cl (chloro group) that is an atom of the halogen element (halogen group) included in the first layer and a ligand (H) included in the HNCO gas may react. Therefore, Cl of the first layer that has reacted with H of the HNCO may be separated (extracted) from the first layer and H of the HNCO that has reacted with Cl of the first layer may be separated from the HNCO. Then, N of the HNCO gas from which H is separated and Si included in the first layer may be combined. That is, it is possible to form a Si—N bond by combining N that forms the HNCO gas and has a dangling bond due to a break from H with Si that is included in the first layer and has a dangling bond or Si having a dangling bond. Also, in this case, it is possible to form a Si—C bond by combining C included in the HNCO gas and Si included in an initial layer, or it is possible to form Si—O bond by combining O included in the HNCO gas and Si included in the initial layer.

According to the reactions in series, Cl is desorbed from the first layer and an N component, a C component and an O component are newly added to the first layer. As a result, the first layer is changed to a second layer containing Si, O, C and N, that is, changed (modified) to a silicon oxycarbonitride layer (SiOCN layer). The second layer has a thickness of about less than one atomic layer to several atomic layers. The second layer is a layer, for example, having a high ratio of a Si component and a high ratio of a C component, that is, a Si-rich and C-rich layer.

When the SiOCN layer is formed as the second layer, Cl included in the first layer or H included in the HNCO gas form a gaseous substance such as a chlorine (Cl2) gas, a hydrogen (H2) gas, or a hydrogen chloride (HCl) gas during the modification reaction of the first layer with the HNCO gas, and is removed from the inside of the process chamber 201 through the exhaust pipe 231. That is, impurities such as Cl in the first layer are extracted or desorbed from the first layer and thus removed from the first layer. As a result, the second layer has lower impurities such as Cl than the first layer.

Residual Gas Removal

After the second layer is formed, the valve 243b is closed to suspend supply of the HNCO gas. At this time, while the APC valve 244 is opened, the inside of the process chamber 201 is vacuum-exhausted by the vacuum pump 246, and any unreacted gas remaining in the process chamber 201, HNCO gas that has contributed to formation of the second layer, or reaction by-products is removed from the inside of the process chamber 201. At this time, while the valves 243g through 243j are opened, supply of the N2 gas serving as the inert gas into the process chamber 201 continues. The N2 gas serves as a purge gas. Accordingly, it is possible to effectively remove the unreacted gas remaining in the process chamber 201, the HNCO gas that has contributed to formation of the second layer, or the reaction by-products from the inside of the process chamber 201.

At this time, the gas remaining in the process chamber 201 may not be completely removed, and the inside of the process chamber 201 may not be completely purged. When an amount of the gas remaining in the process chamber 201 is small, there is no negative influence on step 1a performed thereafter. In this case, there is no need to set a flow rate of the N2 gas supplied into the process chamber 201 to be high. For example, when the same amount of the N2 gas as a volume of the reaction tube 203 [the process chamber 201] is supplied, it is possible to purge to the extent that there is no negative influence on step 1a. When the inside of the process chamber 201 is not completely purged, a purge time decreases, thereby improving throughput. Also, it is possible to suppress unnecessary consumption of the N2 gas to a minimum.

As the isocyanate-based gas, instead of the HNCO gas, a methyl-based isocyanate gas such as methyl isocyanate (C2H3NO) gas, chloromethyl isocyanate (C2H2ClNO) gas, isocyanate methyl acetate (C4H5NO3) gas, (isocyanatomethyl)methyl carbamate (C4H6N2O3) gas and (isocyanatomethyl)diethyl phosphonate (C6H12NO4P) gas, ethyl-based isocyanate gas such as ethyl isocyanate (C3H5NO) gas, 2-chloroethyl isocyanate (C3H4ClNO) gas and isocyanate ethyl acetate (C5H7NO3) gas, propyl-based isocyanate gas such as propyl isocyanate (C4H7NO) gas, (3-chloropropyl)isocyanate (C4H6ClNO) gas, 1,1-dimethyl propyl isocyanate (C6H11NO) gas and 3-(triethoxysilyl) propyl isocyanate (C10H21NO4Si) gas, and butyl-based isocyanate gas such a butyl isocyanate (C5H9NO) gas, tert-butyl isocyanate (C5H9NO) gas and n-butyl isocyanate (C5H9NO) gas, may be preferably used. In this way, as the isocyanate-based gas, a gas having a partial structure of —N═C═O in its composition formula (In a molecule), that is, in its chemical structural formula may be used, and as the ligand, an organic-based gas having an alkyl group such as a methyl group, an ethyl group, and a butyl group may be preferably used.

As the inert gas, instead of the N2 gas, a rare gas such as Ar gas, He gas, Ne gas, or Xe gas may be used.

Performing a Predetermined Number of Times

When a cycle including the above-described steps 1a and 2a is performed at least once (a predetermined number of times), that is, steps 1a and 2a are alternately performed once or more (a predetermined number of times), it is possible to form the SiOCN film having a predetermined composition and a predetermined film thickness on the wafer 200. It is preferable that the above-described cycle be performed a plurality of times. That is, the thickness of the SiOCN layer to be formed for a cycle is set to be lower than a desired film thickness, and the above-described cycle is preferably performed a plurality of times to obtain the desired film thickness.

At this time, when processing conditions such as the pressure in the process chamber 201 or the gas supply time are controlled in each step, a component of each element in the SiOCN layer, for example, a ratio of the Si component, an O component and an N component, that is, a Si concentration, an O concentration, a C concentration, or an N concentration may be finely adjusted and a composition ratio of the SiOCN film may be controlled more precisely. When the cycle is performed the plurality of times, if it is described that "a predetermined gas is supplied to the wafer 200" in each step at least after a second cycle, it means that "a predetermined gas is supplied to the layer formed on the wafer 200, that is, to the outermost surface of the wafer 200 as the laminate." When it is described that "a predetermined layer is formed on the wafer 200," it means that "a predetermined layer is formed on the layer formed on the wafer 200, that is, on the outermost surface of the wafer 200 as the laminate." These are the same as the above descriptions and will be the same as in each modification and other embodiments to be described later.

Purging and Restoring to Atmospheric Pressure

When a film-forming process of forming the SiOCN film having a predetermined composition and a predetermined film thickness is performed, the valves 243g through 243j are opened. The N2 gas serving as the inert gas is supplied into the process chamber 201 from each of the gas supply pipes 232g through 232j and is exhausted through the exhaust pipe 231. The N2 gas serves as a purge gas. Accordingly, the inside of the process chamber 201 is purged with the inert gas, and the gas remaining in the process chamber 201 or reaction by-products is removed from the inside of the process chamber 201 (purge). Then, an atmosphere in the process chamber 201 is replaced with the inert gas (inert gas replacement), and the pressure in the process chamber 201 is restored to the normal pressure (restoration to atmospheric pressure).

Boat Unloading and Wafer Discharge

Then, the seal cap 219 is moved downward by the boat elevator 115, the lower end of the reaction tube 203 is opened, and at the same time, the processed wafer 200 is unloaded (boat unloading) to the outside of the reaction tube 203 from the lower end of the reaction tube 203 while being held on the boat 217. Then, the processed wafer 200 is extracted from the boat 217 (wafer discharge).

(3) Effects of this Embodiment

According to this embodiment, one or a plurality of effects to be described will be obtained.

(a) According to this embodiment, the SiOCN film may be formed on the wafer 200 by alternately performing a process of supplying of a source gas containing a predetermined element, for example, the HCDS gas that is the chlorosilane-based source gas, to the wafer 200 and a process of supplying a reaction gas containing N, C and O, for example, the HNCO gas as the isocyanate-based gas, to the wafer 200, a predetermined number of times. Therefore, it is possible to improve productivity when the SiOCN film is formed. In a conventional film-forming sequence, when the SiOCN film is formed, four types of gases, a gas containing Si, a gas containing O, a gas containing C and a gas containing N need to be alternately supplied to the wafer 200. On the other hand, in the film-forming sequence of this embodiment, by alternately supplying two types of gases, the HCDS gas and the HNCO gas, to the wafer 200, it is possible to form the SiOCN film. Accordingly, it is possible to simplify supply control of the gases, and it is possible to reduce the number of gas supply processes for each cycle. As a result, it is possible to improve productivity when the film is formed. In addition, since the types of gases necessary for film formation decrease, a configuration of the gas supply system is simplified and the number of nozzles decreases. As a result, a device cost decreases and maintenance becomes easy.

(b) According to this embodiment, a Si-rich and C-rich SiOCN film may be formed on the wafer 200 by alternately performing a process of supplying a source gas containing a predetermined element, for example, the HCDS gas as the chlorosilane-based source gas, to the wafer 200, and a process of supplying a reaction gas containing N, C and O, for example, the HNCO gas that is the isocyanate-based gas, to the wafer 200, a predetermined number of times. That is, compared to a film-forming sequence in which four types of gases, a gas containing Si, a gas containing O, a gas containing C and a gas containing N, are alternately supplied to the wafer 200, in the film-forming sequence of this embodiment, Si and C may be sufficiently fixed onto the wafer 200 during a process of forming the SiOCN film, and desorption of these elements from the wafer 200 may be sufficiently suppressed. As a result, it is possible to form the SiOCN film having a high C concentration.

(c) According to this embodiment, by controlling the pressure in the process chamber 201 when the reaction gas is supplied, it is possible to finely adjust the C concentration and the like in the SiOCN film. For example, by setting the pressure in the process chamber 201 when the HNCO gas is supplied to the wafer 200 in step 2a to be greater than the pressure in the process chamber 201 when the HCDS gas is supplied to the wafer 200 in step 1a, it is possible to further increase the C concentration in the SiOCN film. In addition, for example, by setting the pressure in the process chamber 201 when the HNCO gas is supplied to the wafer 200 in step 2a to be equal to or lower than the pressure in the process chamber 201 when the HCDS gas is supplied to the wafer 200 in step 1a, it is possible to appropriately suppress an increased amount of the C concentration in the SiOCN film.

(d) According to a film-forming sequence of this embodiment, in step 2a, by reacting the first layer with the reaction gas containing N, C and O, for example, the HNCO gas that is the isocyanate-based gas, it is possible to extract or desorb impurities such as Cl from the first layer. As a result, it is possible to decrease a concentration of the impurities in the SiOCN film, and it is possible to further increase a resistance to HF of the SiOCN film.

(e) According to this embodiment, when the HNCO gas that includes four elements of N, C, O and H and is the Si-free and metal-free isocyanate-based gas used as the reaction gas, it is possible to reduce the concentration of impurities in the SiOCN film to be formed. That is, compared to a film-forming sequence in which, for example, tetrakis ethylmethylamino hafnium (Hf[N(C2H5)(CH3)]4, abbreviated as TEMAH) gas including four elements of hafnium (Hf), C, N and H or the like is used as the reaction gas, in the film-forming sequence of this embodiment using the HNCO gas as the reaction gas, since a probability of mixing impurity elements into the second layer that is formed by reacting the reaction gas with the first layer may decrease, it is possible to reduce the concentration of the impurities in the SiOCN film to be formed.

(f) According to this embodiment, when the HNCO gas that includes four elements of N, C, O and H and is the Si-free and metal-free isocyanate-based gas is used as the reaction gas, and when the film-forming sequence in which the HCDS gas and the HNCO gas are alternately supplied to the wafer 200 is employed, it is possible to improve reaction controllability, in particular, composition controllability when the SiOCN film is formed. That is, compared to a film-forming sequence in which, for example, the TEMAH gas including four elements of Hf, C, N and H, and the like is used as the reaction gas, in the film-forming sequence of this embodiment using the HNCO gas as the reaction gas, it possible to improve reaction controllability, in particular, composition controllability when the second layer is formed by reacting the reaction gas with the first layer. In addition, compared to a film-forming sequence in which four types of gases, a gas containing Si, a gas containing 0, a gas containing C and a gas containing N, are alternately supplied to the wafer 200, in the film-forming sequence of this embodiment in which two types of gases, the HCDS gas and the HNCO gas, are alternately supplied to the wafer 200, it is possible to improve reaction controllability, in particular, composition controllability, during a process of forming the SiOCN film. Therefore, it is possible to easily perform composition control of the SiOCN film. As a result, it is possible to improve an etching resistance of the SiOCN film to be formed or adjust a dielectric constant.

(g) According to this embodiment, when the HNCO gas that is the isocyanate-based gas is used as the reaction gas, it is possible to improve film thickness uniformity of the SiOCN film in a plane of the wafer 200 and between planes of the wafers 200. That is, compared to, for example, the TEMAH gas including four elements of Hf, C, N and H, and the like, the isocyanate-based gas having a partial structure of —N=C=O includes high reactivity with the first layer. Therefore, in the film-forming sequence of this embodiment using the HNCO gas as the reaction gas, it is possible to securely and uniformly react the reaction gas with the first layer in a plane of the wafer 200 and between planes of the wafers 200. As a result, it is possible to improve film thickness uniformity of the SiOCN film in a plane of the wafer 200 and between planes of the wafers 200.

These effects may be obtained when the above-described chlorosilane-based source gas other than the HCDS gas is used as the source gas containing a predetermined element or even when the above-described aminosilane-based source gas is used. Also, these effects may be obtained even when the above-described isocyanate-based gas other than the HNCO gas is used as the reaction gas containing N, C and O.

Modification

Figure 5B:
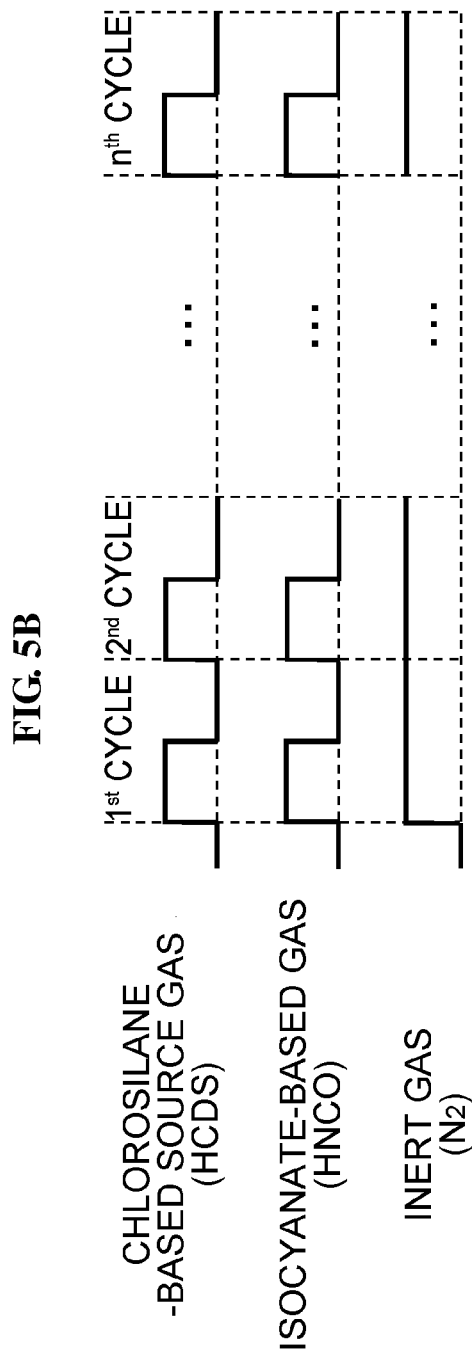

In the above-described film-forming sequence illustrated in FIGS. 4 and 5A, the example in which the cycle of alternately performing steps 1a and 2a is performed at least once (a predetermined number of times) has been described, but this embodiment is not limited thereto. For example, a cycle of simultaneously performing steps 1a and 2a may be performed at least once (a predetermined number of times). FIG. 5B illustrates an example in which a cycle of simultaneously performing steps 1a and 2a is performed a plurality of times (n times). FIG. 5C illustrates an example in which a cycle of simultaneously performing steps 1a and 2a is performed once. By mainly adjusting the number of times the cycle is performed in a film-forming sequence illustrated in FIG. 5B and by mainly adjusting a performing time (gas supply time) of the cycle in a film-forming sequence illustrated in FIG. 5C, it is possible to control a film thickness of the SiOCN film. Processing conditions in this case may be the same as those of the above-described film-forming sequence illustrated in FIGS. 4 and 5A.

When the HCDS gas and the HNCO gas are simultaneously supplied, the same effects as in the above-described embodiment may be obtained. However, as in the above-described embodiment, when supply of the HCDS gas and supply of the HNCO gas are alternately performed with purging of the inside of the process chamber 201 interposed therebetween, since the HCDS gas and the HNCO gas may be appropriately reacted under conditions in which a surface reaction is dominant and controllability of film thickness control may increase, it is preferable.

Second Embodiment of the Present Invention

Next, the second embodiment of the present invention will be described.

In the above-described first embodiment, the example in which the SiOCN film is formed on the substrate by performing the cycle including steps 1a and 2a a predetermined number of times has been described. In this embodiment, an example in which a SiOCN film, a SiON film, or a SiOC film is formed on the substrate by performing a cycle a predetermined number of times will be described. The cycle further includes step 3b of supplying an oxidizing gas to the substrate in addition to steps 1b and 2b which are comparable to the above-described steps 1a and 2a.

First Sequence

Figure 6:
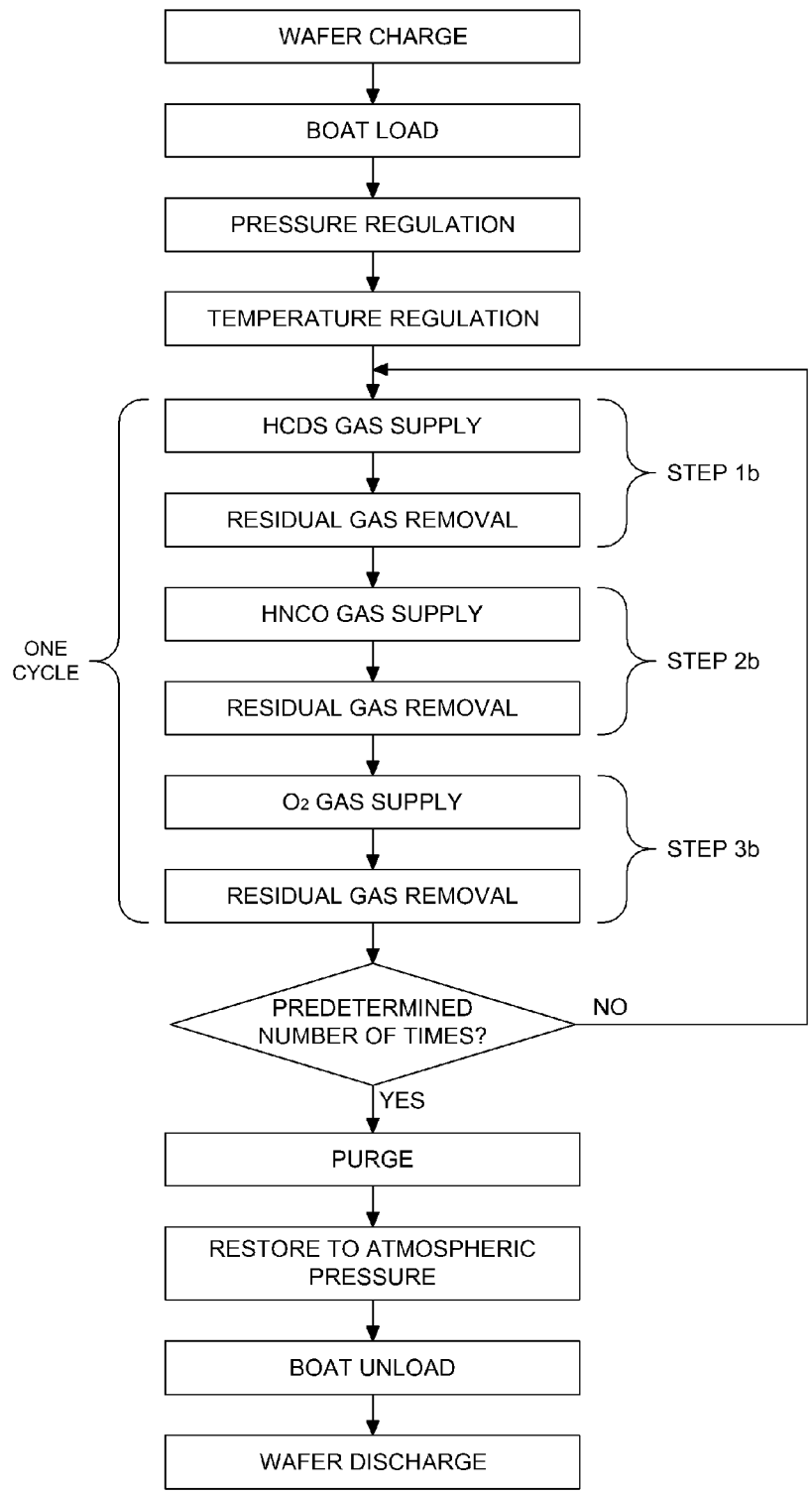
FIG. 6 is a diagram illustrating a film-forming flow in a first sequence of a second embodiment.

First, a first sequence of this embodiment will be described with reference to FIGS. 6 and 8A.

In the first sequence of this embodiment, the SiOCN film, the SiON film, or the SiOC film is formed on the wafer 200 by performing a cycle a predetermined number of times. The cycle includes a process of supplying the chlorosilane-based source gas (HCDS gas) to the wafer 200 as the source gas containing Si, a process of supplying the isocyanate-based gas (HNCO gas) to the wafer 200 as the reaction gas containing N, C and O, and a process of supplying the oxidizing gas (O2 gas) to the wafer 200.

A difference between this sequence and the film-forming sequence of the first embodiment is that step 3b is further included in addition to steps 1b and 2b which are comparable to steps 1a and 2a. Except this difference, the sequence is the same as the film-forming sequence of the first embodiment. Hereinafter, step 3b of this embodiment will be described.

Step 3b: O2 Gas Supply

After step 2b is completed and the residual gas in the process chamber 201 is removed, the valve 243c is opened to flow the O2 gas into the gas supply pipe 232c. A flow rate of the O2 gas is regulated by the MFC 241c, and the O2 gas is supplied into the buffer chamber 237 from the gas supply hole 250c. At this time, when high frequency power is not applied between the rod-shaped electrodes 269 and 270, the O2 gas supplied into the buffer chamber 237 is activated by heat, is supplied into the process chamber 201 from the gas supply hole 250e, and is exhausted through the exhaust pipe 231. At this time, the O2 gas activated by heat is supplied to the wafer 200. At the same time, the valve 243i is opened to flow the N2 gas into the gas supply pipe 232i. The N2 gas is supplied into the process chamber 201 together with the O2 gas and is exhausted through the exhaust pipe 231.

At this time, in order to prevent the O2 gas from being introduced into the nozzles 249a, 249b and 249d, the valves 243g, 243h and 243j are opened to flow the N2 gas into the gas supply pipes 232g, 232h and 232j. The N2 gas is supplied into the process chamber 201 through the gas supply pipes 232a, 232b and 232d and the nozzles 249a, 249b and 249d and is exhausted through the exhaust pipe 231.

At this time, by appropriately adjusting the APC valve 244, the pressure in the process chamber 201 is set to, for example, a range of 1 Pa to 3,000 Pa. When the pressure in the process chamber 201 is set to a relatively high pressure range in this way, it is possible to thermally activate the O2 gas to a non-plasma state. When the O2 gas is activated by heat and then supplied, since a relatively soft reaction may be caused, oxidization to be described later may be softly performed. A partial pressure of the O2 gas in the process chamber 201 is set to, for example, a range of 0.01 Pa to 2,970 Pa. A supply flow rate of the O2 gas controlled by the MFC 241c is set to a flow rate within, for example, a range of 100 sccm to 10,000 sccm. A supply flow rate of the N2 gas controlled by the MFCs 241g through 241j is set to a flow rate within, for example, a range of 100 sccm to 10,000 sccm. A time for which the O2 gas activated by heat is supplied to the wafer 200, that is, a gas supply time (radiation time), is set to a time, for example, in a range of 1 to 120 seconds, and preferably, 1 to 60 seconds. Similar to steps 1b and 2b, the temperature of the heater 207 at this time is set such that the temperature of the wafer 200 falls within, for example, a range of 250° C. to 700° C., preferably 300° C. to 650° C., and more preferably, 350° C. to 600° C.

In this case, the gas flowing into the process chamber 201 is the O2 gas that is thermally activated by increasing the pressure in the process chamber 201. The HCDS gas and the HNCO gas do not flow into the process chamber 201. Therefore, the O2 gas does not cause a gas-phase reaction, and the activated O2 gas reacts with at least a part of the second layer formed on the wafer 200 in step 2b. Therefore, the second layer is oxidized and is changed (modified) to a third layer (SiOCN layer) containing Si, O, C and N, a third layer (SiON layer) containing Si, O and N, or a third layer (SiOC layer) containing Si, O and C. The third layer has a thickness of, for example, about less than one atomic layer to several atomic layers.

When the O2 gas is activated by heat and then flows into the process chamber 201, the second layer may be thermally oxidized and modified (changed) to the third layer. At this time, while the O component is added to the second layer, and when at least some of the C component or the N component is desorbed (extracted) from the second layer, the second layer is modified to the third layer. At this time, due to an effect of thermal oxidation by the O2 gas, Si—O bonds in the second layer increase, whereas Si—C bonds, Si—N bonds, and Si—Si bonds decrease, and ratios of the C component, the N component and the Si component in the second layer decrease. In particular, most of the C component or the N component may be desorbed to be reduced an impurity level. For example, when the modification is performed such that the ratio of the C component in the second layer is reduced to the impurity level, the second layer may be changed to the SiON layer. Also, for example, when the modification is performed such that the ratio of the N component in the second layer is reduced to the impurity level, the second layer may be changed to the SiOC layer. Also, for example, when the modification is stopped before ratios of the C component and the N component in the second layer are reduced to the impurity level, the modified second layer may be changed to the SiOCN layer having lower ratios of the C component and the N component than the second layer. That is, while a composition ratio is changed such that the O concentration increases and the C concentration, the N concentration and the Si concentration decrease, the second layer may be modified to the third layer. Also, at this time, by controlling processing conditions such as the pressure in the process chamber 201 or the gas supply time, it is possible to finely adjust the ratio of the O component in the third layer, that is, the O concentration. As a result, it is possible to control the composition ratio of the third layer more precisely.

At this time, an oxidizing reaction of the second layer is preferably unsaturated. For example, when the second layer having a thickness of less than one atomic layer to several atomic layers is formed in steps 1b and 2b, a part of the second layer may be preferably oxidized. In this case, in order to prevent the entire second layer having a thickness of less than one atomic layer to several atomic layers from being oxidized, oxidization is performed under conditions in which the oxidizing reaction of the second layer is unsaturated.

In order to cause the unsaturated oxidizing reaction of the second layer, processing conditions in step 3b may be set as the above-described processing conditions. In addition, when the processing conditions in step 3b are set as the following processing conditions, it is easy to cause the unsaturated oxidizing reaction of the second layer.

Wafer temperature: 500° C. to 650° C.
Pressure in process chamber: 133 Pa to 2,666 Pa
O2 gas partial pressure: 33 Pa to 2,515 Pa
O2 gas supply flow rate: 1,000 sccm to 5,000 sccm
N2 gas supply flow rate: 300 sccm to 3,000 sccm
O2 gas supply time: 6 seconds to 60 seconds
Residual Gas Removal After the third layer is formed, the valve 243c is closed to suspend supply of the O2 gas. At this time, while the APC valve 244 is opened, the inside of the process chamber 201 is vacuum-exhausted by the vacuum pump 246. Any unreacted gas remaining in the process chamber 201, O2 gas that has contributed to formation of the third layer, or reaction by-products is removed from the inside of the process chamber. At this time, while the valves 243g through 243j are opened, supply of the N2 gas into the process chamber 201 continues. The N2 gas serves as a purge gas. Accordingly, it is possible to effectively remove the unreacted gas remaining in the process chamber 201, the O2 gas that has contributed to formation of the third layer, or the reaction by-products from the inside of the process chamber 201.

At this time, the gas remaining in the process chamber 201 may not be completely removed, and the inside of the process chamber 201 may not be completely purged. When an amount of the gas remaining in the process chamber 201 is small, there is no negative influence on step 1b performed thereafter. In this case, there is no need to set a flow rate of the N2 gas supplied into the process chamber 201 to be high. For example, when the same amount of the N2 gas as a volume of the reaction tube 203 [the process chamber 201] is supplied, it is possible to purge to the extent that there is no negative influence on step 1b. When the inside of the process chamber 201 is not completely purged, a purge time decreases, thereby improving throughput. Also, it is possible to suppress unnecessary consumption of the N2 gas to a minimum.

As the oxidizing gas (oxygen-containing gas), instead of the O2 gas, nitrous oxide (N2O) gas, nitric oxide (NO) gas, nitrogen dioxide (NO2) gas, ozone (O3) gas, hydrogen (H2) gas+oxygen (O2) gas, H2 gas+O3 gas, water vapor (H2O), carbon monoxide (CO) gas, carbon dioxide (CO2) gas, or the like may be used. As the inert gas, instead of the N2 gas, a rare gas such as Ar gas, He gas, Ne gas, or Xe gas may be used.

Performing a Predetermined Number of Times

When a cycle including the above-described steps 1b to 3b is performed at least once (a predetermined number of times), it is possible to form the SiOCN film, the SiON film, or the SiOC film having a predetermined composition and a predetermined film thickness on the wafer 200. It is preferable that the above-described cycle be performed a plurality of times. That is, the thickness of the SiOCN layer, the SiON layer, or the SiOC layer to be formed for a cycle is set to be lower than a desired film thickness, and the above-described cycle is preferably performed a plurality of times to obtain the desired film thickness.

Second Sequence

Figure 7:
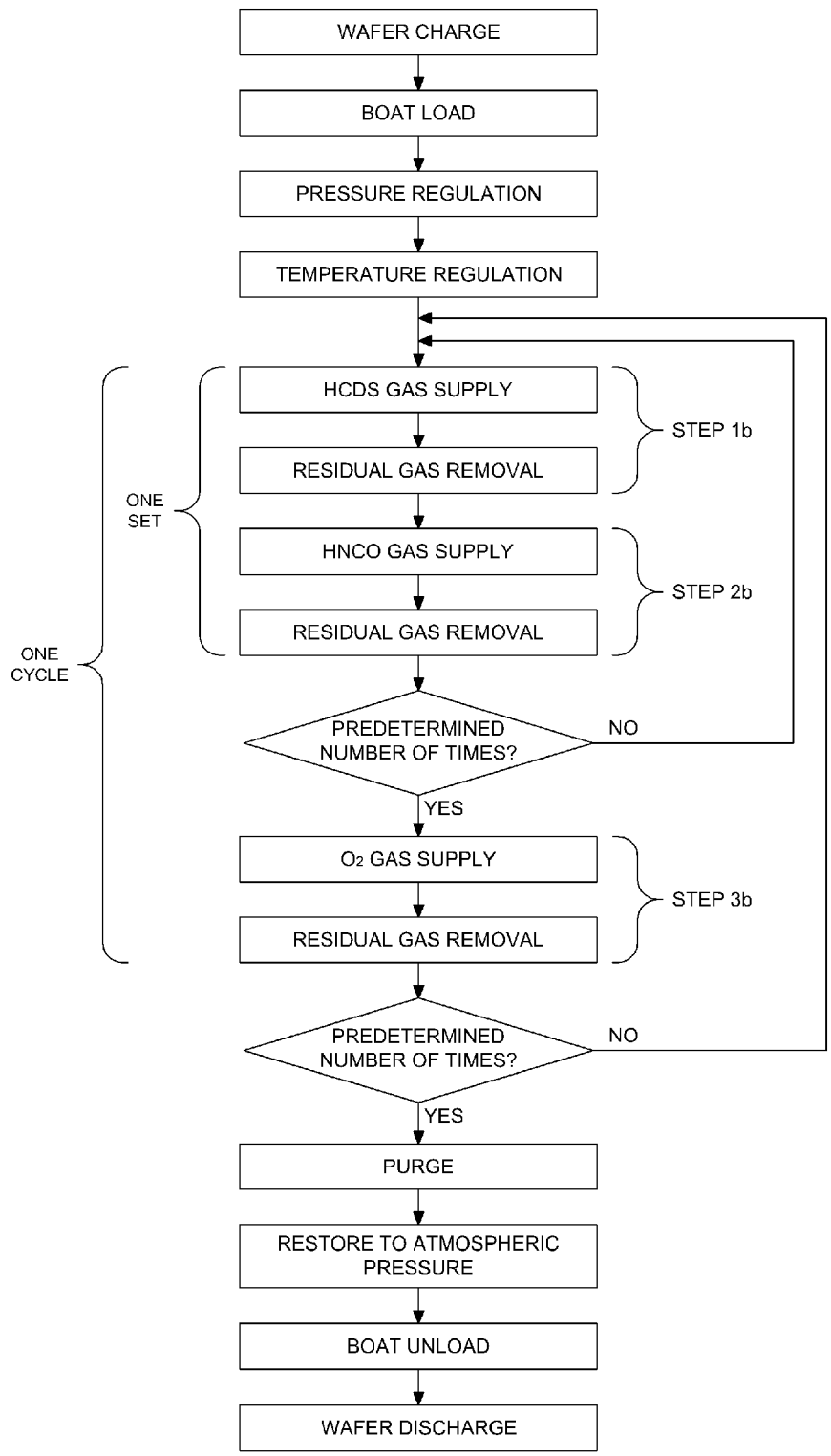
FIG. 7 is a diagram illustrating a film-forming flow in a second sequence of the second embodiment.

Next, the second sequence of this embodiment will be described with reference to FIGS. 7 and 8B.

In the second sequence of this embodiment, the SiOCN film, the SiON film, or the SiOC film may be formed on the wafer 200 by performing a cycle a predetermined number of times. The cycle includes a process of supplying the chlorosilane-based source gas (HCDS gas) to the wafer 200 as the source gas containing Si and a process of supplying the isocyanate-based gas (HNCO gas) to the wafer 200 as the reaction gas containing N, C and O, which are alternately performed a predetermined number of times, and a process of supplying the oxidizing gas (O2 gas) to the wafer 200.

Figure 8B:
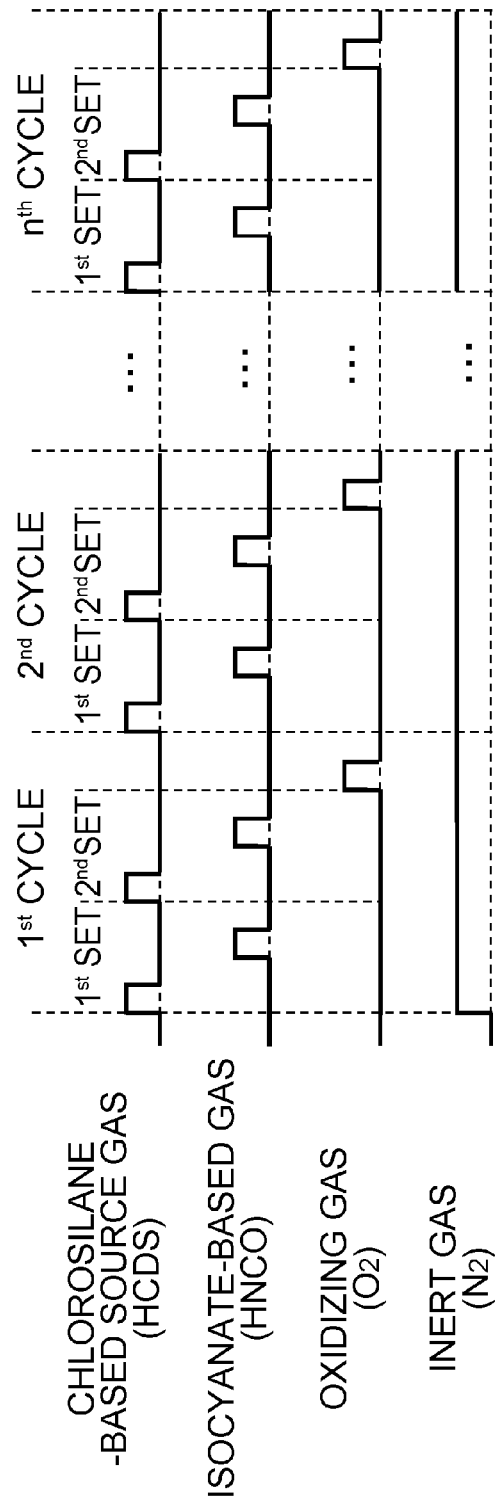
FIG. 8B is a diagram illustrating a gas supply timing in the second sequence of the second embodiment.

In an example illustrated in FIG. 8B, the above-described steps 1b and 2b are set as one set, this set is performed twice, and then step 3b is performed. These processes are set as a cycle. When this cycle is performed n times, the SiOCN film, the SiON film, or the SiOC film having a predetermined composition and a predetermined film thickness is formed on the wafer 200. A difference between this sequence and the first sequence is that the above-described steps 1b and 2b are set as one set, this set is repeated a plurality of times, and then step 3b is performed. Except this difference, the sequence is the same as the first sequence. Also, processing conditions in this sequence may be the same as those of the above-described first sequence.

Effects of this Embodiment

According to the film-forming sequence of this embodiment, the same effects as in the above-described first embodiment are obtained. In addition, according to the film-forming sequence of this embodiment, when step 3b in which supplying, for example, the O2 gas, to the wafer 200 as the oxidizing gas is performed, it is possible to form the SiOCN film having a greater O component and a lower C component or N component than the SiOCN film formed on the wafer 200 in the first embodiment. Also, according to the film-forming sequence of this embodiment, when the ratio of the C component or the N component is reduced to the impurity level, it is possible to form the SiON film or the SiOCN film which is unable to be formed in the film-forming sequence of the first embodiment. In addition, a composition ratio of the SiOCN film, the SiON film, or the SiOC film may be finely adjusted as described above. These effects may be obtained when the above-described oxygen-containing gas other than the O2 gas is used as the oxidizing gas.

Third Embodiment of the Present Invention

Next, the third embodiment of the present invention will be described.

In the above-described first embodiment, the example in which the SiOCN film is formed on the substrate by performing the cycle including steps 1a and 2a a predetermined number of times has been described. In this embodiment, an example in which the SiOCN film or the SiON film is formed on the substrate by performing a cycle a predetermined number of times will be described. The cycle further includes step 3c of supplying the nitriding gas to the substrate in addition to steps 1c and 2c which are comparable to the above-described steps 1a and 2a.

First Sequence

Figure 9:
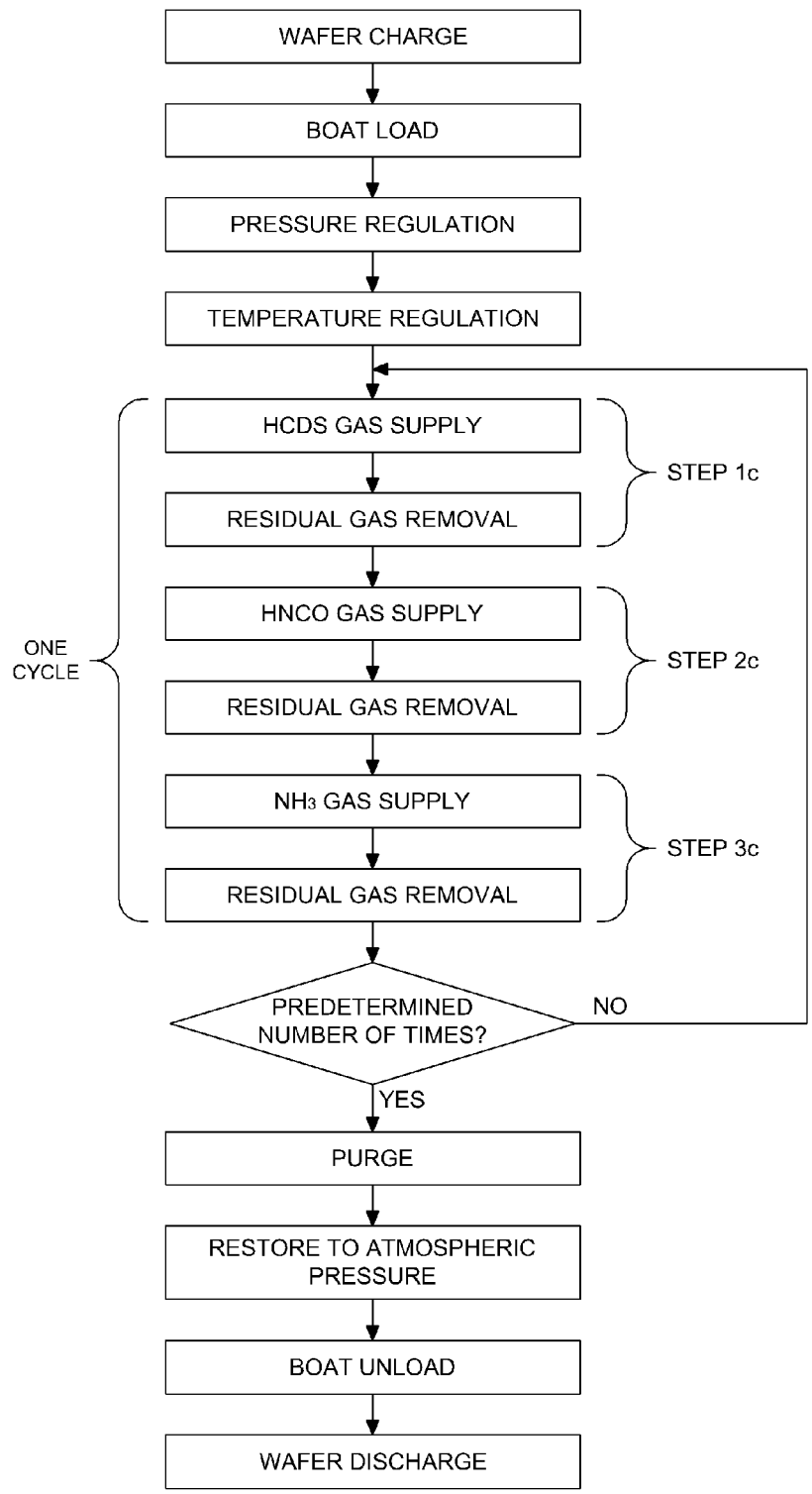
FIG. 9 is a diagram illustrating a film-forming flow in a first sequence of a third embodiment.

First, the first sequence of this embodiment will be described with reference to FIGS. 9, 10A, and 10B.

In the first sequence of this embodiment, the SiOCN film or the SiON film may be formed on the wafer 200 by performing a cycle a predetermined number of times. The cycle includes a process of supplying the chlorosilane-based source gas (HCDS gas) to the wafer 200 as the source gas containing Si, a process of supplying the isocyanate-based gas (HNCO gas) to the wafer 200 as the reaction gas containing N, C and O, and a process of supplying the nitriding gas (NH3 gas) to the wafer 200.

A difference between this sequence and the film-forming sequence of the first embodiment is that step 3c is further included in addition to steps 1c and 2c which are comparable to steps 1a and 2a. Except this difference, the sequence is the same as the film-forming sequence of the first embodiment. Hereinafter, step 3c of this embodiment will be described.

Step 3c: NH3 Gas Supply

After step 2c is completed and the residual gas in the process chamber 201 is removed, the valve 243e is opened to flow the NH3 gas into the gas supply pipe 232e. A flow rate of the NH3 gas is regulated by the MFC 241e. The NH3 gas flows through the gas supply pipe 232c and is supplied into the buffer chamber 237 from the gas supply hole 250c. At this time, when high frequency power is not applied between the rod-shaped electrodes 269 and 270, the NH3 gas supplied into the buffer chamber 237 is activated by heat, is supplied into the process chamber 201 from the gas supply hole 250e, and is exhausted through the exhaust pipe 231 [refer to FIG. 10A]. In addition, at this time, when high frequency power is applied between the rod-shaped electrodes 269 and 270 from the high frequency power source 273 through the matching unit 272, the NH3 gas supplied into the buffer chamber 237 is excited to plasma, is supplied into the process chamber 201 from the gas supply hole 250e as an active species, and is exhausted through the exhaust pipe 231 [refer to FIG. 10B]. At this time, the NH3 gas that is activated by heat or to the plasma is supplied to the wafer 200. At the same time, the valve 243i is opened to flow the N2 gas into the gas supply pipe 232i. The N2 gas is supplied into the process chamber 201 together with the NH3 gas and is exhausted through the exhaust pipe 231.

At this time, in order to prevent the NH3 gas from being introduced into the nozzles 249a, 249b and 249d, the valves 243g, 243h and 243j are opened to flow the N2 gas into the gas supply pipes 232g, 232h and 232j. The N2 gas is supplied into the process chamber 201 through the gas supply pipes 232a, 232b and 232d and the nozzles 249a, 249b and 249d and is exhausted through the exhaust pipe 231.

When the NH3 gas is not excited to the plasma state but is thermally activated to flow, by appropriately adjusting the APC valve 244, the pressure in the process chamber 201 is set to, for example, a range of 1 Pa to 3,000 Pa. When the pressure in the process chamber 201 is set to a relatively high pressure in this way, it is possible to thermally activate the NH3 gas to a non-plasma state. When the NH3 gas is activated by heat and then supplied, since a relatively soft reaction may be caused, nitridation to be described later may be softly performed. A partial pressure of the NH3 gas in the process chamber 201 is set to, for example, a range of 0.01 Pa to 2,970 Pa. A supply flow rate of the NH3 gas controlled by the MFC 241e is set to a flow rate within, for example, a range of 100 sccm to 10,000 sccm. A supply flow rate of the N2 gas controlled by the MFCs 241g through 241j is set to a flow rate within, for example, a range of 100 sccm to 10,000 sccm. A time for which the NH3 gas activated by heat is supplied to the wafer 200, that is, a gas supply time (radiation time), is set to a time, for example, in a range of 1 to 120 seconds, and preferably, 1 to 60 seconds. Similar to steps 1c and 2c, the temperature of the heater 207 at this time is set such that the temperature of the wafer 200 falls within, for example, 250° C. to 700° C., preferably 300° C. to 650° C., and more preferably, 350° C. to 600° C.

When the NH3 gas is excited to plasma and flows as an active species, by appropriately adjusting the APC valve 244, the pressure in the process chamber 201 is set to, for example, a range of 1 Pa to 100 Pa. A partial pressure of the NH3 gas in the process chamber 201 is set to, for example, a range of 0.01 Pa to 100 Pa. A supply flow rate of the NH3 gas controlled by the MFC 241e is set to a flow rate within, for example, a range of 100 sccm to 10,000 sccm. A supply flow rate of the N2 gas controlled by the MFCs 241g through 241j is set to a flow rate within, for example, a range of 100 sccm to 10,000 sccm. A time for which the active species obtained by exciting the NH3 gas to the plasma is supplied to the wafer 200, that is, a gas supply time (radiation time), is set to a time, for example, in a range of 1 to 120 seconds, and preferably, 1 to 60 seconds. Similar to steps 1c and 2c, the temperature of the heater 207 at this time is set such that the temperature of the wafer 200 falls within, for example, a range of 250° C. to 700° C., preferably 300° C. to 650° C., and more preferably, 350° C. to 600° C. The high frequency power applied between the rod-shaped electrodes 269 and 270 from the high frequency power source 273 is set to power, for example, in a range of 50 W to 1,000 W.

In this case, the gas flowing into the process chamber 201 is the NH3 gas that is thermally activated by increasing the pressure in the process chamber 201 or an active species obtained by exciting the NH3 gas to the plasma state. The HCDS gas and the HNCO gas do not flow into the process chamber 201. Therefore, the NH3 gas does not cause a gas-phase reaction, and the NH3 gas that is activated or is converted into the active species reacts with at least a part of the second layer formed on the wafer 200 in step 2c. Therefore, the second layer is nitrided and is modified to a third layer (SiOCN layer) containing Si, O, C and N or a third layer (SiON layer) containing Si, O and N. The third layer has a thickness of, for example, about less than one atomic layer to several atomic layers.

In the process of forming the third layer, when the second layer is nitrided by the nitriding gas, the second layer is modified. That is, by nitridation of the second layer, N is further supplied to the second layer. In addition, by nitridation of the second layer, at least some of C included in the second layer is separated (extracted) from the second layer. That is, the N concentration of the third layer is greater than the N concentration of the second layer, and the C concentration of the third layer is lower than the C concentration of the second layer.

Figure 10A:
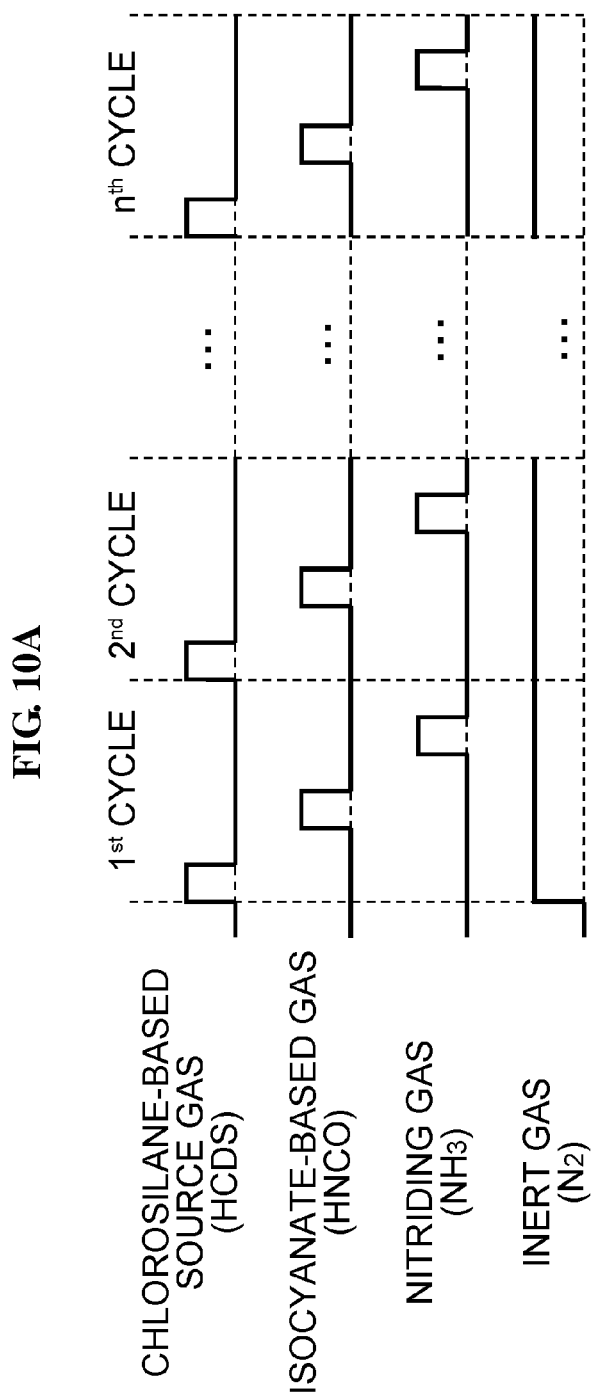
FIG. 10A is a diagram illustrating a gas supply and plasma power supply timing in the first sequence of the third embodiment involving an exemplary sequence of forming a film in a non-plasma state.

As illustrated in FIG. 10A, when the NH3 gas is activated by heat and then flows into the process chamber 201, the second layer may be thermally nitrided and modified (changed) to the third layer. At this time, while the ratio of the N component in the second layer increases, and when at least some of the C component is desorbed (extracted) from the second layer due to energy of the activated NH3 gas, the second layer is modified to the third layer. At this time, due to an effect of thermal nitridation by the NH3 gas, Si—N bonds in the second layer increase, whereas Si—C bonds, Si—O bonds and Si—Si bonds decrease, and ratios of the C component, the O component and the Si component in the second layer decrease. In particular, most of the C component may be desorbed and reduced to an impurity level. For example, when the modification is performed such that the ratio of the C component in the second layer is reduced to the impurity level, the second layer may be changed to the SiON layer. Also, for example, when the modification is stopped before the ratio of the C component in the second layer is reduced to the impurity level, the second layer may be changed to the SiOCN layer having a lower ratio of the C component than the second layer. That is, while a composition ratio is changed such that the N concentration increases and the C concentration, the O concentration and the Si concentration decrease, the second layer may be modified to the third layer. Also, at this time, by controlling processing conditions such as the pressure in the process chamber 201 or the gas supply time, it is possible to finely adjust the ratio of the N component in the third layer, that is, the N concentration. As a result, it is possible to control the composition ratio of the third layer more precisely.

Also, as illustrated in FIG. 10B, when the active species obtained by exciting the NH3 gas to the plasma state flows into the process chamber 201, the second layer may be plasma-nitrided and modified (changed) to the third layer. At this time, while the ratio of the N component in the second layer increases, and when at least some of the C component is desorbed (extracted) from the second layer due to energy of the active species, the second layer is modified (changed) to the third layer. At this time, due to an effect of plasma nitridation by the NH3 gas, Si—N bonds in the second layer increase, whereas Si—C bonds, Si—O bonds and Si—Si bonds decrease, and ratios of the C component, the O component and the Si component in the second layer decrease. In particular, most of the C component may be desorbed to be reduced to an impurity level or may be substantially eliminated. For example, when a modification is performed such that the ratio of the C component in the second layer is reduced to the impurity level or is substantially eliminated, the second layer may be changed to the SiON layer. Also, for example, when the modification is stopped before the ratio of the C component in the second layer is reduced to the impurity level, the second layer may be changed to the SiOCN layer having a lower ratio of the C component than the second layer. That is, while a composition ratio is changed such that the N concentration increases and the C concentration, the O concentration and the Si concentration decrease, the second layer may be modified to the third layer. Also, at this time, by controlling processing conditions such as the pressure in the process chamber 201 or the gas supply time, it is possible to finely adjust the ratio of the N component in the third layer, that is, the N concentration. As a result, it is possible to control the composition ratio of the third layer more precisely.

At this time, a nitriding reaction of the second layer is preferably unsaturated. For example, when the second layer having a thickness of less than one atomic layer to several atomic layers is formed in steps 1c and 2c, a part of the second layer may be preferably nitrided. In this case, in order to prevent the entire second layer having a thickness of less than one atomic layer to several atomic layers from being nitrided, nitridation is performed under conditions in which the nitriding reaction of the second layer is unsaturated.

In order to cause the unsaturated nitriding reaction of the second layer, processing conditions in step 3c may be set as the above-described processing conditions. In addition, when the processing conditions in step 3c are set as the following processing conditions, it is easy to cause the unsaturated nitriding reaction of the second layer.

When NH3 Gas is Activated by Heat and Flow
Wafer temperature: 500° C. to 650° C.
Pressure in process chamber: 133 Pa to 2,666 Pa
NH3 gas partial pressure: 33 Pa to 2,515 Pa
NH3 gas supply flow rate: 1,000 sccm to 5,000 sccm
N2 gas supply flow rate: 300 sccm to 3,000 sccm
NH3 gas supply time: 6 seconds to 60 seconds
When NH3 Gas is Activated to Plasma and Flow
Wafer temperature: 500° C. to 650° C.
Pressure in process chamber: 33 Pa to 80 Pa
NH3 gas partial pressure: 17 Pa to 75 Pa
NH3 gas supply flow rate: 1,000 sccm to 5,000 sccm
N2 gas supply flow rate: 300 sccm to 1,000 sccm
NH3 gas supply time: 6 seconds to 60 seconds
Residual Gas Removal After the third layer is formed, the valve 243e is closed to suspend supply of the NH3 gas. In this case, while the APC valve 244 is opened, the inside of the process chamber 201 is vacuum-exhausted by the vacuum pump 246. Any unreacted gas remaining in the process chamber 201, NH3 gas that has contributed to formation of the third layer, or reaction by-products is removed from the inside of the process chamber 201. At this time, while the valves 243g through 243j are opened, supply of the N2 gas into the process chamber 201 continues. The N2 gas serves as a purge gas. Accordingly, it is possible to effectively remove the unreacted gas remaining in the process chamber 201, the NH3 gas that has contributed to formation of the third layer, or the reaction by-products from the inside of the process chamber 201.

At this time, the gas remaining in the process chamber 201 may not be completely removed, and the inside of the process chamber 201 may not be completely purged. When an amount of the gas remaining in the process chamber 201 is small, there is no negative influence on step 1c performed thereafter. In this case, there is no need to set a flow rate of the N2 gas supplied into the process chamber 201 to be high. For example, when the same amount of the N2 gas as a volume of the reaction tube 203 [the process chamber 201] is supplied, it is possible to purge to the extent that there is no negative influence on step 1c. When the inside of the process chamber 201 is not completely purged, a purge time decreases, thereby improving throughput. Also, it is possible to suppress unnecessary consumption of the N2 gas to a minimum.

As the nitriding gas (nitrogen-containing gas), instead of the NH3 gas, diazene (N2H2) gas, hydrazine (N2H4) gas, N3H8 gas, or gas containing compounds thereof may be used. As the inert gas, instead of the N2 gas, a rare gas such as Ar gas, He gas, Ne gas, or Xe gas may be used.

Performing a Predetermined Number of Times

When a cycle including the above-described steps 1c to 3c is performed at least once (a predetermined number of times), it is possible to form the SiOCN film or the SiON film having a predetermined composition and a predetermined film thickness on the wafer 200. It is preferable that the above-described cycle be performed a plurality of times. That is, the thickness of the SiOCN layer or the SiON layer to be formed for a cycle is set to be lower than a desired film thickness, and the above-described cycle is preferably performed a plurality of times to obtain the desired film thickness.

Second Sequence

Figure 11:
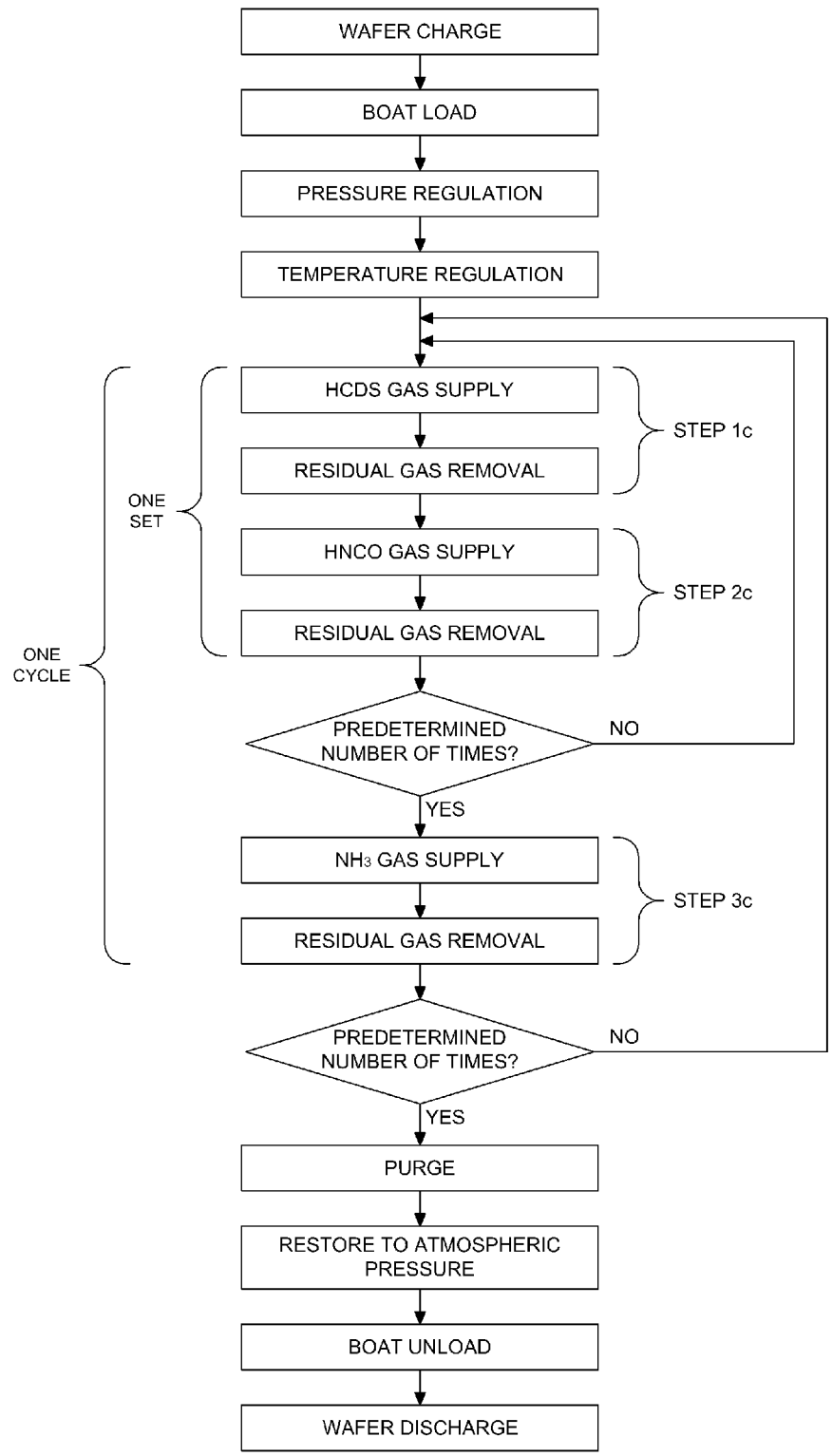
FIG. 11 is a diagram illustrating a film-forming flow in a second sequence of the third embodiment.

Next, the second sequence of this embodiment will be described with reference to FIGS. 11 and 12.

In the second sequence of this embodiment, the SiOCN film or the SiON film may be formed on the wafer 200 by performing a cycle a predetermined number of times. The cycle includes a process of supplying the chlorosilane-based source gas (HCDS gas) to the wafer 200 as the source gas containing Si and a process of supplying the isocyanate-based gas (HNCO gas) to the wafer 200 as the reaction gas containing N, C and O, which are alternately performed a predetermined number of times, and a process of supplying the nitriding gas (NH3 gas) to the wafer 200.

Figure 12B:
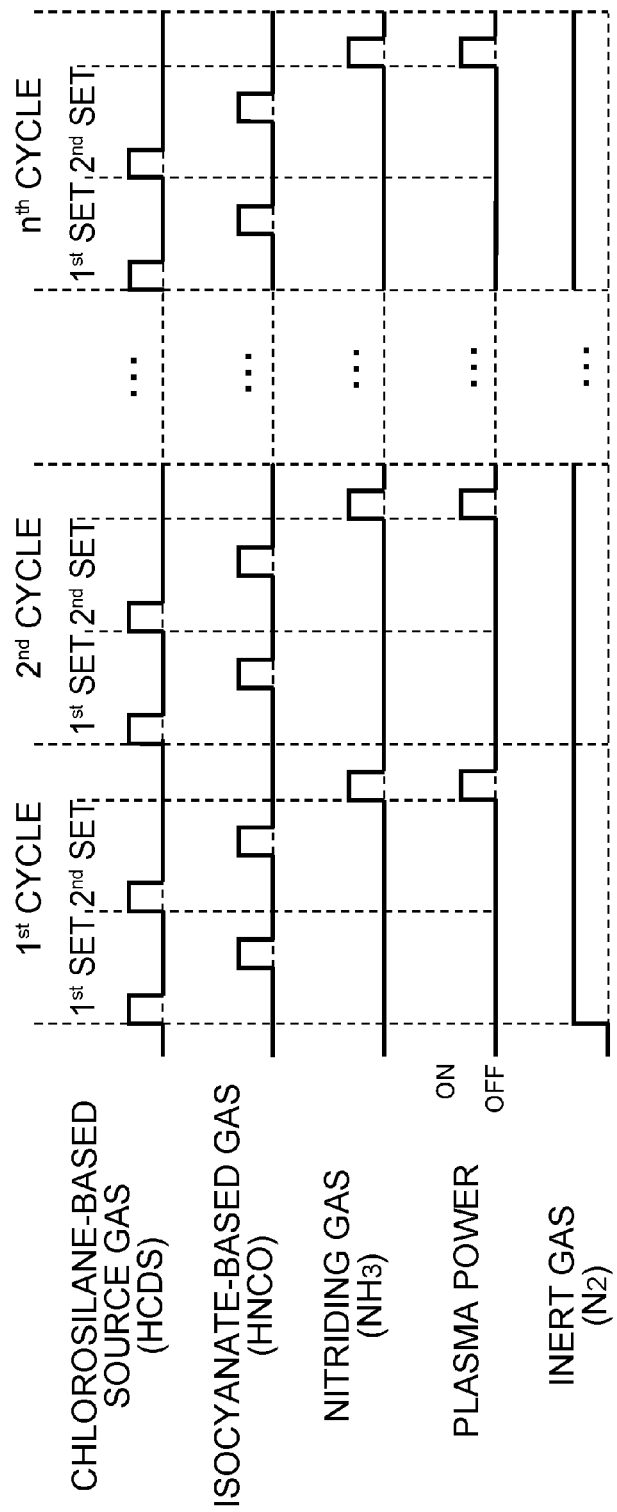
FIG. 12B is a diagram illustrating a gas supply and plasma power supply timing in the second sequence of the third embodiment involving an exemplary sequence of forming a film using plasma.

In an example illustrated in FIGS. 12A and 12B, the above-described steps 1c and 2c are set as one set, this set is performed twice, and then step 3c is performed. These processes are set as a cycle. When this cycle is performed n times, the SiOCN film or the SiON film having a predetermined composition and a predetermined film thickness is formed on the wafer 200. A difference between this sequence and the first sequence is that the above-described steps 1c and 2c are set as one set, this set is repeated a plurality of times, and then step 3c is performed. Except this difference, the sequence is the same as the first sequence. Also, processing conditions in this sequence may be the same as those of the above-described first sequence.

Effects of this Embodiment

According to the film-forming sequence of this embodiment, the same effects as in the above-described first embodiment are obtained. In addition, according to the film-forming sequence of this embodiment, when step 3c in which supplying, for example, the NH3 gas, to the wafer 200 as the reaction gas is performed, it is possible to form the SiOCN film having a greater N component and a lower C component than the SiOCN film formed on the wafer 200 in the first embodiment. Also, according to the film-forming sequence of this embodiment, when the ratio of the C component is reduced or is substantially eliminated, it is possible to form the SiON film which is unable to be formed in the film-forming sequence of the first embodiment. In addition, it is possible to finely adjust the composition ratio of the SiOCN film or the SiON film as described above. These effects may be obtained when the above-described nitrogen-containing gas other than the NH3 gas is used as the nitriding gas.

Fourth Embodiment of the Present Invention

Next, the fourth embodiment of the present invention will be described.

In the above-described first embodiment, the example in which the cycle including steps 1a and 2a is performed a predetermined number of times to form the SiOCN film on the substrate has been described. This embodiment will describe an example in which the SiOCN film is formed on the substrate by performing a cycle a predetermined number of times. The cycle includes steps 1d and 3d, which are comparable to the above-described steps 1a and 2a and step 2d, of supplying the carbon-containing gas to the substrate, interposed therebetween.

Figure 13:
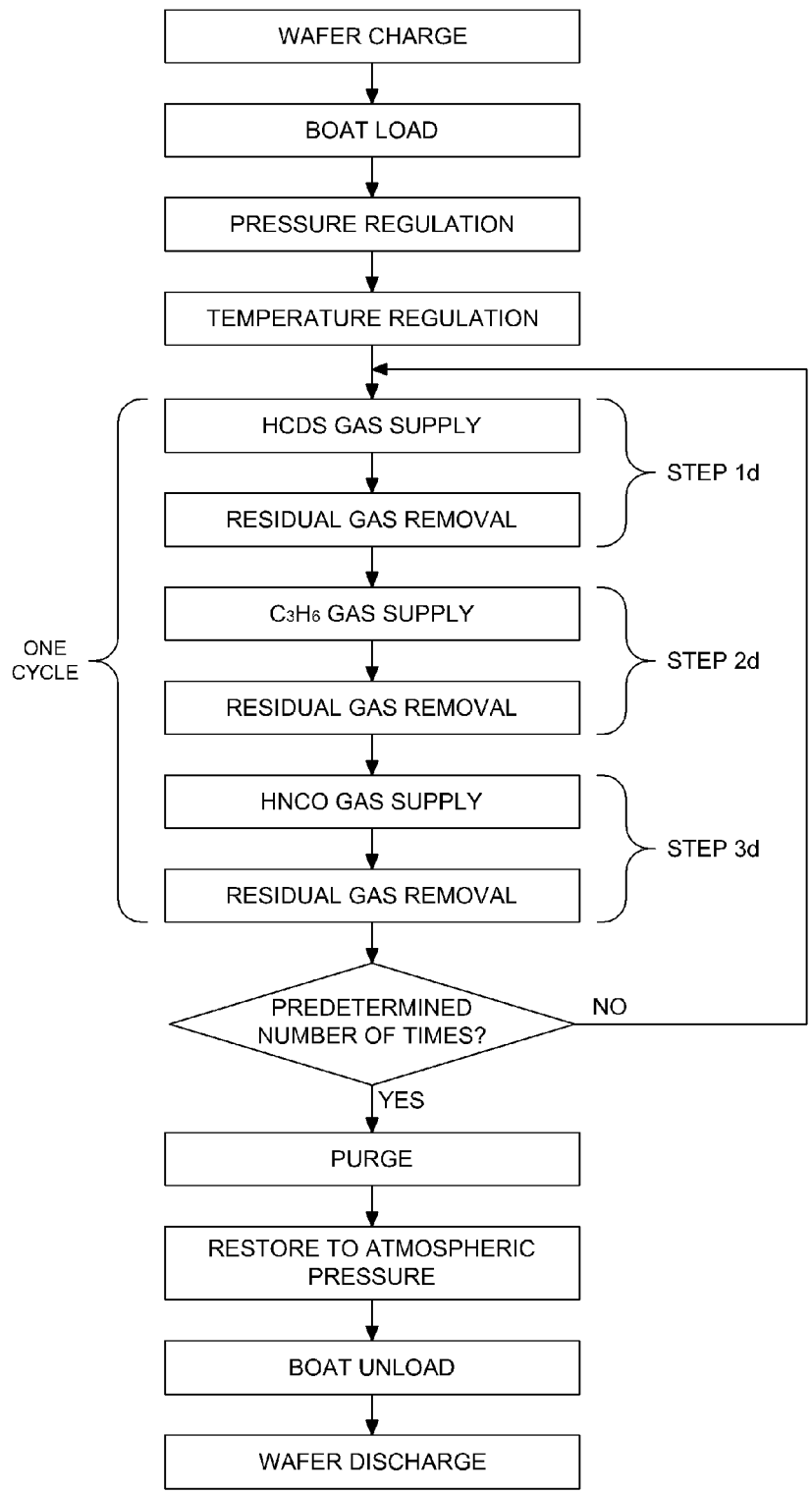
FIG. 13 is a diagram illustrating a film-forming flow in a film-forming sequence of a fourth embodiment.

Hereinafter, a film-forming sequence of this embodiment will be described with reference to FIGS. 13 and 14A.

In the film-forming sequence of this embodiment, the SiOCN film is formed on the wafer 200 by performing a cycle a predetermined number of times. The cycle includes a process of supplying the chlorosilane-based source gas (HCDS gas) to the wafer 200 as the source gas containing Si, a process of supplying the carbon-containing gas (C3H6 gas) to the wafer, and a process of supplying the isocyanate-based gas (HNCO gas) to the wafer 200 as the reaction gas containing N, C and O.

A difference between this sequence and the film-forming sequence of the first embodiment is that step 2d is performed between steps 1d and 3d which are comparable to steps 1a and 2a, and in step 3d comparable to step 2a, by reacting a layer in which a carbon-containing layer is formed on the first layer with the HNCO gas, the layer in which the carbon-containing layer is formed on the first layer is modified. Except these differences, the sequence is the same as the film-forming sequence of the first embodiment. Hereinafter, steps 2d and 3d of this embodiment will be described.

Step 2d: C3H6 Gas Supply

After step 1d is completed and the residual gas in the process chamber 201 is removed, the valve 243d is opened to flow the C3H6 gas into the gas supply pipe 232d. A flow rate of the C3H6 gas is regulated by the MFC 241d. The C3H6 gas is supplied into the process chamber 201 from the gas supply hole 250d. The C3H6 gas supplied into the process chamber 201 is activated by heat and is exhausted through the exhaust pipe 231. At this time, the C3H6 gas activated by heat is supplied to the wafer 200. At the same time, the valve 243j is opened to flow the N2 gas into the gas supply pipe 232j. The N2 gas is supplied into the process chamber 201 together with the C3H6 gas and is exhausted through the exhaust pipe 231.

At this time, in order to prevent the C3H6 gas from being introduced into the nozzles 249a through 249c and the buffer chamber 237, the valves 243g through 243i are opened to flow the N2 gas into the gas supply pipes 232g through 232i. The N2 gas is supplied into the process chamber 201 through the gas supply pipes 232a through 232c, the nozzles 249a through 249c and the buffer chamber 237 and is exhausted through the exhaust pipe 231.

At this time, by appropriately adjusting the APC valve 244, the pressure in the process chamber 201 is set to, for example, a range of 1 Pa to 6,000 Pa. A supply flow rate of the C3H6 gas controlled by the MFC 241d is set to a flow rate within, for example, a range of 100 sccm to 10,000 sccm. A supply flow rate of the N2 gas controlled by the MFCs 241g through 241j is set to a flow rate within, for example, a range of 100 sccm to 10,000 sccm. At this time, a partial pressure of the C3H6 gas in the process chamber 201 is set to, for example, a range of 0.01 Pa to 5,941 Pa. A time for which the C3H6 gas is supplied to the wafer 200, that is, a gas supply time (radiation time), is set to a time, for example, in a range of 1 to 200 seconds, preferably 1 to 120 seconds, and more preferably, 1 to 60 seconds. Similar to step 1d, the temperature of the heater 207 at this time is set such that the temperature of the wafer 200 falls within, for example, a range of 250° C. to 700° C., preferably 300° C. to 650° C., and more preferably, 350° C. to 600° C. When the C3H6 gas is activated by heat and then supplied, since a soft reaction may be caused, it is easy to form the carbon-containing layer to be described later.

In this case, the gas flowing into the process chamber 201 is the C3H6 gas that is thermally activated. The HCDS gas does not flow into the process chamber 201. Therefore, the C3H6 gas does not cause a gas-phase reaction, and is supplied to the wafer 200 in an activated state. At this time, on the first layer formed on the wafer 200 in step 1d, the carbon-containing layer having a thickness less than one atomic layer, that is, the discontinuous carbon-containing layer, is formed. Therefore, a layer containing Si, Cl and C, that is, a layer in which the carbon-containing layer is formed, is formed on the first layer (hereinafter referred to as a first layer having a carbon-containing layer formed thereon). However, depending on conditions, a part of the first layer and the C3H6 gas react, the first layer is modified (carbonized), and a silicon carbide layer (SiC layer containing Cl) containing Cl is formed as a layer containing Si, Cl and C.

The carbon-containing layer formed on the first layer may include a C layer and a chemical adsorption layer of the carbon-containing gas (C3H6 gas), that is, a chemical adsorption layer of a substance (CxHy) in which C3H6 is decomposed. Here, the C layer needs to be a discontinuous layer made of C. Also, the chemical adsorption layer of CxHy needs to be a chemical adsorption layer in which CxHy molecules are discontinuous. When the carbon-containing layer formed on the first layer is a continuous layer, for example, when an adsorption state of CxHy on the first layer is set as a saturated state and a chemical adsorption layer in which CxHy is continuous is formed on the first layer, an entire surface of the first layer is covered by the chemical adsorption layer of CxHy. In this case, there are no Si and Cl on a surface of the first layer having the carbon-containing layer formed thereon. As a result, a modification reaction of the first layer having the carbon-containing layer formed thereon may be difficult in the following step 3d.

This is because the reaction gas containing N, C and O (HNCO gas) reacts with Si or Cl, but is difficult to react with C under the above-described processing conditions. In order to generate a desired modification reaction in the following step 3d, Si and Cl need to be exposed to the surface of the first layer having the carbon-containing layer formed thereon by setting the adsorption state of CxHy onto the first layer as an unsaturated state.

In order to set the adsorption state of CxHy onto the first layer as the unsaturated state, processing conditions in step 2d may be set as the above-described processing conditions. In addition, when the processing conditions in step 2d are set as the following processing conditions, it is easy to set the adsorption state of CxHy onto the first layer as the unsaturated state.

Wafer temperature: 500° C. to 650° C.
Pressure in process chamber: 133 Pa to 5,332 Pa
C3H6 gas partial pressure: 33 Pa to 5,177 Pa
C3H6 gas supply flow rate: 1,000 sccm to 10,000 sccm
N2 gas supply flow rate: 300 sccm to 3,000 sccm
C3H6 gas supply time: 6 seconds to 200 seconds
Residual Gas Removal After the carbon-containing layer is formed on the first layer, the valve 243d is closed to suspend supply of the C3H6 gas. At this time, while the APC valve 244 is opened, the inside of the process chamber 201 is vacuum-exhausted by the vacuum pump 246, and any unreacted gas remaining in the process chamber 201, C3H6 gas that has contributed to formation of the carbon-containing layer, or reaction by-products is removed from the inside of the process chamber 201. At this time, while the valves 243g through 243j are opened, supply of the N2 gas serving as the inert gas into the process chamber 201 continues. The N2 gas serves as a purge gas. Accordingly, it is possible to effectively remove the unreacted gas remaining in the process chamber 201, the C3H6 gas that has contributed to formation of the carbon-containing layer, or the reaction by-products from the inside of the process chamber 201.

At this time, the gas remaining in the process chamber 201 may not be completely removed, and the inside of the process chamber 201 may not be completely purged. When an amount of the gas remaining in the process chamber 201 is small, there is no negative influence on step 3d performed thereafter. In this case, there is no need to set a flow rate of the N2 gas supplied into the process chamber 201 to be high. For example, when the same amount of the N2 gas as a volume of the reaction tube 203 [the process chamber 201] is supplied, it is possible to purge to the extent that there is no negative influence on step 3d. When the inside of the process chamber 201 is not completely purged, a purge time decreases, thereby improving throughput. Also, it is possible to suppress unnecessary consumption of the N2 gas to a minimum.

As the carbon-containing gas, instead of the C3H6 gas, the hydrocarbon-based gas such as acetylene (C2H2) gas or ethylene (C2H4) gas may be used. The carbon-containing gas functions as a carbon source. When the hydrocarbon-based gas having no N is used as the carbon-containing gas, it is easy to control such that an increase of the N component in the SiOCN film is suppressed and the ratio of the C component increases.

Step 3d: HNCO gas supply

After step 2d is completed and the residual gas in the process chamber 201 is removed, step 3d of supplying the HNCO gas to the wafer 200 in the process chamber 201 is performed. Step 3d is comparable to step 2a of the first embodiment.

Under the same sequence and conditions as in step 2a, when the HNCO gas is supplied to the wafer 200, the first layer having the carbon-containing layer formed thereon that is formed on the wafer 200 in step 2d reacts with the HNCO gas. That is, it is possible to react a halogen group (Cl) in an exposed surface of the first layer having the carbon-containing layer formed thereon with a ligand (H) included in the HNCO. The reaction generated at this time is comparable to the reaction between the first layer and the HNCO gas in step 2a of the first embodiment.

According to these reactions in series, the first layer having the carbon-containing layer formed thereon is changed (modified) to the second layer containing Si, O, C and N, that is, the SiOCN layer. The second layer has a thickness of, for example, about less than one atomic layer to several atomic layers. Newly adding the N component, the C component, and the O component included in the HNCO to the first layer having the carbon-containing layer formed thereon is the same as in step 2a of the first embodiment. In addition, similar to step 2a of the first embodiment, the second layer becomes a layer that has a low concentration of an impurity such as Cl.3.

Residual Gas Removal

Then, according to the same sequence and conditions as in step 2a of the first embodiment, any unreacted gas remaining in the process chamber 201, HNCO gas that has contributed to the reaction, or reaction by-products is removed from the inside of the process chamber 201. At this time, similar to step 2a of the first embodiment, the gas remaining in the process chamber 201 may not be completely removed, and the inside of the process chamber 201 may not be completely purged.

Performing a Predetermined Number of Times

When a cycle including the above-described steps 1d to 3d is performed at least once (a predetermined number of times), it is possible to form the SiOCN film having a predetermined composition and a predetermined film thickness on the wafer 200. It is preferable that the above-described cycle be performed a plurality of times. That is, the thickness of the SiOCN layer to be formed for a cycle is set to be lower than a desired film thickness, and the above-described cycle is preferably performed a plurality of times to obtain the desired film thickness.

Effects of this Embodiment

According to the film-forming sequence of this embodiment, the same effects as in the above-described first embodiment are obtained. In addition, according to the film-forming sequence of this embodiment, after step 1d is performed and the first layer is formed on the wafer 200, step 2d in which supplying, for example, the C3H6 gas, to the wafer 200, as the carbon-containing gas, and step 3d in which supplying, for example, the HNCO gas that is the isocyanate-based gas, to the wafer 200, as the reaction gas containing N, C and O, are performed. That is, the film is formed using two types of carbon sources (double carbon source) for a cycle. Accordingly, it is possible to newly add not only the C component included in the HNCO gas but also the C component included in the C3H6 gas to the SiOCN film. That is, it is possible to increase the C concentration in the SiOCN film, compared to when the film is formed using one type of the carbon source (single carbon source) for a cycle. These effects may be obtained when the above-described carbon-containing gas other than the C3H6 gas is used as the carbon-containing gas.

Modification

Figure 14A:
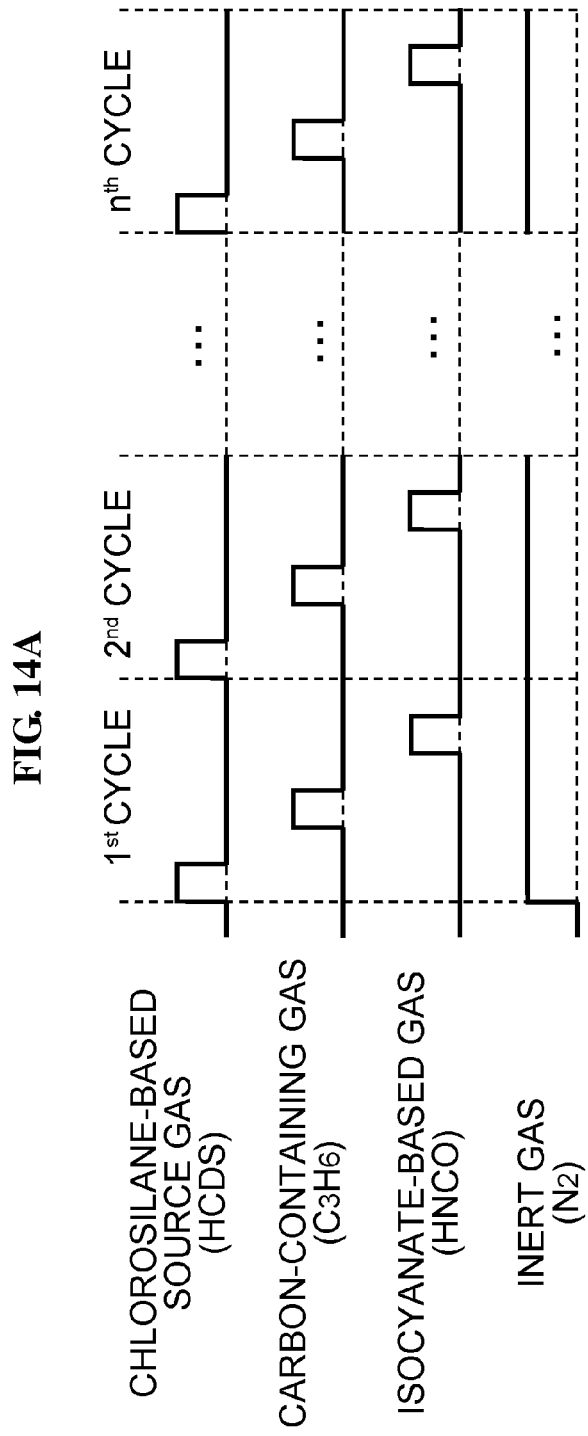
FIG. 14A is a diagram illustrating a gas supply timing in the film-forming sequence of the fourth embodiment.
Figure 14B:
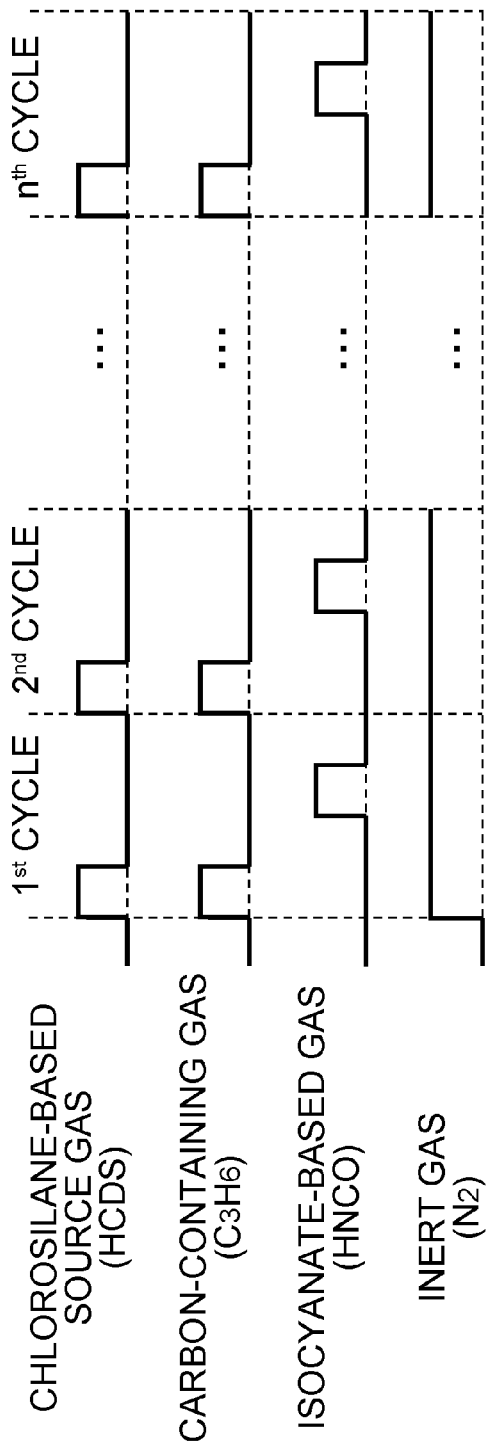

In the film-forming sequence illustrated in FIG. 14A, the example in which the process of supplying the C3H6 gas is performed between the process of supplying the HCDS gas and the process of supplying the HNCO gas has been described. However, this embodiment is not limited thereto. For example, as illustrated in FIG. 14B, the process of supplying the C3H6 gas may be performed with the process of supplying the HCDS gas. In addition, for example, as illustrated in FIG. 14C, the process of supplying the C3H6 gas may be performed with the process of supplying the HNCO gas. That is, the C3H6 gas may be supplied during a supply stop period of the HCDS gas or the HNCO gas and the C3H6 gas may be supplied during a supply period of the HCDS gas or the HNCO gas. However, when the process of supplying the C3H6 gas is performed with the process of supplying the HNCO gas rather than with the process of supplying the HCDS gas, since it is possible to avoid the gas-phase reaction of the HCDS gas and the C3H6 gas in the process chamber 201, that is, it is possible to prevent particles from being generated in the process chamber 201, it is preferable.

Fifth Embodiment of the Present Invention

Next, the fifth embodiment of the present invention will be described.

In the above-described first embodiment, the example in which the SiOCN film is formed on the substrate by performing the cycle including steps 1a and 2a a predetermined number of times has been described. In this embodiment, an example in which the SiOCN film is formed on the substrate by performing a cycle a predetermined number of times will be described. The cycle further includes step 3e in which supplying an amine-based gas to the substrate as the gas containing N and C in addition to steps 1e and 2e which are comparable to the above-described steps 1a and 2a.

First Sequence

Figure 15:
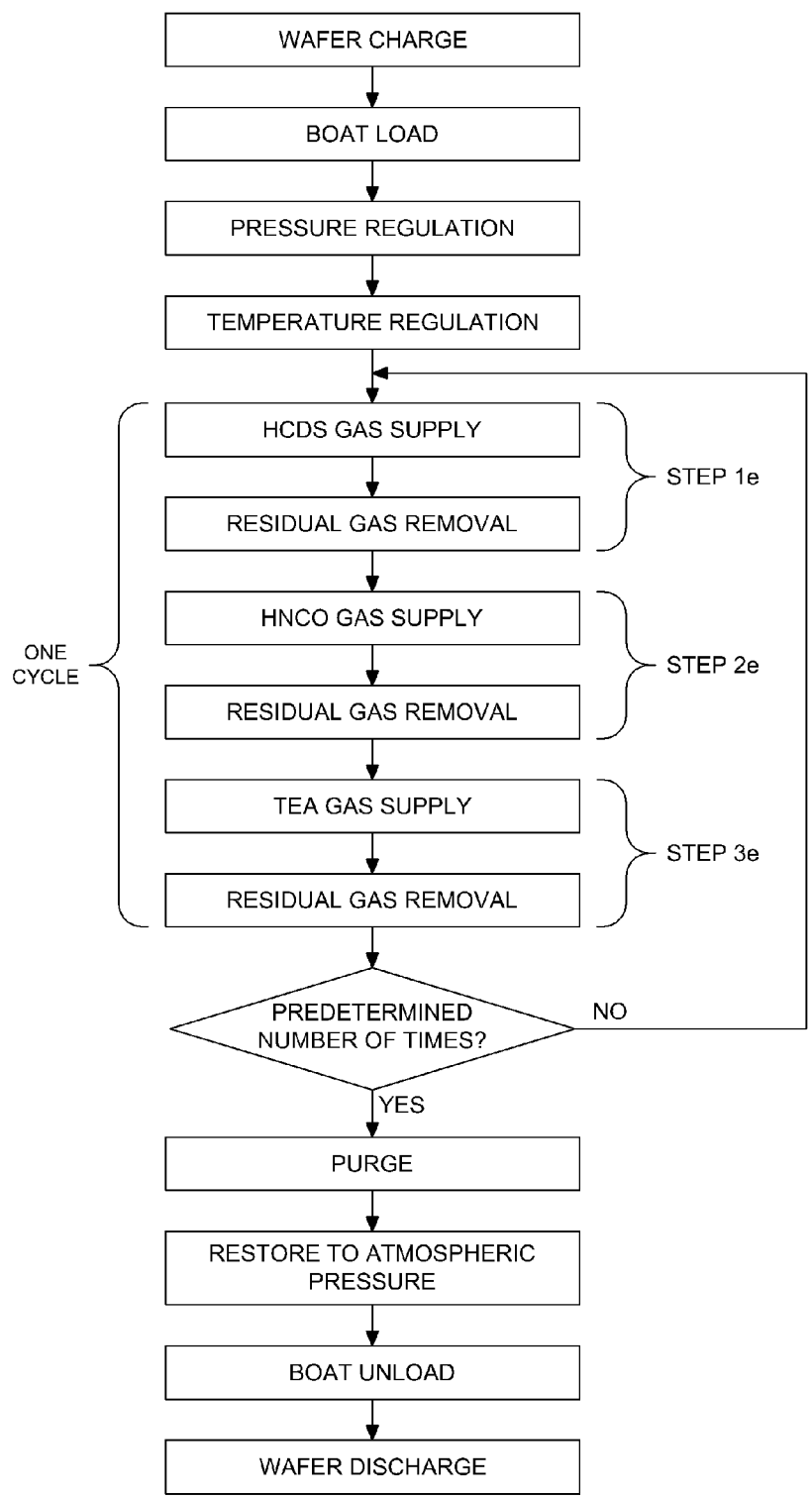
FIG. 15 is a diagram illustrating a film-forming flow in a first sequence of a fifth embodiment.

First, the first sequence of this embodiment will be described with reference to FIGS. 15 and 16A.

In the first sequence of this embodiment, the SiOCN film is formed on the wafer 200 by performing a cycle a predetermined number of times. The cycle includes a process of supplying the chlorosilane-based source gas (HCDS gas) to the wafer 200 as the source gas containing Si, a process of supplying the isocyanate-based gas (HNCO gas) to the wafer 200 as the reaction gas containing N, C and O, and a process of supplying the amine-based gas (TEA gas) to the wafer 200 as the gas containing N and C.

A difference between this sequence and the film-forming sequence of the first embodiment is that step 3e is further included in addition to steps 1e and 2e which are comparable to steps 1a and 2a. Except this difference, the sequence is the same as the film-forming sequence of the first embodiment. Hereinafter, step 3e of this embodiment will be described.

Step 3e: TEA Gas Supply

After step 2e is completed and the residual gas in the process chamber 201 is removed, the valve 243f is opened to flow the TEA gas into the gas supply pipe 232f. A flow rate of the TEA gas is regulated by the MFC 241f. The TEA gas flows into the gas supply pipe 232d and is supplied into the process chamber 201 from the gas supply hole 250d. The TEA gas supplied into the process chamber 201 is activated by heat and is exhausted through the exhaust pipe 231. At this time, the TEA gas activated by heat is supplied to the wafer 200. At the same time, the valve 243j is opened to flow the N2 gas into the gas supply pipe 232j. The N2 gas is supplied into the process chamber 201 together with the TEA gas and is exhausted through the exhaust pipe 231.

At this time, in order to prevent the TEA gas from being introduced into the nozzles 249a through 249c and the buffer chamber 237, the valves 243g through 243i are opened to flow the N2 gas into the gas supply pipes 232g through 232i. The N2 gas is supplied into the process chamber 201 through the gas supply pipes 232a through 232c, the nozzles 249a through 249c and the buffer chamber 237 and is exhausted through the exhaust pipe 231.

At this time, by appropriately adjusting the APC valve 244, the pressure in the process chamber 201 is set to, for example, a range of 1 Pa to 6,000 Pa. A supply flow rate of the TEA gas controlled by the MFC 241e is set to a flow rate within, for example, a range of 100 sccm to 10,000 sccm. A supply flow rate of the N2 gas controlled by the MFCs 241g through 241j is set to a flow rate within, for example, a range of 100 sccm to 10,000 sccm. At this time, a partial pressure of the TEA gas in the process chamber 201 is set to, for example, a range of 0.01 Pa to 5,941 Pa. A time for which the TEA gas is supplied to the wafer 200, that is, a gas supply time (radiation time), is set to a time, for example, in a range of 1 to 200 seconds, preferably 1 to 120 seconds, and more preferably, 1 to 60 seconds. Similar to steps 1e and 2e, the temperature of the heater 207 at this time is set such that the temperature of the wafer 200 falls within, for example, a range of 250° C. to 700° C., preferably 300° C. to 650° C., and more preferably, 350° C. to 600° C.

In this case, the gas flowing into the process chamber 201 is the TEA gas that is thermally activated. The HCDS gas and the HNCO gas do not flow into the process chamber 201. Therefore, the TEA gas does not cause a gas-phase reaction, and the activated TEA gas reacts with at least a part of the second layer formed on the wafer 200 in step 2e. Therefore, the second layer is modified to the third layer (SiOCN layer) containing Si, O, C and N. The third layer has a thickness of, for example, about less than one atomic layer to several atomic layers. A composition ratio of the third layer becomes different from the composition ratio of the second layer. For example, the third layer becomes a layer having a higher C concentration and N concentration than the second layer.

In the process of forming the third layer, the second layer is modified by reacting the second layer with the TEA gas. That is, when N and C included in the TEA gas are added to the second layer, the N component and the C component of the modified second layer, that is, the third layer, increase. When the TEA gas is activated by heat and flows into the process chamber 201, it is possible to alleviate a desorption (extraction) action of the C component from the second layer. Therefore, it is easy to control such that the ratio of the C component of the third layer increases.

At this time, a modification reaction of the second layer is preferably saturated. For example, when the second layer having a thickness of less than one atomic layer to several atomic layers is formed in steps 1e and 2e, a part of the second layer may be preferably modified. In this case, in order to prevent the entire second layer having a thickness of less than one atomic layer to several atomic from being modified, modification is performed under conditions in which the modification reaction of the second layer is unsaturated.

In order to cause the unsaturated modification reaction of the second layer, processing conditions in step 3e may be set as the above-described processing conditions. In addition, when the processing conditions in step 3e are set as the following processing conditions, it is easy to cause the unsaturated modification reaction of the second layer.

Wafer temperature: 500° C. to 650° C.
Pressure in process chamber: 133 Pa to 5,332 Pa
TEA gas partial pressure: 33 Pa to 5,177 Pa
TEA gas supply flow rate: 1,000 sccm to 10,000 sccm N2 gas supply flow rate: 300 sccm to 3,000 sccm
TEA gas supply time: 6 seconds to 200 seconds Residual Gas Removal After the third layer is formed, the valve 243f is closed to suspend supply of the TEA gas. At this time, while the APC valve 244 is opened, the inside of the process chamber 201 is vacuum-exhausted by the vacuum pump 246, and any unreacted gas remaining in the process chamber 201, TEA gas that has contributed to formation of the third layer, or reaction by-products is removed from the inside of the process chamber 201. At this time, while the valves 243g through 243j are opened, supply of the N2 gas serving as the inert gas into the process chamber 201 continues. The N2 gas serves as a purge gas. Accordingly, it is possible to effectively remove the unreacted gas remaining in the process chamber 201, the TEA gas that has contributed to formation of the third layer, or the reaction by-products from the inside of the process chamber 201.

At this time, the gas remaining in the process chamber 201 may not be completely removed, and the inside of the process chamber 201 may not be completely purged. When an amount of the gas remaining in the process chamber 201 is small, there is no negative influence on step 1e performed thereafter. In this case, there is no need to set a flow rate of the N2 gas supplied into the process chamber 201 to be high. For example, when the same amount of the N2 gas as a volume of the reaction tube 203 [the process chamber 201] is supplied, it is possible to purge to the extent that there is no negative influence on step 1e. When the inside of the process chamber 201 is not completely purged, a purge time decreases, thereby improving throughput. Also, it is possible to suppress unnecessary consumption of the N2 gas to a minimum.

As the amine-based gas, instead of the TEA, for example, an ethylamine-based gas that is obtained by vaporizing diethylamine [(C2H5)2NH, abbreviated as DEA], monoethylamine (C2H5NH2, abbreviated as MEA), and the like, a methylamine-based gas that is obtained by vaporizing trimethylamine [(CH3)3N, abbreviated as TMA], dimethylamine [(CH3)2NH, abbreviated as DMA], monomethylamine (CH3NH2, abbreviated as MMA), and the like, a propylamine-based gas that is obtained by vaporizing tripropylamine [(C3H7)3N, abbreviated as TPA], dipropylamine [(C3H7)2NH, abbreviated as DPA], monopropylamine (C3H7NH2, abbreviated as MPA), and the like, an isopropylamine-based gas that is obtained by vaporizing triisopropylamine ([(CH3)2CH]3N, abbreviated as TIPA), diisopropylamine ([(CH3)2CH]2NH, abbreviated as DIPA), monoisopropylamine [(CH3)2CHNH2, abbreviated as MIPA], and the like, a butylamine-based gas that is obtained by vaporizing tributylamine [(C4H9)3N, abbreviated as TBA], dibutylamine [(C4H9)2NH, abbreviated as DBA], monobutylamine (C4H9NH2, abbreviated as MBA), and the like, or an isobutylamine-based gas that is obtained by vaporizing triisobutylamine ([(CH3)2CHCH2]3N, abbreviated as TIBA), diisobutylamine ([(CH3)2CHCH2]2NH, abbreviated as DIBA), monoisobutylamine [(CH3)2CHCH2NH2, abbreviated as MIBA], and the like, may be preferably used. That is, as the amine-based gas, for example, at least one type of a gas that is obtained by vaporizing (C2H5)xNH3-x, (CH3)xNH3-x, (C3H7)xNH3-x, [(CH3)2CH]xNH3-x, (C4H9)xNH3-x, [(CH3)2CHCH2]xNH3-x (in the formula, x is an integer of 1 to 3) may be preferably used.

The amine-based gas acts as the nitrogen source and the carbon source. When the amine-based gas is used as the gas containing N and C, it is easy to control such that ratios of the C component and the N component of the SiOCN film increase.

Instead of the amine-based gas, as the gas containing N and C, a gas containing an organic hydrazine compound, that is, an organic hydrazine-based gas, may be used. The organic hydrazine-based gas is a gas that is obtained by vaporizing organic hydrazine and includes a hydrazine group, and refers to a gas containing C, N and H. That is, the organic hydrazine-based gas is a Si-free gas, and a Si-free and metal-free gas. As the organic hydrazine-based gas, for example, a methylhydrazine-based gas that is obtained by vaporizing monomethyl hydrazine [(CH3)HN2H2, abbreviated as MMH], dimethyl hydrazine [(CH3)2N2H2, abbreviated as DMH], trimethyl hydrazine [(CH3)2N2(CH3)H, abbreviated as TMH], and the like, or an ethylhydrazine-based gas that is obtained by vaporizing ethylhydrazine [(C2H5)HN2H2, abbreviated as EH], and the like, may be preferably used. For example, when the organic hydrazine that is in a liquid state under normal temperature and normal pressure such as MMH is used, the organic hydrazine in a liquid state is vaporized by a vaporization system such as a vaporizer and a bubbler and then is supplied as the organic hydrazine-based gas, that is, the gas containing N and C (MMH gas). The gas containing the organic hydrazine compound may be simply called an organic hydrazine compound gas or an organic hydrazine gas.

Performing a Predetermined Number of Times

When a cycle including the above-described steps 1e to 3e is performed at least once (a predetermined number of times), it is possible to form the SiOCN film having a predetermined composition and a predetermined film thickness on the wafer 200. It is preferable that the above-described cycle be performed a plurality of times. That is, the thickness of the SiOCN layer to be formed for a cycle is set to be lower than a desired film thickness, and the above-described cycle is preferably performed a plurality of times to obtain the desired film thickness.

Second Sequence

Figure 17:
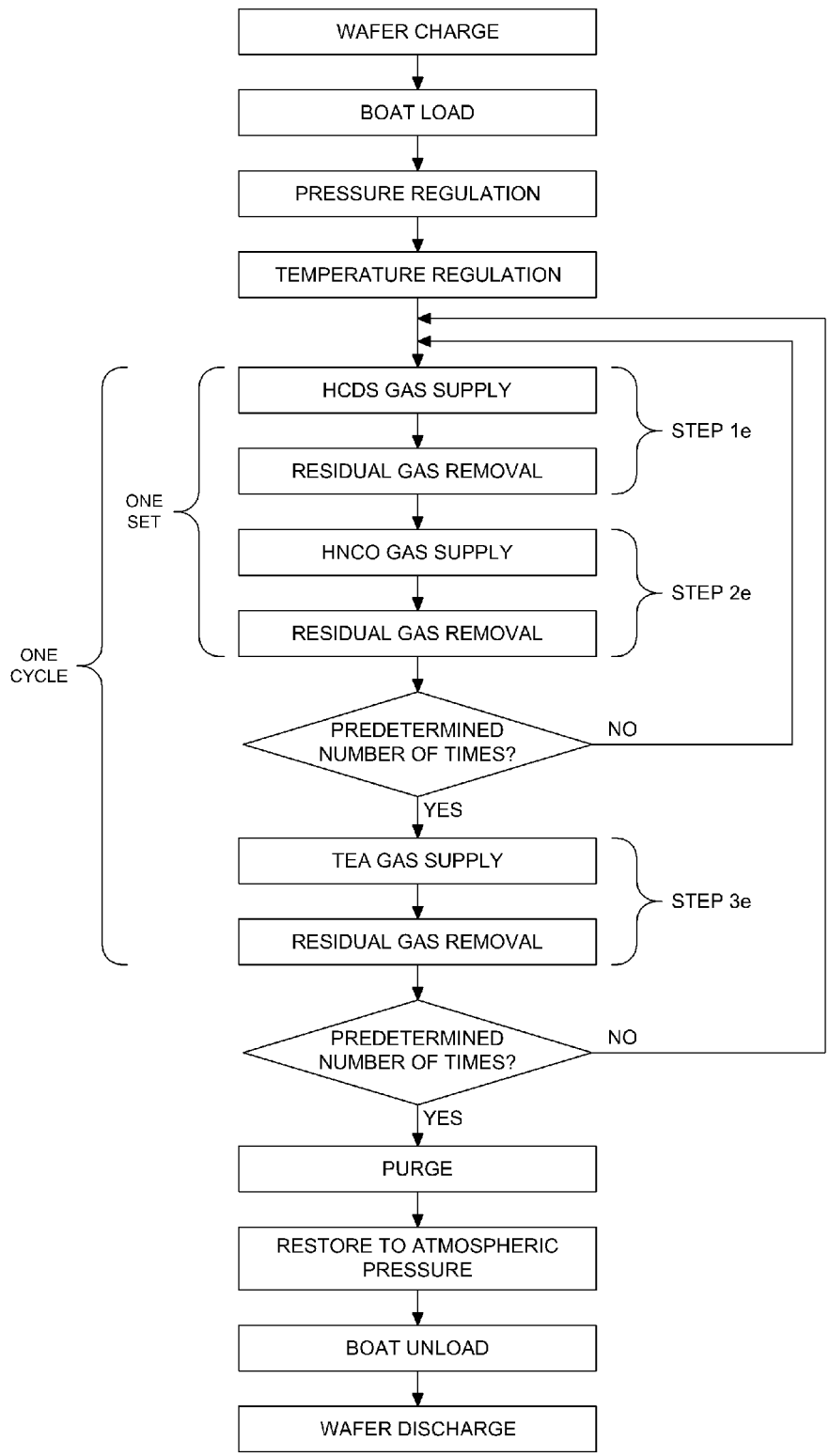
FIG. 17 is a diagram illustrating a film-forming flow in a second sequence of the fifth embodiment.

Next, the second sequence of this embodiment will be described with reference to FIGS. 17 and 18A.

In the second sequence of this embodiment, the SiOCN film is formed on the wafer 200 by performing a cycle a predetermined number of times. The cycle includes a process of supplying the chlorosilane-based source gas (HCDS gas) to the wafer 200 as the source gas containing Si and a process of supplying the isocyanate-based gas (HNCO gas) to the wafer 200 as the reaction gas containing N, C and O, which are alternately performed a predetermined number of times, and a process of supplying the amine-based gas (TEA gas) to the wafer 200 as the gas containing N and C.

In an example illustrated in FIG. 18A, the above-described steps 1e and 2e are set as one set, this set is performed twice, and then step 3e is performed. These processes are set as a cycle. When this cycle is performed n times, the SiOCN film having a predetermined composition and a predetermined film thickness is formed on the wafer 200. A difference between this sequence and the first sequence is that the above-described steps 1e and 2e are set as one set, this set is repeated a plurality of times, and then step 3e is performed. Except this difference, the sequence is the same as the first sequence. Also, processing conditions in this sequence may be the same as those of the above-described first sequence.

Effects of this Embodiment

According to the film-forming sequence of this embodiment, the same effects as in the above-described first embodiment are obtained. In addition, according to the film-forming sequence of this embodiment, when step 3e in which supplying, for example, the TEA gas that is the amine-based gas, to the wafer 200 as the gas containing N and C, is performed, N and C included in the TEA gas are added to the second layer. Therefore, the SiOCN film having an increased N component and C component may be formed. Also, when the TEA gas is not plasma-excited, but is activated by heat and then supplied, it is possible to relatively alleviate a desorption (extraction) action of the C component from the second layer. Therefore, it is easy to control such that the ratio of the C component of the SiOCN film increases.

Modification

In the above-described first and second sequences, the example in which step 2e in which supplying the HNCO gas is performed and then step 3e in which supplying the TEA gas is performed has been described. However, this embodiment is not limited thereto. That is, step 3e may precede step 2e. In an example illustrated in FIG. 16B, the cycle of sequentially performing step 1e, step 3e, and step 2e is set as a cycle and this cycle is performed at least once (a predetermined number of times). Also, in an example illustrated in FIG. 18B, steps 1e and 3e are set as one set, this set is repeated a plurality of times, and then step 2e is performed. These processes are set as a cycle and this cycle is performed a predetermined number of times.

When step 3e is performed after step 1e, the first layer formed in step 1e and the TEA gas react. Accordingly, the first layer is changed (modified) to a layer (SiCN layer containing Cl) containing Si, Cl, C and N. The SiCN layer containing Cl has a thickness of, for example, about less than one atomic layer to several atomic layers. In addition, the SiCN layer containing Cl becomes a layer having relatively high ratios of the Si component and the C component, that is, a Si-rich and C-rich layer.

Also, when step 2e is performed after step 3e, the SiCN layer containing Cl formed in step 3e and the HNCO gas react. Therefore, the SiCN layer containing Cl is changed (modified) to the second layer containing Si, O, C and N, that is, the SiOCN layer.

Accordingly, the SiOCN film having a predetermined composition and a predetermined film thickness is formed on the wafer 200 by performing a cycle a predetermined number of times. The cycle includes a cycle in which step 1e, step 3e, and step 2e are sequentially performed or a cycle in which steps 1e and 3e are set as one set, this set is repeated a plurality of times, and then step 2e is performed.

Other Embodiments of the Present Invention

While the embodiments of the present invention have been specifically described above, the present invention is not limited to the above-described embodiments, but may be variously modified without departing from the scope of the invention.

For example, in the above-described embodiment, when the SiOCN film or the SiOC film is formed on the wafer 200, the process of supplying the C3H6 gas may be performed with at least any process among the process of supplying the HCDS gas, the process of supplying the HNCO gas, the process of supplying the NH3 gas, and the process of supplying the TEA gas. In this way, it is easy to increase the C component of the SiOCN film or the SiOC film.

When the process of supplying the C3H6 gas is performed with the process of supplying the HCDS gas, supply of the C3H6 gas may be performed during either or both of at least part of the HCDS gas supply period and a supply stop period (a period before supply start and/or a period after supply stop) of the HCDS gas. Alternatively, when the process of supplying the C3H6 gas is performed with the process of supplying the HNCO gas, supply of the C3H6 gas may be performed during either or both of at least part of the HNCO gas supply period and a supply stop period of the HNCO gas. Alternatively, when the process of supplying the C3H6 gas is performed with the process of supplying the NH3 gas, supply of the C3H6 gas may be performed during either or both of at least part of the NH3 gas supply period and a supply stop period of the NH3 gas. Alternatively, when the process of supplying the C3H6 gas is performed with the process of supplying the TEA gas, supply of the C3H6 gas may be performed during either or both of at least part of the TEA gas supply period and a supply stop period of the TEA gas.

However, since the gas-phase reaction of the HCDS gas and the C3H6 gas in the process chamber 201 may be prevented, the process of supplying the C3H6 gas is preferably performed with the process of supplying the HNCO gas, with the process of supplying the NH3 gas, or with the process of supplying the TEA gas, rather than with the process of supplying the HCDS gas. That is, since it is possible to prevent particles from being generated in the process chamber 201, the process of supplying the C3H6 gas is preferably performed with the process of supplying the HNCO gas, with the process of supplying the NH3 gas, or with the process of supplying the TEA gas, rather than with the process of supplying the HCDS gas.

Also, since it is easy to increase the ratio of the C component of the SiOCN film or the SiOC film, the process of supplying the C3H6 gas is preferably performed with the process of supplying the HNCO gas or with the process of supplying the TEA gas, rather than with the process of supplying the NH3 gas. That is, since it is possible to increase controllability in composition ratio control of the SiOCN film or the SiOC film, the process of supplying the C3H6 gas is preferably performed with the process of supplying the HNCO gas or with the process of supplying the TEA gas rather than with the process of supplying the NH3 gas.

In the above-described embodiment, the example in which, when the second layer containing Si, O, C and N is formed, the source gas is supplied to the wafer 200 in the process chamber 201, and then the reaction gas is supplied has been described. However, the present invention is not limited to the above-described embodiment. For example, a supply sequence of these gases may be reversed. That is, the reaction gas is supplied and then the source gas may be supplied. In other words, either the source gas or the reaction gas is supplied first, and then the other gas may be supplied. When the supply sequence of the gases is changed, it is possible to change the quality or the composition ratio of the thin film to be formed.

In the above-described embodiment, the example in which, when the first layer is formed in each sequence, the chlorosilane-based source gas is used has been described. However, the present invention is not limited to the above-described embodiment. For example, instead of the chlorosilane-based source gas, a silane-based source gas having a halogen-based ligand other than the chloro group may be used. For example, instead of the chlorosilane-based source gas, a fluorosilane-based source gas may be used. Here, the fluorosilane-based source gas refers to a fluorosilane-based source in a gas state, for example, a gas that is obtained by vaporizing a fluorosilane-based source in a liquid state under normal temperature and normal pressure or a fluorosilane-based source that is in a gas state under normal temperature and normal pressure. Also, the fluorosilane-based source refers to a silane-based source including a fluoro group as a halogen group and a source including at least silicon (Si) and fluorine (F). That is, the fluorosilane-based source referred to herein may be a type of halide. As the fluorosilane-based source gas, for example, tetrafluorosilane, that is, a silicon fluoride gas such as silicon tetrafluoride (SiF4) gas or hexafluoro disilane (Si2F6) gas may be used. In this case, when the first layer is formed in each sequence, the fluorosilane-based source gas is supplied to the wafer 200. In this case, the first layer becomes a layer containing Si and F, that is, a silicon-containing layer containing F.

Also, in the above-described embodiment, the example in which one type of the thin film (single film) is formed on the wafer 200 once in each sequence has been described. However, the present invention is not limited to the above-described embodiment. For example, when the above-described sequences are appropriately combined, it is possible to form a laminated film of two or more types of thin films on the wafer 200 at a time. For example, when the film-forming sequence of the first, fourth, and fifth embodiments and the film-forming sequence of the second and third embodiments are alternately performed in-situ a predetermined number of times (at least once), it is possible to form a laminated film in which the SiOCN film and the SiON film are alternately laminated or a laminated film in which the SiOCN film and the SiOC film are alternately laminated on the wafer 200.

Also, when the SiOCN film, the SiON film, or the SiOC film formed by the method of the above-described embodiment is used as a sidewall spacer, it is possible to provide a device forming technique having a low leakage current and excellent workability.

Also, when the SiOCN film, the SiON film, or the SiOC film formed by the method of the above-described embodiment is used as a hard mask or an etching stopper layer, it is possible to provide a device forming technique having excellent workability.

Also, according to the above-described embodiment, it is possible to form the SiOCN film, the SiON film, or the SiOC film having an ideal stoichiometric ratio without using the plasma state at a low temperature range. In addition, since it is possible to form the SiOCN film, the SiON film, or the SiOC film without using the plasma state, it can be adapted to a process that concerns plasma damage such as an SADP film of DPT.

Also, in the above-described embodiment, the example in which the semiconductor-based thin film containing a semiconductor element, Si, is formed as the thin film has been described. However, the present invention is not limited to the above-described embodiment, but may be preferably applied when a metal-based thin film containing a metal element such as titanium (Ti), zirconium (Zr), hafnium (Hf), tantalum (Ta), aluminum (Al), or molybdenum (Mo) is formed as the thin film.

For example, as a metal-based thin film containing Ti, when a titanium oxycarbonitride film (TiOCN film), a titanium oxynitride film (TiON film), or a titanium oxycarbide film (TiOC film) is formed, a gas which contains Ti and a chloro group such as titanium tetrachloride (TiCl4), a gas which contains Ti and a fluoro group such as titanium tetrafluoride (TiF4), or a gas which contains Ti and an amino group such as tetrakis ethylmethylamino titanium (Ti[N(C2H5)(CH3)]4, abbreviated as TEMAT) may be used as the source gas. As the reaction gas, the oxidizing gas, the nitriding gas, the carbon-containing gas and the gas containing N and C, the same gases as in the above-described embodiment may be used. Processing conditions in these cases may be the same, for example, as in the above-described embodiment.

For example, as a metal-based thin film containing Zr, when a zirconium oxycarbonitride film (ZrOCN film), a zirconium oxynitride film (ZrON film), or a zirconium oxycarbide film (ZrOC film) is formed, a gas which contains Zr and a chloro group such as zirconium tetrachloride (ZrCl4), a gas which contains Zr and a fluoro group such as zirconium tetrafluoride (ZrF4), or a gas which contains Zr and an amino group such as tetrakis ethylmethylamino zirconium (Zr[N(C2H5)(CH3)]4, abbreviated as TEMAZ) may be used as the source gas. As the reaction gas, the oxidizing gas, the nitriding gas, the carbon-containing gas and the gas containing N and C, the same gases as in the above-described embodiment may be used. Processing conditions in these cases may be the same, for example, as in the above-described embodiment.

For example, as a metal-based thin film containing Hf, when a hafnium oxycarbonitride film (HfOCN film), a hafnium oxynitride film (HfON film), or a hafnium oxycarbide film (HfOC film) is formed, a gas which contains Hf and a chloro group such as hafnium tetrachloride (HfCl4), a gas which contains Hf and a fluoro group such as hafnium tetrafluoride (HfF4), or a gas which contains Hf and an amino group such as tetrakis ethylmethylamino hafnium (Hf[N(C2H5)(CH3)]4, abbreviated as TEMAH) may be used as the source gas. As the reaction gas, the oxidizing gas, the nitriding gas, the carbon-containing gas and the gas containing N and C, the same gases as in the above-described embodiment may be used. Processing conditions in these cases may be the same, for example, as in the above-described embodiment.

For example, as a metal-based thin film containing Ta, when a tantalum oxycarbonitride film (TaOCN film), a tantalum oxynitride film (TaON film), or a tantalum oxycarbide film (TaOC film) is formed, a gas which contains Ta and a chloro group such as tantalum pentachloride (TaCl5), a gas which contains Ta and a fluoro group such as tantalum pentafluoride (TaF5), or a gas which contains Ta and an ethoxy group such as pentaethoxy tantalum (Ta(OC2H5)5, abbreviated as PET) may be used as the source gas. As the reaction gas, the oxidizing gas, the nitriding gas, the carbon-containing gas, and the gas containing N and C, the same gases as in the above-described embodiment may be used. Processing conditions in these cases may be the same, for example, as in the above-described embodiment.

For example, as a metal-based thin film containing Al, when an aluminum oxycarbonitride film (AlOCN film), an aluminum oxynitride film (AlON film), or an aluminum oxycarbide film (AlOC film) is formed, a gas which contains Al and a chloro group such as aluminum trichloride (AlCl3), a gas which contains Al and a fluoro group such as aluminum trifluoride (AlF3), or a gas which contains Al and a methyl group such as trimethyl aluminum (Al(CH3)3, abbreviated as TMA) may be used as the source gas. As the reaction gas, the oxidizing gas, the nitriding gas, the carbon-containing gas and the gas containing N and C, the same gases as in the above-described embodiment may be used. Processing conditions in these cases may be the same, for example, as in the above-described embodiment.

For example, as a metal-based thin film containing Mo, when a molybdenum oxycarbonitride film (MoOCN film), a molybdenum oxynitride film (MoON film), or a molybdenum oxycarbide film (MoOC film) is formed, a gas which contains Mo and a chloro group such as molybdenum pentachloride (MoCl5) or a gas which contains Mo and a fluoro group such as molybdenum pentafluoride (MoF5) may be used as the source gas. As the reaction gas, the oxidizing gas, the nitriding gas, the carbon-containing gas and the gas containing N and C, the same gases as in the above-described embodiment may be used. Processing conditions in these cases may be the same, for example, as in the above-described embodiment.

In this way, the present invention may be applied to form not only the semiconductor-based thin film but also the metal-based thin film. In this case, the same effects as in the above-described embodiment may be obtained.

The process recipe (a program in which processing sequences or processing conditions are described) used in the formation of the thin film described above may preferably be separately prepared (prepared a plurality of recipes) according to content of substrate processing (a film type, a composition ratio, film quality, a film thickness, and the like of a thin film to be formed). Then, when the substrate processing starts, an appropriate process recipe is preferably selected from among the plurality of process recipes according to content of the substrate processing. Specifically, the plurality of process recipes separately prepared according to content of the substrate processing are preferably stored (installed) in advance in the memory device 121c provided in the substrate processing apparatus through telecommunication lines or the non-transitory computer-readable recording medium [the external memory device 123] recording the process recipe. Then, when the substrate processing starts, the CPU 121a provided in the substrate processing apparatus preferably appropriately selects an appropriate process recipe according to content of the substrate processing from among the plurality of process recipes stored in the memory device 121c. In such a configuration, it is possible to generally and repeatedly form the thin film having various film types, composition ratios, film qualities, and film thicknesses in the single substrate processing apparatus. In addition, it is possible to decrease an operation load (such as a load for inputting processing sequences or processing conditions) of an operator, thereby preventing operation errors and quickly starting the substrate processing.

In addition to creating a new process recipe, the above-described process recipe may be prepared by, for example, changing an existing process recipe that is previously installed in the substrate processing apparatus. When the process recipe is changed, the changed process recipe may be installed in the substrate processing apparatus through the telecommunication lines or the non-transitory computer-readable recording medium recording the process recipe. Also, by manipulating the I/O device 122 provided in the existing substrate processing apparatus, the existing process recipe that is previously installed in the substrate processing apparatus may be directly changed.

In the above-described embodiment, the example in which the thin film is formed using the batch-type substrate processing apparatus that processes the plurality of substrates at once has been described. However, the present invention is not limited to the above-described embodiment, but may be preferably applied to, for example, when the thin film is formed using a single substrate processing apparatus that processes one or several substrates at once. In addition, in the above-described embodiment, the example in which the thin film is formed using the substrate processing apparatus including a hot wall-type processing furnace has been described. However, the present invention is not limited to the above-described embodiment, but may be preferably applied when the thin film is formed using a substrate processing apparatus including a cold wall-type processing furnace.

Each embodiment, each modification, each application, and the like described above may be appropriately combined and used.

According to the present invention, a thin film having a low dielectric constant and a high resistance to HF at a low temperature range is formed with high productivity.

Exemplary Embodiments of the Present Invention

Hereinafter, exemplary embodiments of the present invention are added.

Supplementary Note 1

According to an embodiment of the present invention, there is provided a method of manufacturing a semiconductor device, the method including forming a film containing a predetermined element, oxygen and at least one of carbon and nitrogen (an oxycarbide, oxynitride or oxycarbonnitride film containing a predetermined element) on a substrate by performing, a predetermined number of times, a cycle including: (a) supplying a source gas containing the predetermined element to the substrate; and (b) supplying a reaction gas containing nitrogen, carbon and oxygen to the substrate.

Supplementary Note 2

In the method of manufacturing a semiconductor device of Supplementary note 1, it is preferable that a first layer containing the predetermined element is formed in the step (a), and the first layer is modified by reacting with the reaction gas to form a second layer (an oxycarbonitride layer containing the predetermined element) containing the predetermined element, oxygen, carbon and nitrogen in the step (b).

Supplementary Note 3

In the method of manufacturing a semiconductor device of Supplementary note 1 or 2, it is preferable that the reaction gas contains an isocyanate group [a gas having a partial structure of —N=C=O in its composition formula (In a molecule), that is, in its chemical structural formula].

Supplementary Note 4

In the method of manufacturing a semiconductor device of one of Supplementary notes 1 to 3, it is preferable that the source gas contains the predetermined element and one of a halogen element (halogen group or halogen ligand) and an amino group (amino ligand).

Supplementary Note 5

In the method of manufacturing a semiconductor device of one of Supplementary notes 1 to 4, it is preferable that a first layer containing the predetermined element and one of a halogen element (halogen group) and an amino group is formed in the step (a), and the one of the halogen element (halogen group) and the amino group in the first layer reacts with a ligand of the reaction gas in the step (b).

Supplementary Note 6

In the method of manufacturing a semiconductor device of Supplementary note 5, it is preferable that the one of the halogen element (halogen group) and the amino group is separated from the first layer and the ligand is separated from the reaction gas in the step (b).

Supplementary Note 7

In the method of manufacturing a semiconductor device of Supplementary note 6, it is preferable that atoms of the predetermined element in the first layer having the one of the halogen element (halogen group) and the amino group separated therefrom are bonded with atoms (for example, nitrogen atoms) of a chemical element in the reaction gas having the ligand separated therefrom in the step (b).

Supplementary Note 8

In the method of manufacturing a semiconductor device of one of Supplementary notes 1 to 7, it is preferable that the steps (a) and (b) are alternately performed a predetermined number of times (one or more times) when the film is formed.

Supplementary Note 9

In the method of manufacturing a semiconductor device of one of Supplementary notes 1 to 7, it is preferable that the steps (a) and (b) are simultaneously performed a predetermined number of times (one or more times) when the film is formed.

Supplementary Note 10

In the method of manufacturing a semiconductor device of one of Supplementary notes 1 to 9, it is preferable that the cycle further includes (c) supplying an oxidizing gas (for example, an oxidizing gas activated by heat) to the substrate, and the film formed by performing the cycle the predetermined number of times includes one of: a film containing the predetermined element, oxygen, carbon and nitrogen (an oxycarbonnitride film containing the predetermined element); a film containing the predetermined element, oxygen and nitrogen (an oxynitride film containing the predetermined element); and a film containing the predetermined element, oxygen and carbon (an oxycarbide film containing the predetermined element).

Supplementary Note 11

In the method of manufacturing a semiconductor device of Supplementary note 2, it is preferable that the cycle further includes (c) supplying an oxidizing gas to the substrate, and the second layer is oxidized in the step (c) to form a third layer including one of: a layer containing the predetermined element, oxygen, carbon and nitrogen; a layer containing the predetermined element, oxygen and nitrogen; and a layer containing the predetermined element, oxygen and carbon.

Supplementary Note 12

In the method of manufacturing a semiconductor device of Supplementary notes 1 to 9, it is preferable that the cycle further includes (d) supplying a nitriding gas (for example, a nitriding gas that is activated by heat or to plasma) to the substrate, and the film formed by performing the cycle the predetermined number of times includes one of: a film containing the predetermined element, oxygen, carbon and nitrogen (an oxycarbonitride layer containing the predetermined element); and a film containing the predetermined element, oxygen and nitrogen (an oxynitride film containing the predetermined element).

Supplementary Note 13

In the method of manufacturing a semiconductor device of Supplementary note 2, it is preferable that the cycle further includes (d) supplying a nitriding gas to the substrate, and the second layer is nitrided in the step (d) to form a third layer including one of: a layer containing the predetermined element, oxygen, carbon and nitrogen; and a layer containing the predetermined element, oxygen and nitrogen.

Supplementary Note 14

In the method of manufacturing a semiconductor device of one of Supplementary notes 1 to 9, it is preferable that the cycle further includes (e) supplying a carbon-containing gas (for example, a hydrocarbon-based gas) to the substrate.

Supplementary Note 15

In the method of manufacturing a semiconductor device of one of Supplementary notes 1 to 9, it is preferable that the cycle further includes (f) supplying a gas containing nitrogen and carbon (for example, an amine-based gas or an organic hydrazine-based gas) to the substrate.

Supplementary Note 16

According to another embodiment of the present invention, there is provided a method of processing a substrate, the method including forming an oxycarbonitride, oxynitride or oxycarbide film containing a predetermined element on the substrate by performing, a predetermined number of times, a cycle including: (a) supplying a source gas containing the predetermined element to the substrate; and (b) supplying a reaction gas containing nitrogen, carbon and oxygen to the substrate.

Supplementary Note 17

According to still another embodiment of the present invention, there is provided a substrate processing apparatus, including: a process chamber configured to accommodate a substrate; a source gas supply system configured to supply a source gas containing a predetermined element into the process chamber; a reaction gas supply system configured to supply a reaction gas containing nitrogen, carbon and oxygen into the process chamber; and a control unit configured to control the source gas supply system and the reaction gas supply system to form a film containing the predetermined element, oxygen and at least one of carbon and nitrogen (an oxycarbide, oxynitride or oxycarbonnitride film containing a predetermined element) on the substrate by performing, a predetermined number of times, a cycle including supplying the source gas to the substrate in the process chamber and supplying the reaction gas to the substrate in the process chamber.

Supplementary Note 18

According to yet another embodiment of the present invention, there are provided a program and a non-transitory computer-readable recording medium storing the program that causes a computer to execute forming a film containing a predetermined element, oxygen and at least one of carbon and nitrogen (an oxycarbide, oxynitride or oxycarbonnitride film containing a predetermined element) on a substrate by performing, a predetermined number of times, a cycle including: (a) supplying a source gas containing the predetermined element to the substrate in a process chamber and supplying a reaction gas containing nitrogen, carbon; and (b) oxygen to the substrate in the process chamber.

What is claimed is:

1. A method of manufacturing a semiconductor device, comprising forming a film containing a predetermined element, oxygen and at least one of carbon and nitrogen on a substrate by performing, a predetermined number of times, a cycle comprising: (a) forming a first layer containing the predetermined element on the substrate by supplying a source gas containing the predetermined element to the substrate; and (b) modifying the first layer to form a second layer containing the predetermined element, oxygen, carbon and nitrogen by supplying a reaction gas containing an isocyanate group and reacting the first layer with the reaction gas.

2. The method of claim 1, wherein the source gas contains the predetermined element and one of a halogen element and an amino group.

3. The method of claim 1, wherein a first layer containing the predetermined element and one of a halogen element and an amino group is formed in (a), and the one of the halogen element and the amino group in the first layer reacts with a ligand of the reaction gas in (b).

4. The method of claim 3, wherein the one of the halogen element and the amino group is separated from the first layer and the ligand is separated from the reaction gas in (b).

5. The method of claim 4, wherein atoms of the predetermined element in the first layer having the one of the halogen element and the amino group separated therefrom are bonded with atoms of a chemical element in the reaction gas having the ligand separated therefrom in (b).

6. The method of claim 1, wherein (a) and (b) are alternately performed one or more times when the film is formed.

7. The method of claim 1, wherein (a) and (b) are simultaneously performed one or more times when the film is formed.

8. The method of claim 1, wherein the cycle further comprises: (c) supplying an oxidizing gas to the substrate, and the film formed by performing the cycle the predetermined number of times comprises one of: a film containing the predetermined element, oxygen, carbon and nitrogen; a film containing the predetermined element, oxygen and nitrogen; and a film containing the predetermined element, oxygen and carbon.

9. The method of claim 1, wherein the cycle further comprises (c) supplying an oxidizing gas to the substrate, and the second layer is oxidized in (c) to form a third layer comprising one of: a layer containing the predetermined element, oxygen, carbon and nitrogen; a layer containing the predetermined element, oxygen and nitrogen; and a layer containing the predetermined element, oxygen and carbon.

10. The method of claim 1, wherein the cycle further comprises (d) supplying a nitriding gas to the substrate, and the film formed by performing the cycle the predetermined number of times comprises one of: a film containing the predetermined element, oxygen, carbon and nitrogen; and a film containing the predetermined element, oxygen and nitrogen.

11. The method of claim 1, wherein the cycle further comprises (d) supplying a nitriding gas to the substrate, and the second layer is nitrided in (d) to form a third layer comprising one of: a layer containing the predetermined element, oxygen, carbon and nitrogen; and a layer containing the predetermined element, oxygen and nitrogen.

12. The method of claim 1, wherein the cycle further comprises (e) supplying a carbon-containing gas to the substrate.

13. The method of claim 1, wherein the cycle further comprises (f) supplying a gas containing nitrogen and carbon to the substrate.

14. A substrate processing apparatus, comprising:
a process chamber configured to accommodate a substrate;
a source gas supply system configured to supply a source gas containing a predetermined element into the process chamber;
a reaction gas supply system configured to supply a reaction gas containing an isocyanate group into the process chamber; and
a control unit configured to control the source gas supply system and the reaction gas supply system to form a film containing the predetermined element, oxygen and at least one of carbon and nitrogen on the substrate by performing, a predetermined number of times, a cycle comprising (a) forming a first layer containing the predetermined element on the substrate by supplying the source gas to the substrate; and (b) modifying the first layer to form a second layer containing the predetermined element, oxygen, carbon and nitrogen by supplying the reaction gas and reacting the first layer with the reaction gas.

15. A non-transitory computer-readable recording medium storing a program that causes a computer to execute forming a film containing a predetermined element, oxygen and at least one of carbon and nitrogen on a substrate by performing, a predetermined number of times, a cycle comprising: (a) forming a first layer containing the predetermined element on the substrate by supplying a source gas containing the predetermined element to the substrate; and (b) modifying the first layer to form a second layer containing the predetermined element, oxygen, carbon and nitrogen by supplying a reaction gas containing an isocyanate group and reacting the first layer with the reaction gas.

* * * * *